US012009843B2

(12) United States Patent
Redfern et al.

(10) Patent No.: US 12,009,843 B2
(45) Date of Patent: *Jun. 11, 2024

(54) MATRIX COMPRESSION ACCELERATOR SYSTEM AND METHOD

(71) Applicant: TEXAS INSTRUMENTS INCORPORATED, Dallas, TX (US)

(72) Inventors: Arthur John Redfern, Plano, TX (US); Dan Wang, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 32 days.

This patent is subject to a terminal disclaimer.

(21) Appl. No.: 17/195,703

(22) Filed: Mar. 9, 2021

(65) Prior Publication Data
US 2021/0194498 A1 Jun. 24, 2021

Related U.S. Application Data

(63) Continuation of application No. 16/899,632, filed on Jun. 12, 2020, now Pat. No. 10,979,070, which is a (Continued)

(51) Int. Cl.
*H03M 7/30* (2006.01)
*G06F 13/28* (2006.01)
(Continued)

(52) U.S. Cl.
CPC .............. *H03M 7/30* (2013.01); *G06F 13/28* (2013.01); *G06F 17/16* (2013.01); *G06N 3/063* (2013.01);
(Continued)

(58) Field of Classification Search
CPC .... H03M 7/30; H03M 7/3082; H03M 7/6029; H03M 7/6064; G06F 13/28; G06F 17/16; G06N 3/00; G06N 3/063; G06N 3/0454
(Continued)

(56) References Cited

U.S. PATENT DOCUMENTS 4,897,717 A 1/1990 Hamiliton et al.
5,099,447 A 3/1992 Myszewski
(Continued)

FOREIGN PATENT DOCUMENTS

CN 104899182 A 9/2015
CN 104915322 A 9/2015
(Continued)

OTHER PUBLICATIONS

Notification of Transmittal of the International Search Report and the Written Opinion of the International Searching Authority, or the Declaration; PCT/US 2018/020462; dated Aug. 9, 2018, 6 pages.
(Continued)

*Primary Examiner* — Tan V Mai
(74) *Attorney, Agent, or Firm* — Brian D. Graham; Frank D. Cimino

(57) ABSTRACT

A matrix compression/decompression accelerator (MCA) system/method that coordinates lossless data compression (LDC) and lossless data decompression (LDD) transfers between an external data memory (EDM) and a local data memory (LDM) is disclosed. The system implements LDC using a 2D-to-1D transformation of 2D uncompressed data blocks (2DU) within LDM to generate 1D uncompressed data blocks (1DU). The 1DU is then compressed to generate a 1D compressed superblock (CSB) in LDM. This LDM CSB may then be written to EDM with a reduced number of EDM bus cycles. The system implements LDD using decompression of CSB data retrieved from EDM to generate a 1D decompressed data block (1DD) in LDM. A 1D-to-2D transformation is then applied to the LDM 1DD to generate a 2D decompressed data block (2DD) in LDM. This 2DD may then be operated on by a matrix compute engine (MCE) using a variety of function operators.

16 Claims, 36 Drawing Sheets

Related U.S. Application Data continuation of application No. 15/900,611, filed on Feb. 20, 2018, now Pat. No. 10,735,023.

(60) Provisional application No. 62/465,620, filed on Mar. 1, 2017, provisional application No. 62/464,954, filed on Feb. 28, 2017, provisional application No. 62/464,964, filed on Feb. 28, 2017, provisional application No. 62/463,426, filed on Feb. 24, 2017.

(51) Int. Cl.
　　*G06F 17/16*　　(2006.01)
　　*G06N 3/063*　　(2023.01)
　　*G06N 3/045*　　(2023.01)

(52) U.S. Cl.
　　CPC ....... *H03M 7/3082* (2013.01); *H03M 7/6029* (2013.01); *H03M 7/6064* (2013.01); *G06N 3/045* (2023.01)

(58) Field of Classification Search
　　USPC .......................................................... 708/203
　　See application file for complete search history.

(56) References Cited

U.S. PATENT DOCUMENTS

| | | | |
|---|---|---|---|
| 5,745,793 | A | 4/1998 | Atsatt et al. |
| 5,870,568 | A | 2/1999 | Culkey et al. |
| 5,982,375 | A | 11/1999 | Nelson et al. |
| 8,301,749 | B1 | 10/2012 | Finklestein et al. |
| 9,606,803 | B2 | 3/2017 | Anderson et al. |
| 9,645,974 | B1 | 5/2017 | Patil et al. |
| 10,114,613 | B2 | 10/2018 | Bekas et al. |
| 2002/0191692 | A1 | 12/2002 | Fallon et al. |
| 2004/0136316 | A1 | 7/2004 | Kwak et al. |
| 2009/0292758 | A1 | 11/2009 | Brokenshire et al. |
| 2009/0300091 | A1 | 12/2009 | Brokenshire et al. |
| 2011/0153707 | A1 | 6/2011 | Ginzburg et al. |
| 2012/0011348 | A1 | 1/2012 | Eichenberger et al. |
| 2012/0072917 | A1 | 3/2012 | Boldyrev et al. |
| 2012/0140814 | A1 | 6/2012 | Sole Rojals et al. |
| 2012/0216096 | A1 | 8/2012 | Seo et al. |
| 2012/0251013 | A1 | 10/2012 | Porikli |
| 2012/0268298 | A1 | 10/2012 | Oh |
| 2013/0262548 | A1 | 10/2013 | Ge et al. |
| 2014/0167987 | A1 | 6/2014 | Pell et al. |
| 2014/0365548 | A1 | 12/2014 | Mortensen |
| 2016/0373158 | A1 | 12/2016 | Ardalan |
| 2017/0139710 | A1 | 5/2017 | Zbiciak |
| 2017/0153890 | A1 | 6/2017 | Anderson et al. |
| 2017/0153959 | A1 | 6/2017 | Zbiciak |
| 2017/0168898 | A1 | 6/2017 | Zbiciak et al. |
| 2017/0249150 | A1 | 8/2017 | Zbiciak et al. |
| 2017/0308381 | A1 | 10/2017 | Zbiciak |
| 2019/0266218 | A1 | 8/2019 | Scott et al. |
| 2020/0051551 | A1 | 2/2020 | Sinath |

FOREIGN PATENT DOCUMENTS

| | | |
|---|---|---|
| CN | 106228238 A | 12/2016 |
| JP | 09-8693 A | 1/1997 |

OTHER PUBLICATIONS

Notification of Transmittal of the International Search Report and the Written Opinion of the International Searching Authority, or the Declaration; PCT/US 2018/020283; dated Aug. 23, 2018, 8 pages.

Extended European Search Report; App. Pat. No. 18760733.8-1231/3590048 PCT/US2018020462; dated Feb. 4, 2020; 8 pages.

Utku Aydoinat, et al. "An Open CL(TM) Deep Learning Accelerator on Arria 10", arxiv.org, Cornell University Library, 201 OLIN Library, Cornell University Ithaca, NY 14853, Jan. 13, 2017, XP080741254.

Hussain Tassadaq, et al."PPMC: A Program Pattern Based Memory Controller", Mar. 19, 2012, International Conference on Financial Cryptography and Data Security; [Lecture Notes in Computer Science; Lect. Noptes Computer], Springer, Berlin, Heidelberg, pp. 89-101, XP047379471, ISBN: 978-3-642-17318-9.

Chen Zhang et al. "Optimizing FPGA-based Accelerator Design for Deep Convolutional Neural Networks", Proceedings of the 2015 ACM/SIGDA International Symposium of Field-Programmable Gate Arrays, FPGA, 15, Feb. 22, 2015, pp. 161-170, XP055265150, New, NY, USA, DOI: 10.1145/2684746.2689060, ISBN:978-45033315-3.

Notification of Transmittal of the International Search Report and the Written Opinion of the International Searching Authority, or the Declaration; PCT/US 2018/019746; dated Jan. 31, 2019; 8 pages.

Chinese Office Action and Search Report for Application 2018800136987 dated Dec. 1, 2022.

National Intellectual Property Administration, PRC Search Report, Chinese Patent Application No. 2018800144945, dated Mar. 10, 2023, 2 pages.

International PCT Search Report and Written Opinion for PCT/US 2018/020334; Jun. 7, 2018.

Qiao et al., FPGA-Accelerated Deep Convolutional Neural Networks for High Throughput and Energy Efficiency, dated May 16, 2016, 20 pages.

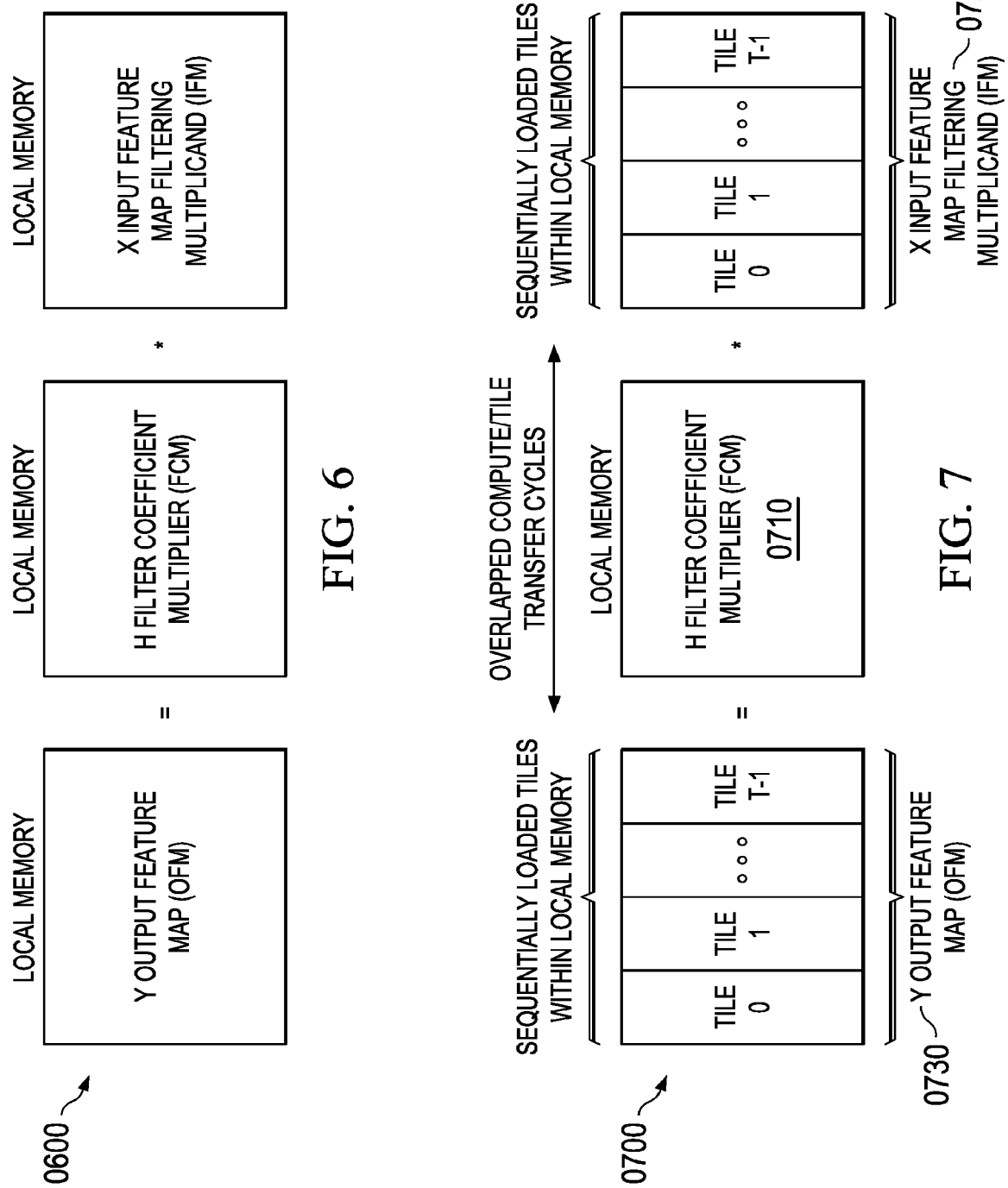

MATRIX COMPRESSION ACCELERATOR SYSTEM AND METHOD

CROSS-REVERENCE TO RELATED APPLICATIONS

This patent application is a continuation of U.S. patent application Ser. No. 16/899,632, filed Jun. 12, 2020, which is a continuation of U.S. patent application Ser. No. 15/900,611, filed Feb. 20, 2018 (now U.S. Pat. No. 10,735,023) both of which are incorporated herein by reference.

This patent application claims benefit under 35 U.S.C. § 119 and incorporates by reference United States Provisional Patent Application for A METHOD FOR USING A MATRIX MULTIPLICATION ACCELERATOR (MMA) TO IMPLEMENT FUNDAMENTAL COMPUTATIONAL PRIMITIVES by inventors Arthur John Redfern, Timothy David Anderson, Kai (nmn) Chirca, Chenchi Eric Luo, and Zhenhua (nmn) Yu, filed electronically with the USPTO on Mar. 1, 2017, with Ser. No. 62/465,620.

This patent application claims benefit under 35 U.S.C. § 119 and incorporates by reference United States Provisional Patent application for A FIXED POINT MATRIX MULTIPLICATION ACCELERATOR (MMA) by inventors Arthur John Redfern, Donald Edward Steiss, Timothy David Anderson, and Kai (nmn) Chirca, filed electronically with the USPTO on Feb. 28, 2017, with Ser. No. 62/464,954.

This patent application claims benefit under 35 U.S.C. § 119 and incorporates by reference United States Provisional Patent application for METHODS FOR EFFICIENT CONVOLUTIONAL NEURAL NETWORK (CNN) DATA MOVEMENT by inventors Arthur John Redfern and Asheesh (nmn) Bhardwaj, filed electronically with the USPTO on Feb. 28, 2017, with Ser. No. 62/464,964.

This patent application claims benefit under 35 U.S.C. § 119 and incorporates by reference United States Provisional Patent application for FRAMEWORK AND METHOD FOR CNN FEATURE MAP COMPRESSION AND DECOMPRESSION by inventors Arthur John Redfern and Dan (nmn) Wang, filed electronically with the USPTO on Feb. 24, 2017, with Ser. No. 62/463,426.

BACKGROUND OF THE INVENTION

The present disclosure relates to the acceleration of lossless compressed data transfers between data memories having different access times and particularly the movement of large matrices between memories of different access timing. Without limitation, this matrix compression accelerator (MCA) may be applied to situations where very large convolutional neural network (CNN) feature maps may be transferred between external data memory (EDM) under control of a digital central processing unit (CPU) or other application control logic (ACL) and local data memory (LDM) within the control of an integrated matrix compute engine (MCE) in which matrix computation operators (MCO) may be applied to tiled matrix data (TMD) contained within the LDM.

SUMMARY OF THE INVENTION

A matrix compression accelerator (MCA) data transfer system and method that optimizes data transfers between slower external data memory (EDM) and faster local data memory (LDM) is disclosed. The system/method provides for efficient transfer of data structures associated with convolutional neural networks (CNNs) and other large matrix applications and implements a feature map compression/decompression scheme that works within data alignment and transfer length requirements for efficient data movement and algorithm requirements of data availability for computation to improve speed and minimize memory resources for data transfers from LDM to EDM and from EDM to LDM. The system/method are particularly applicable to scenarios where EDM comprises dynamic random access memory (DRAM) that has a cycle time significantly greater than LDM which may comprise fully registered static random access memory (SRAM).

The system/method operate by providing for a matrix compression accelerator (MCA) data transfer interface between EDM and LDM that implements lossless data compression (LDC) for data transfers between LDM and EDM and lossless data decompression (LDD) for data transfers between EDM and LDM. The LDC function operates using a multi-stage process within LDM including 2D-to-1D data transformation followed by 1D data compression. The LDD function operates using a multi-stage process within LDM including 1D data decompression followed by 1D-to-2D data transformation. The LDC and LDD functions may in some embodiments be implemented using a compression/decompression direct memory access (DMA) controller (CDC) that transfers data between the EDM and the LDM while automatically performing the compression/decompression functions. The LDC/LDD processes increase operation timing within LDM and reduce operation timing within EDM towards the goal of achieving increase compute/transfer timing overlap between a matrix compute engine (MCE) operating on LDM data and data transfers between the LDM and EDM.

For simplicity of presentation, systems and methods are illustrated herein for 128B (128 byte) data alignment boundaries, 128B (128 byte) minimum EDM to LDM data transfer lengths and 64B (64 byte) compute to LDM compute lengths. Note, however, that these values are provided as examples only and the present disclosure teachings apply equally well to other data bus lengths.

BRIEF DESCRIPTION OF THE DRAWINGS

For a fuller understanding of the advantages provided by the disclosure, reference should be made to the following detailed description together with the accompanying drawings wherein:

FIG. 6 illustrates an embodiment of CNN matrix product calculation wherein the H filter coefficient multiplier (FCM), X input feature map filtering multiplicand (IFM), and Y output feature map (OFM) are contained within local data memory (LDM);

FIG. 7 illustrates an embodiment of CNN matrix product calculation wherein the H filter coefficient multiplier (FCM)

Figure 8:
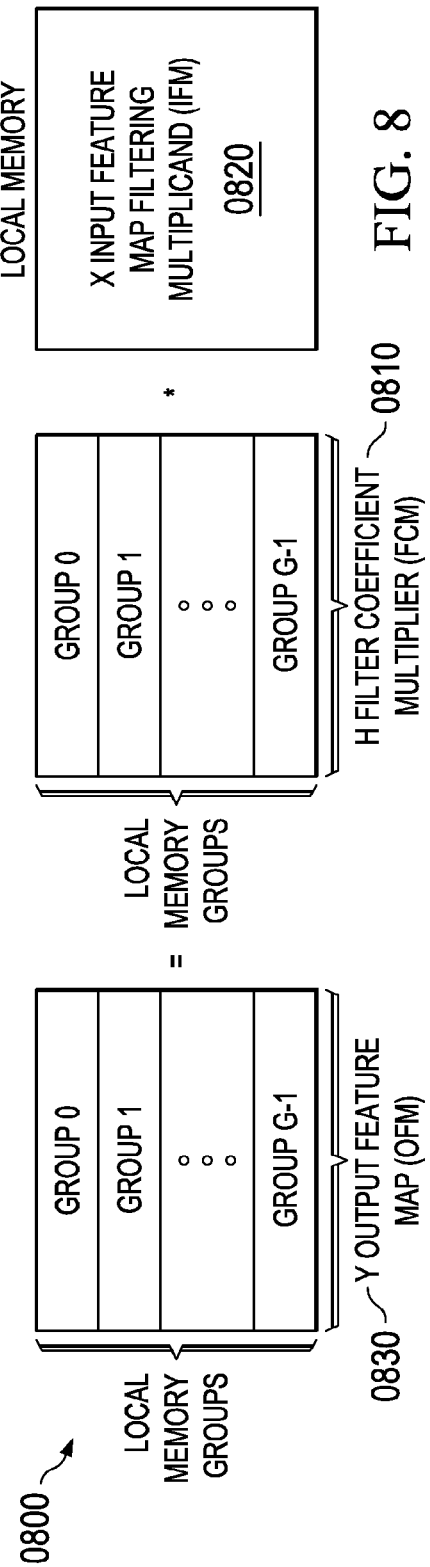
Figure 9:
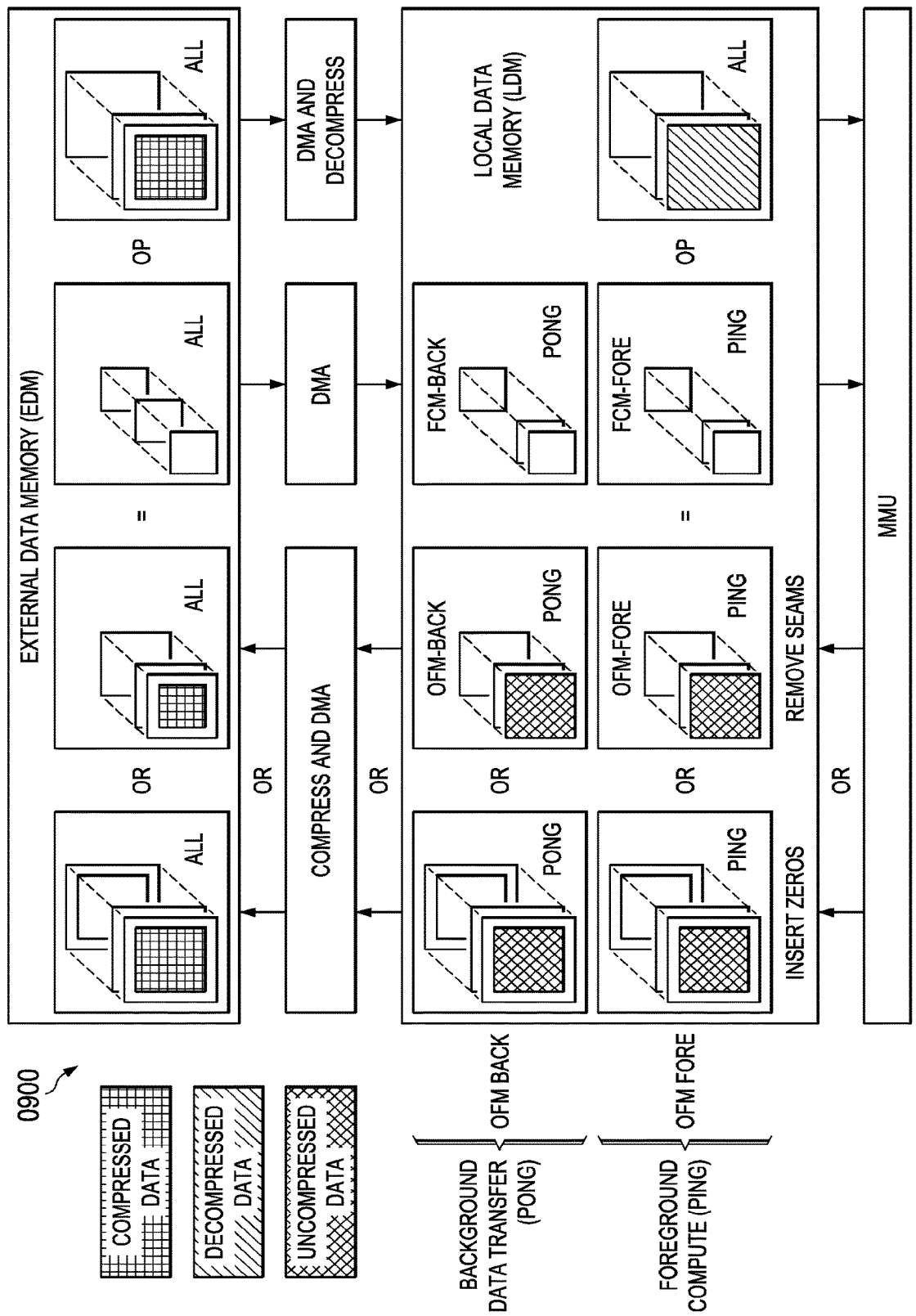
Figure 10:
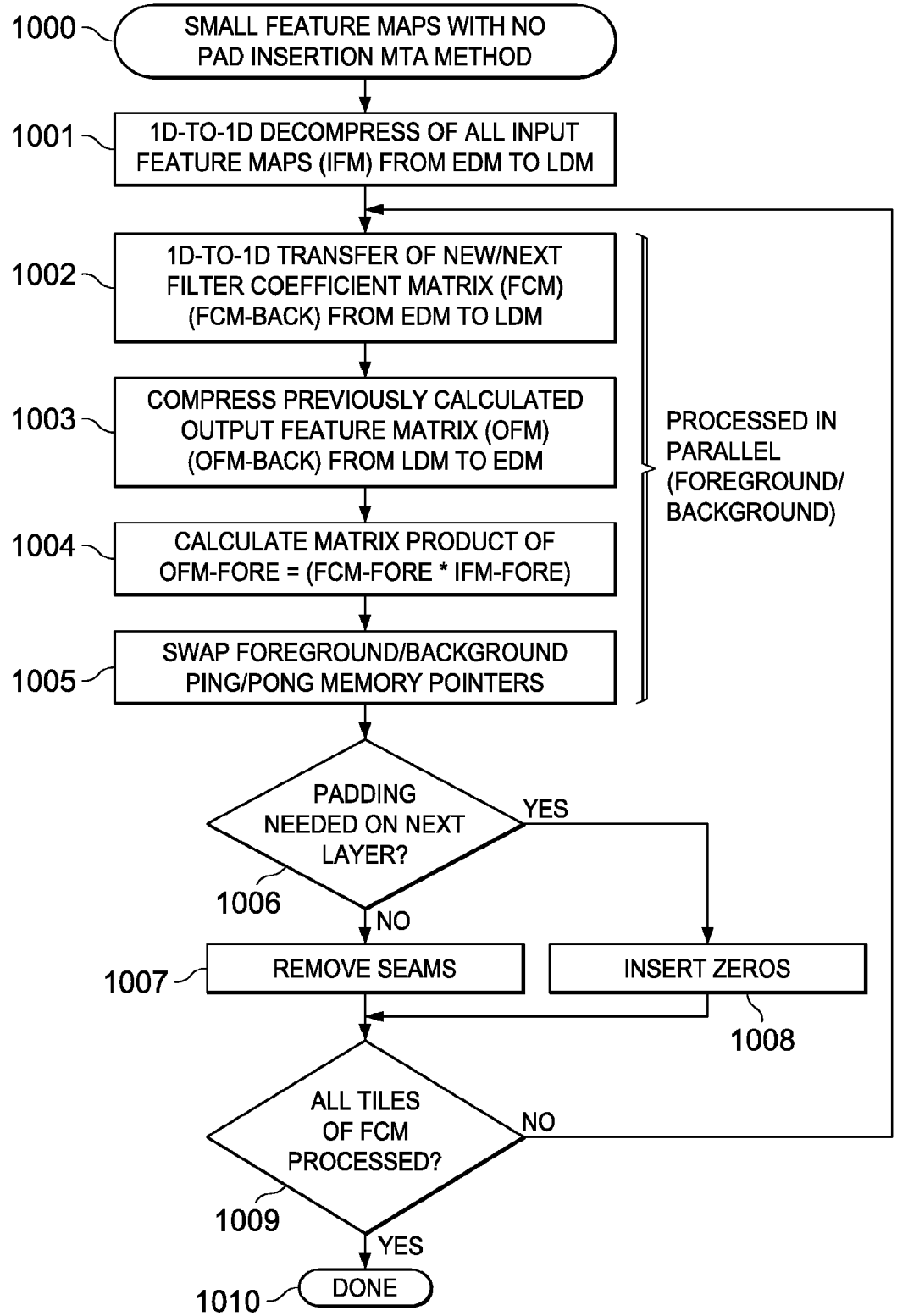
Figure 11:
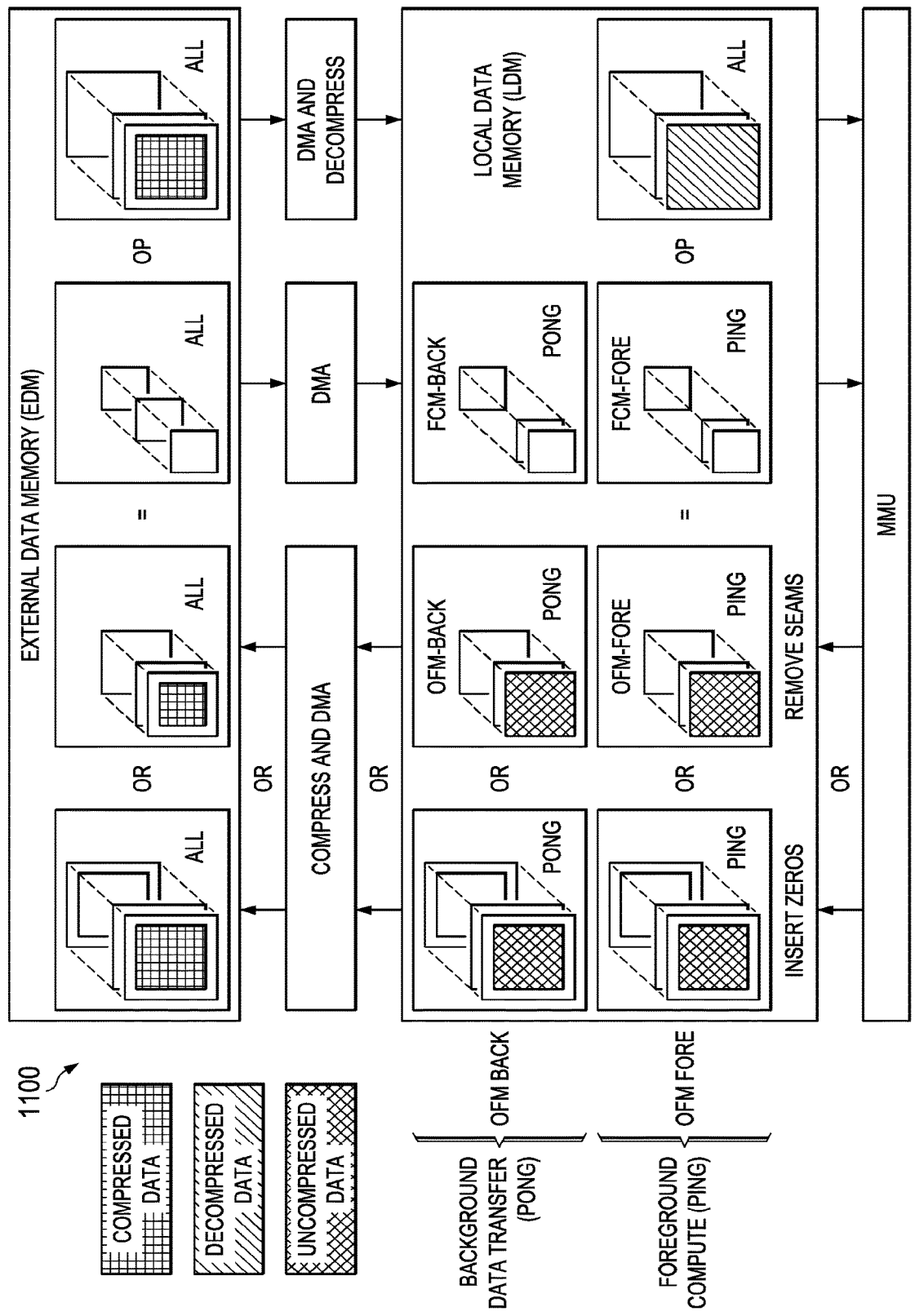
Figure 12:
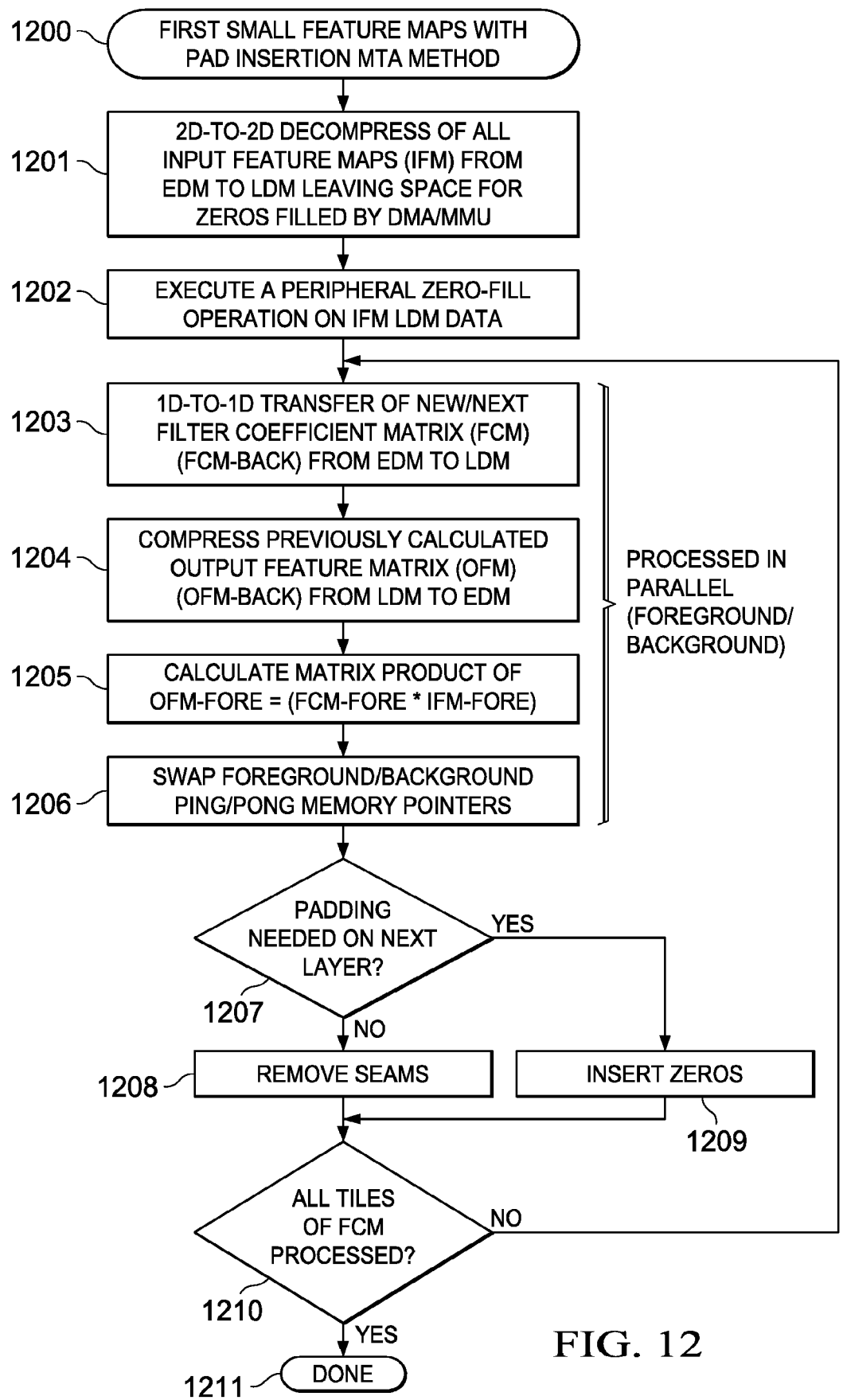
Figure 13:
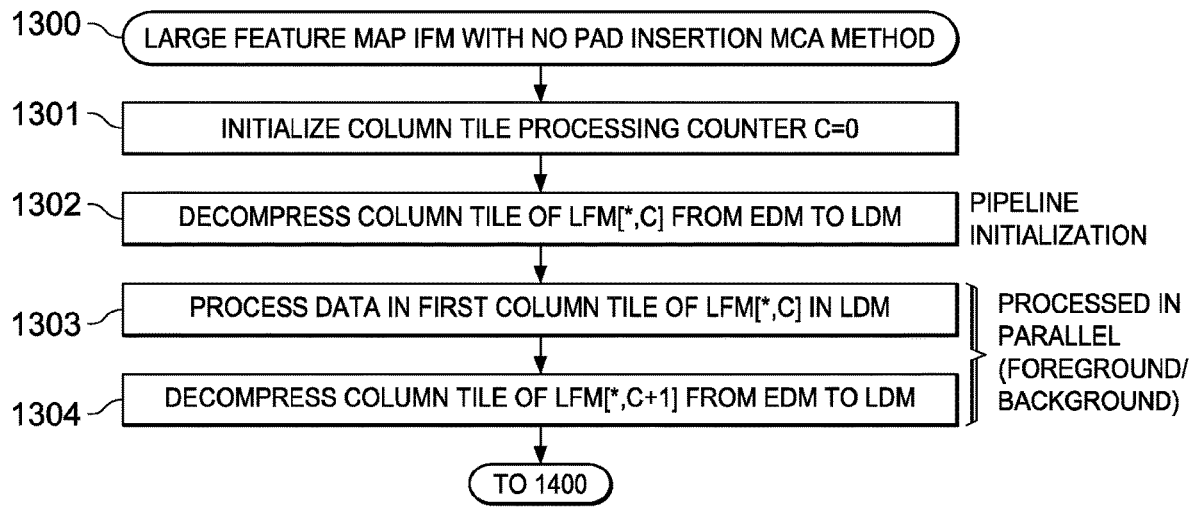
Figure 14:
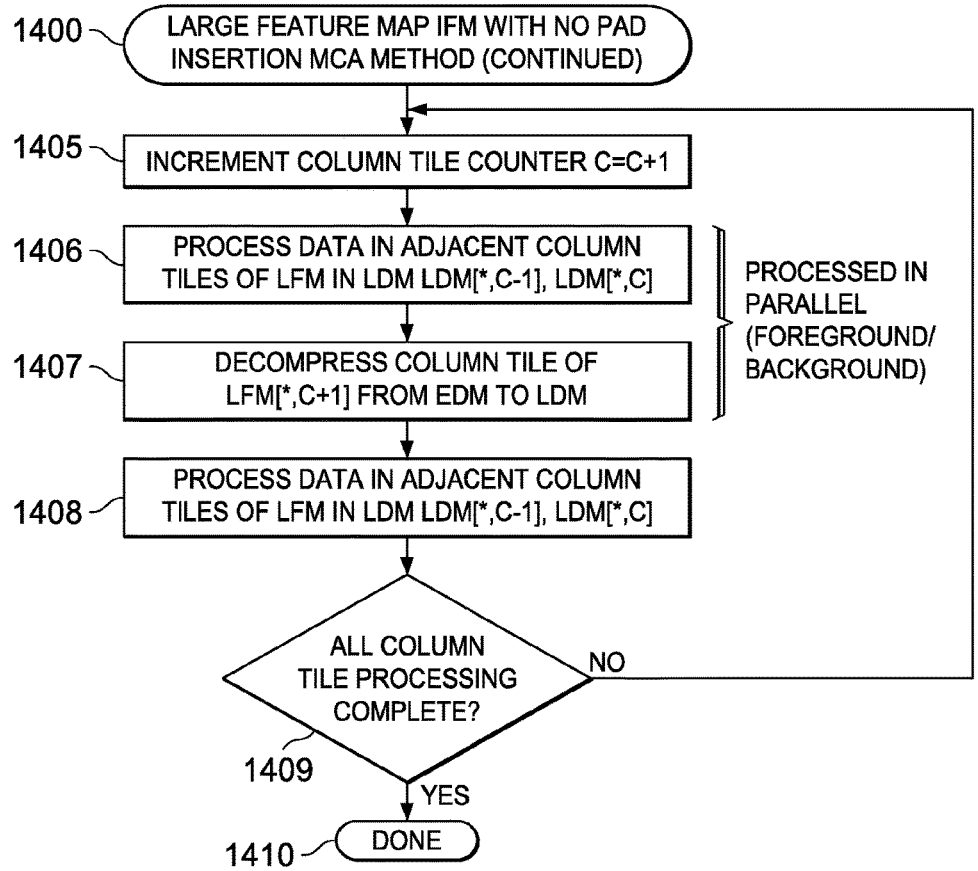
Figure 15:
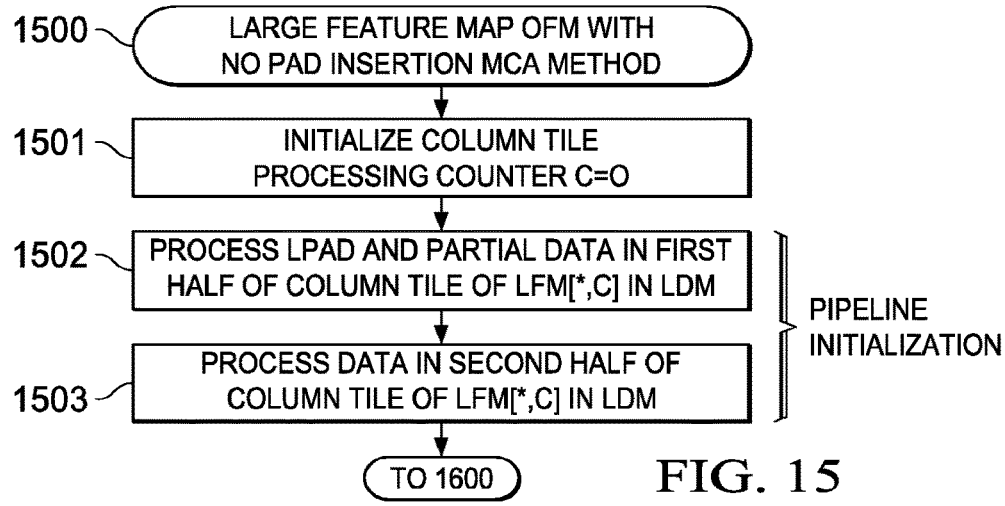
Figure 16:
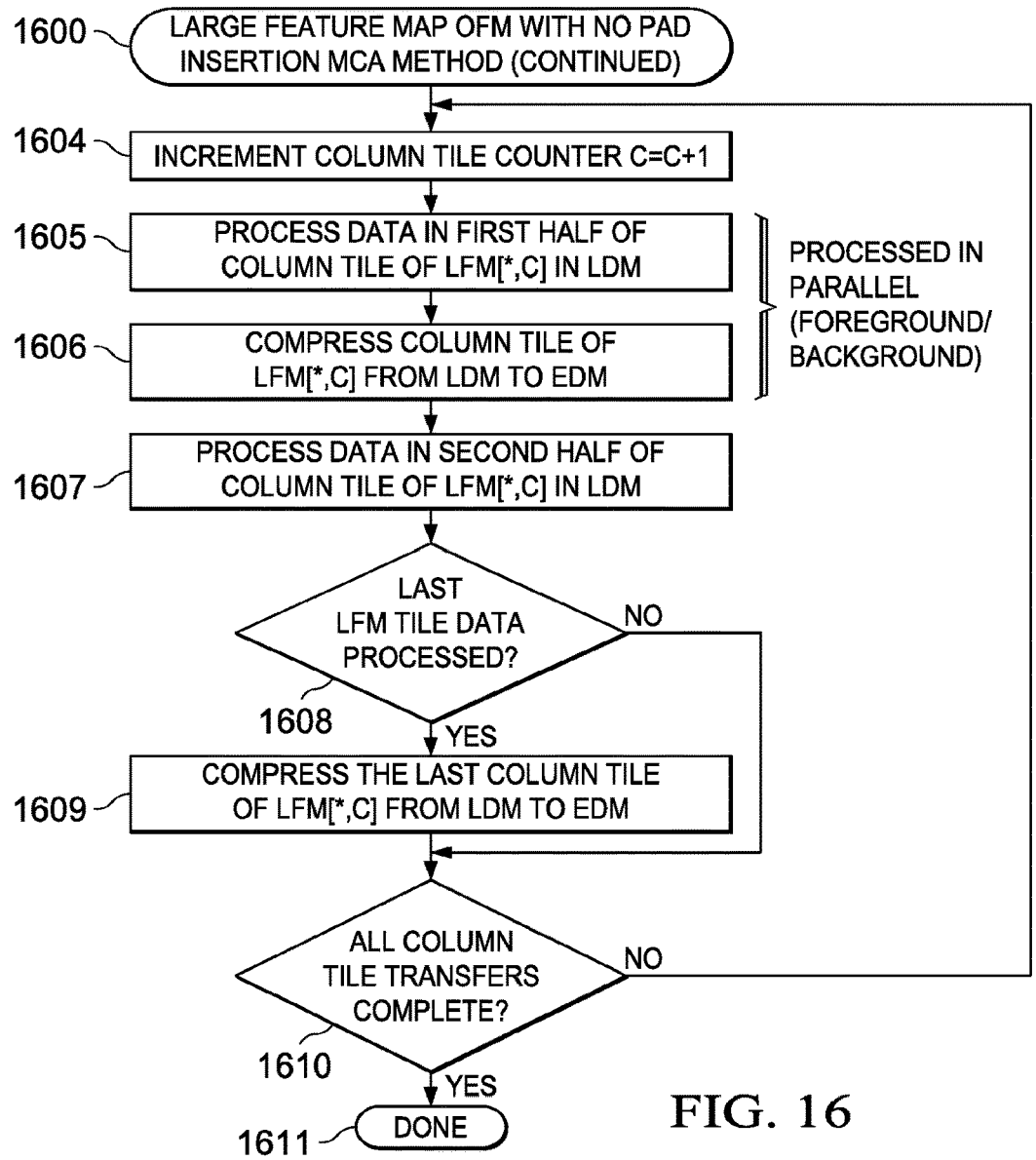
Figure 17:
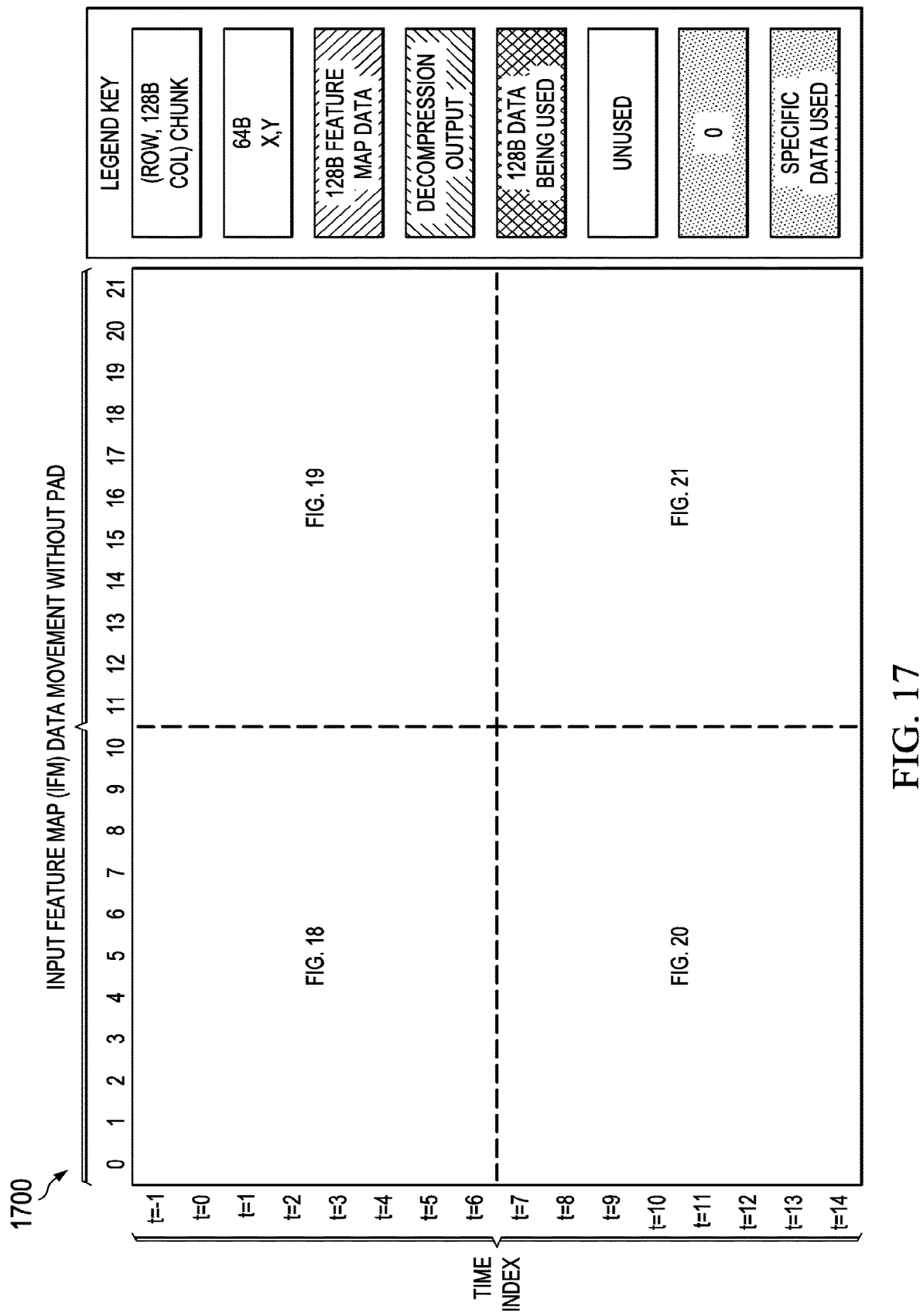
Figure 18:
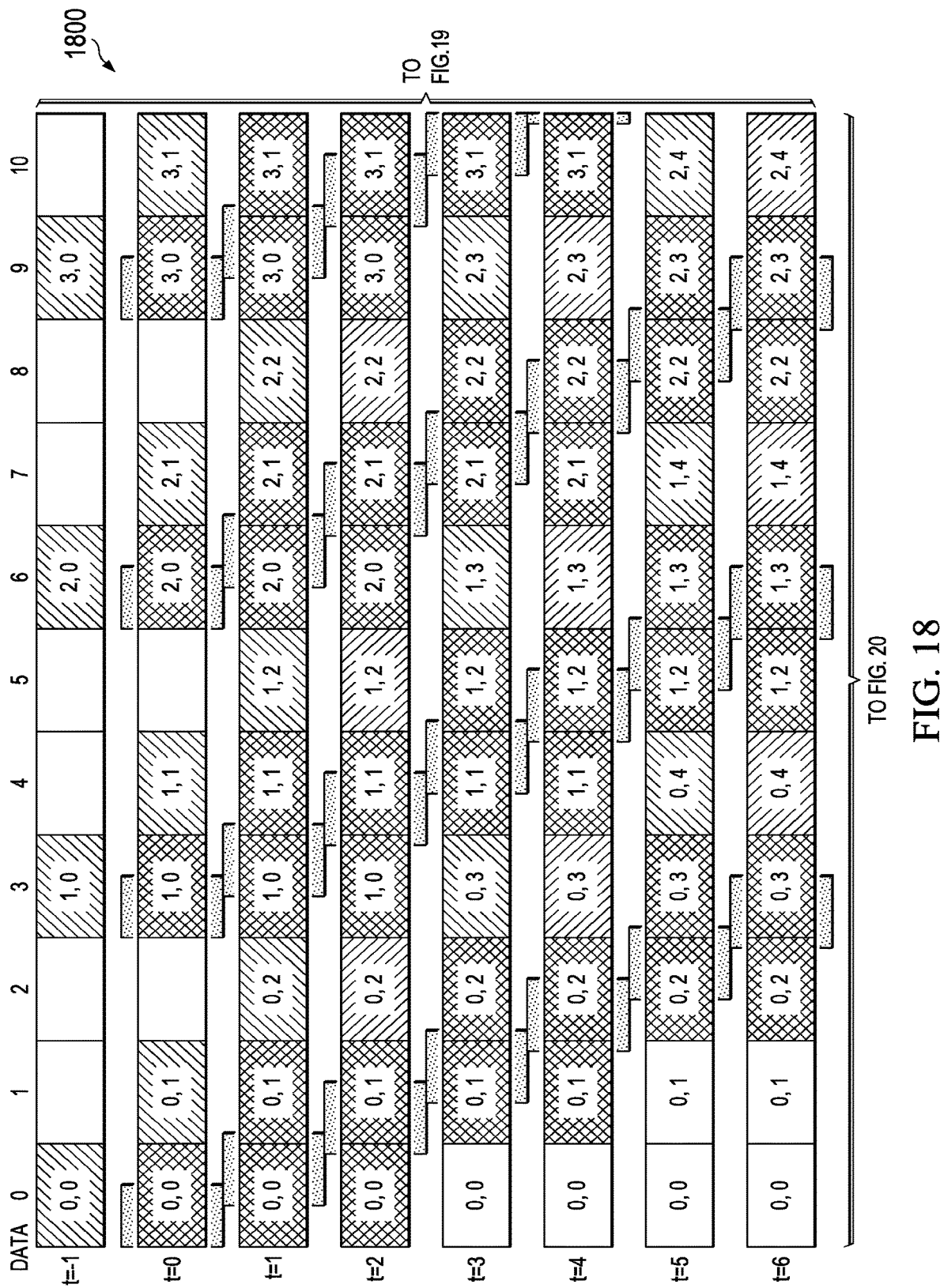
Figure 19:
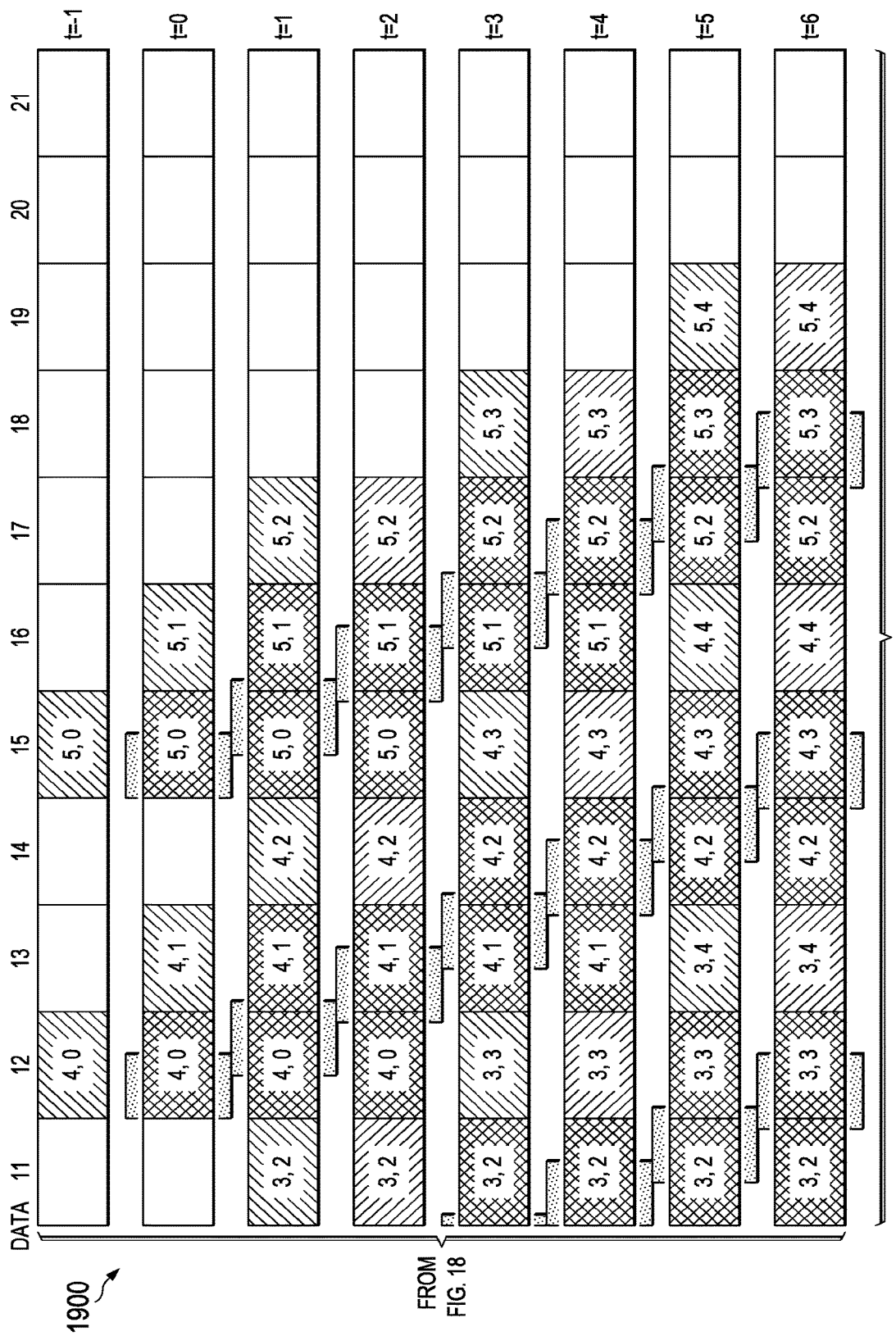
Figure 22:
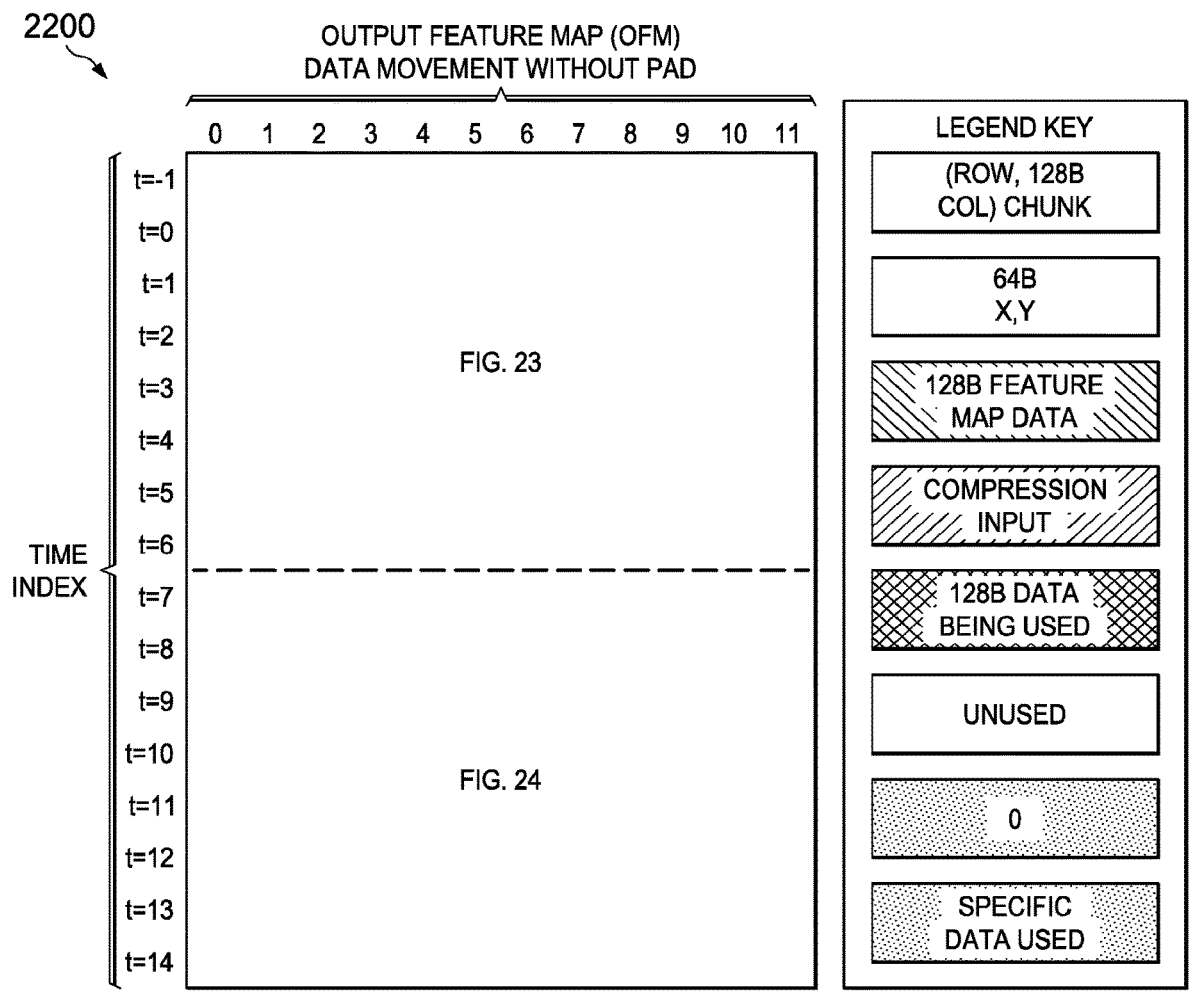
Figure 23:
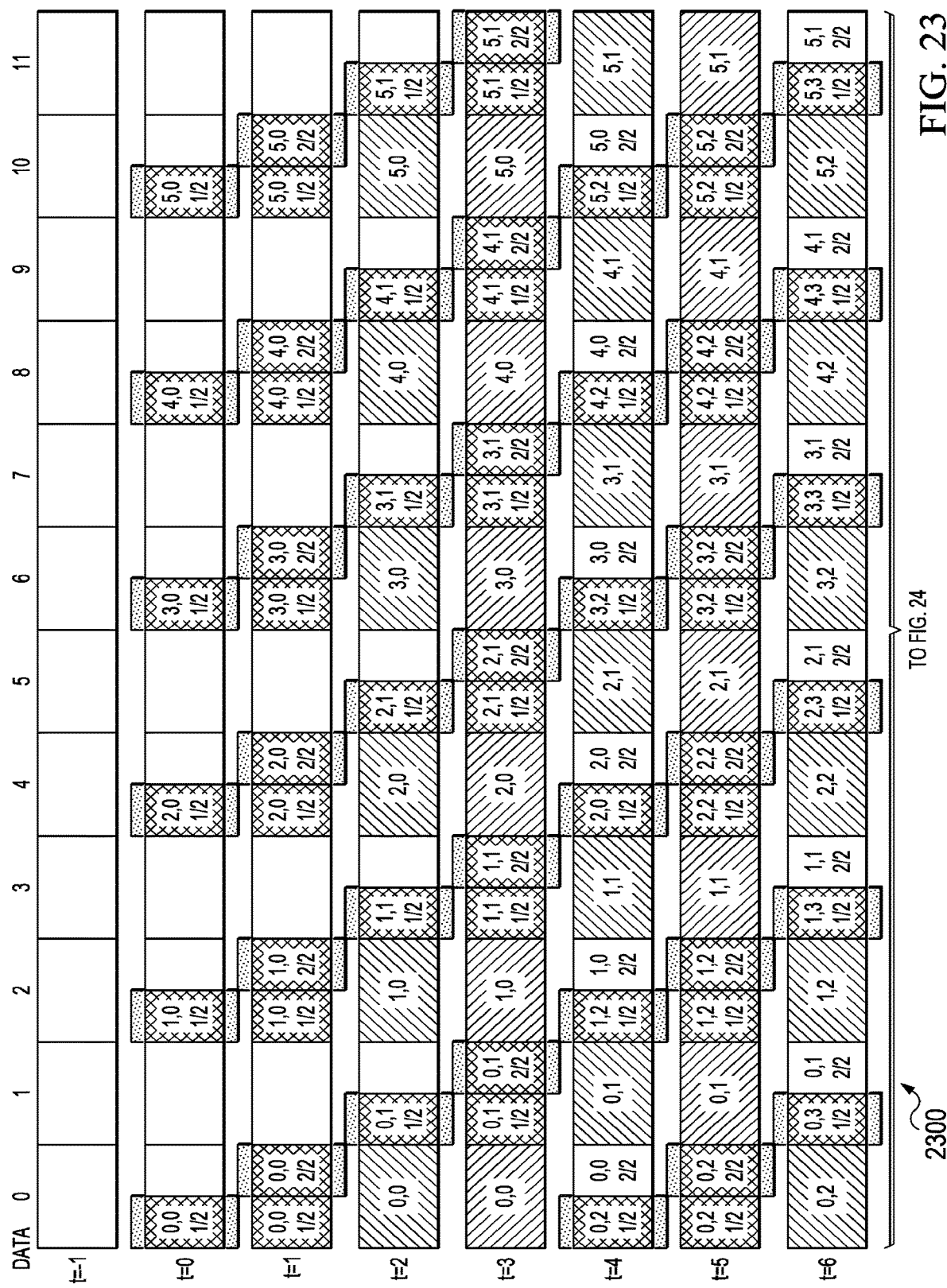
Figure 25:
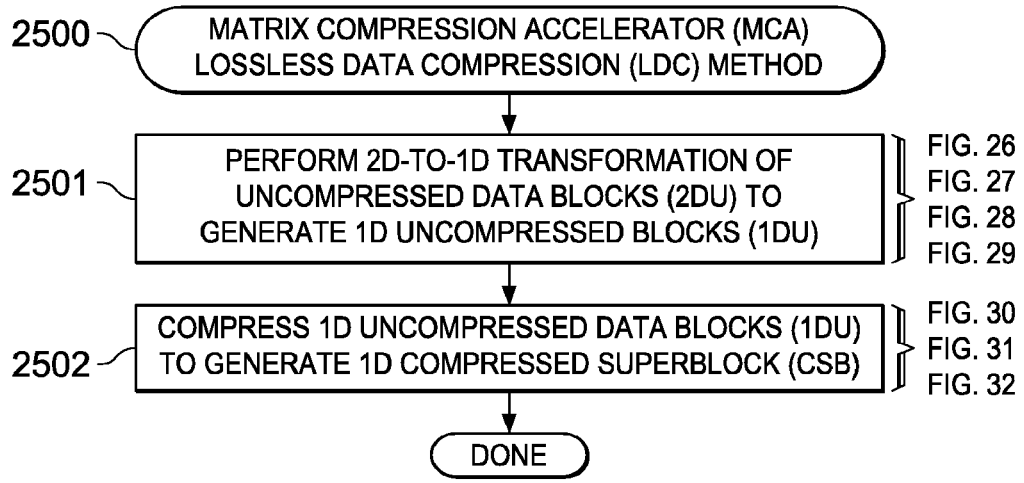
Figure 26:
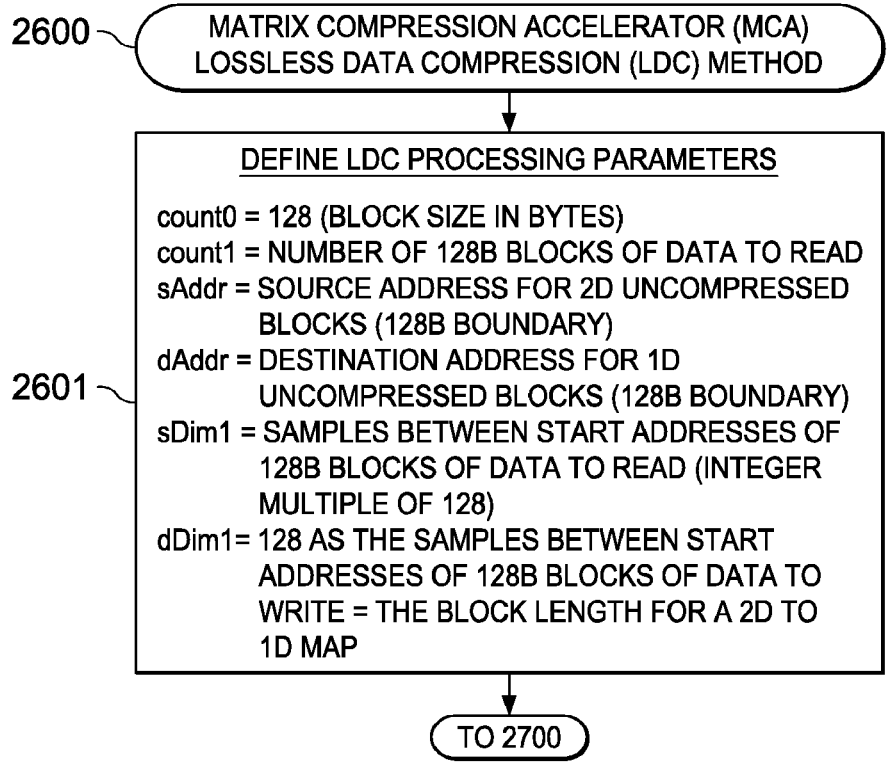
Figure 27:
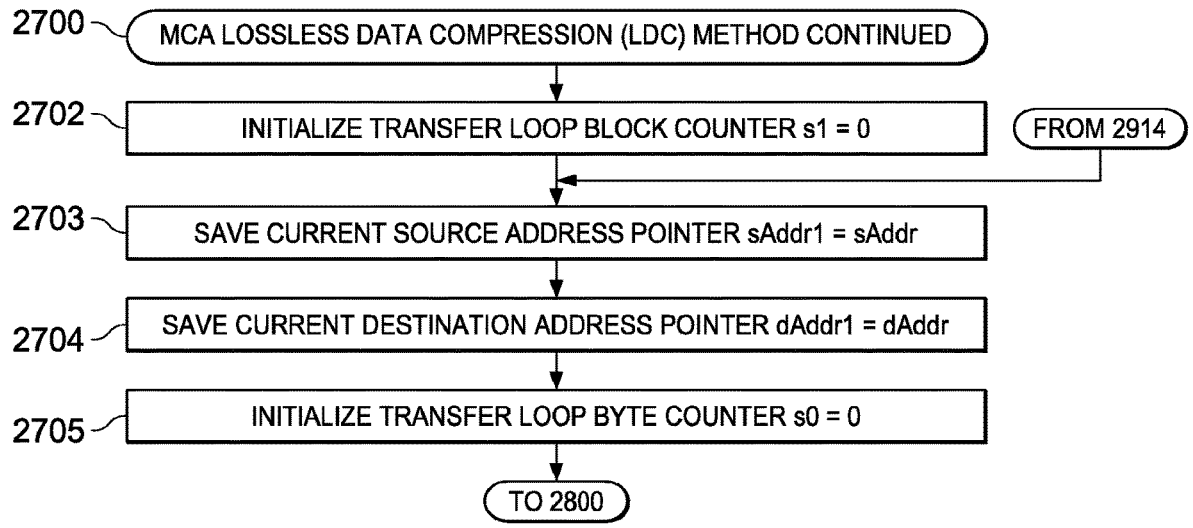
Figure 28:
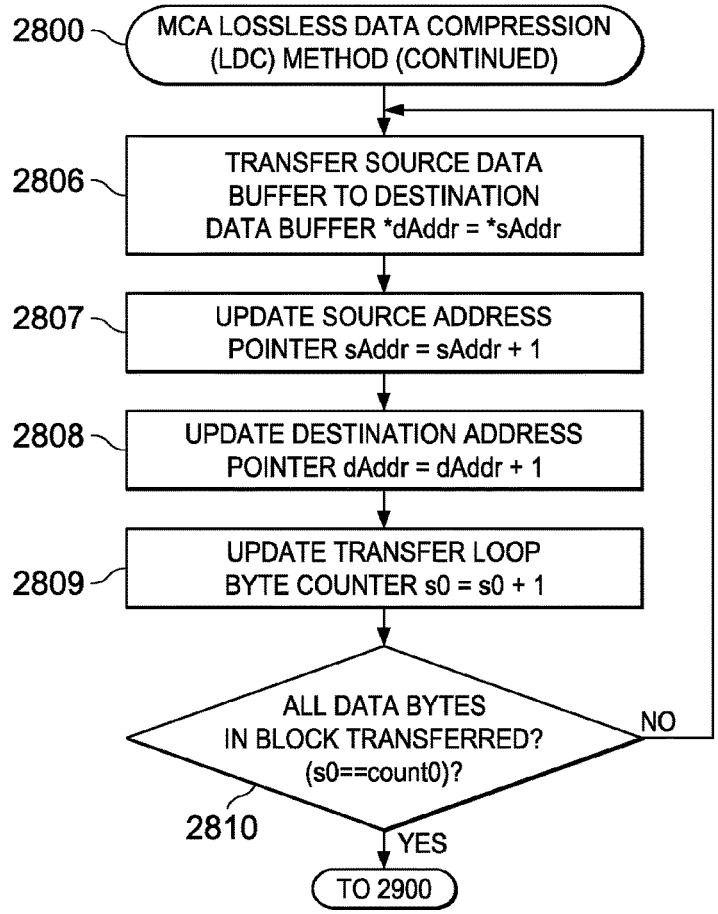
Figure 29:
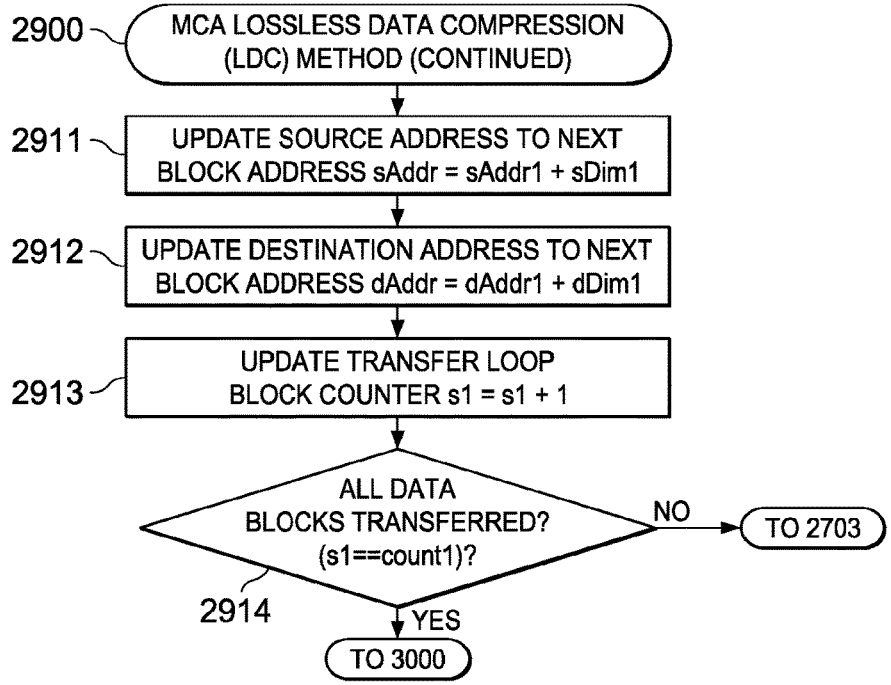
Figure 30:
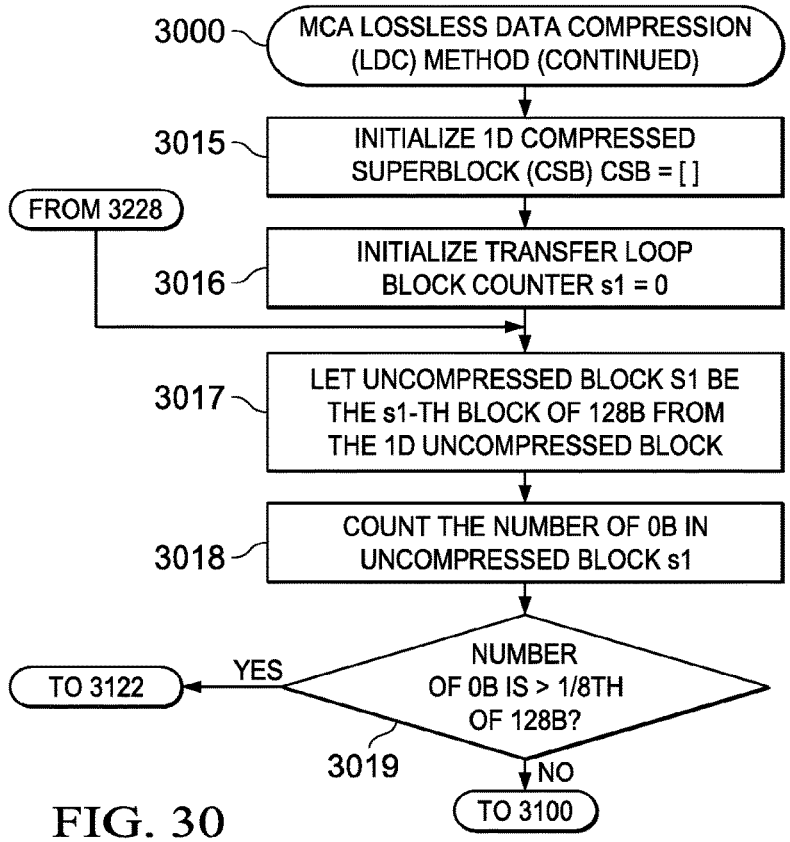
Figure 31:
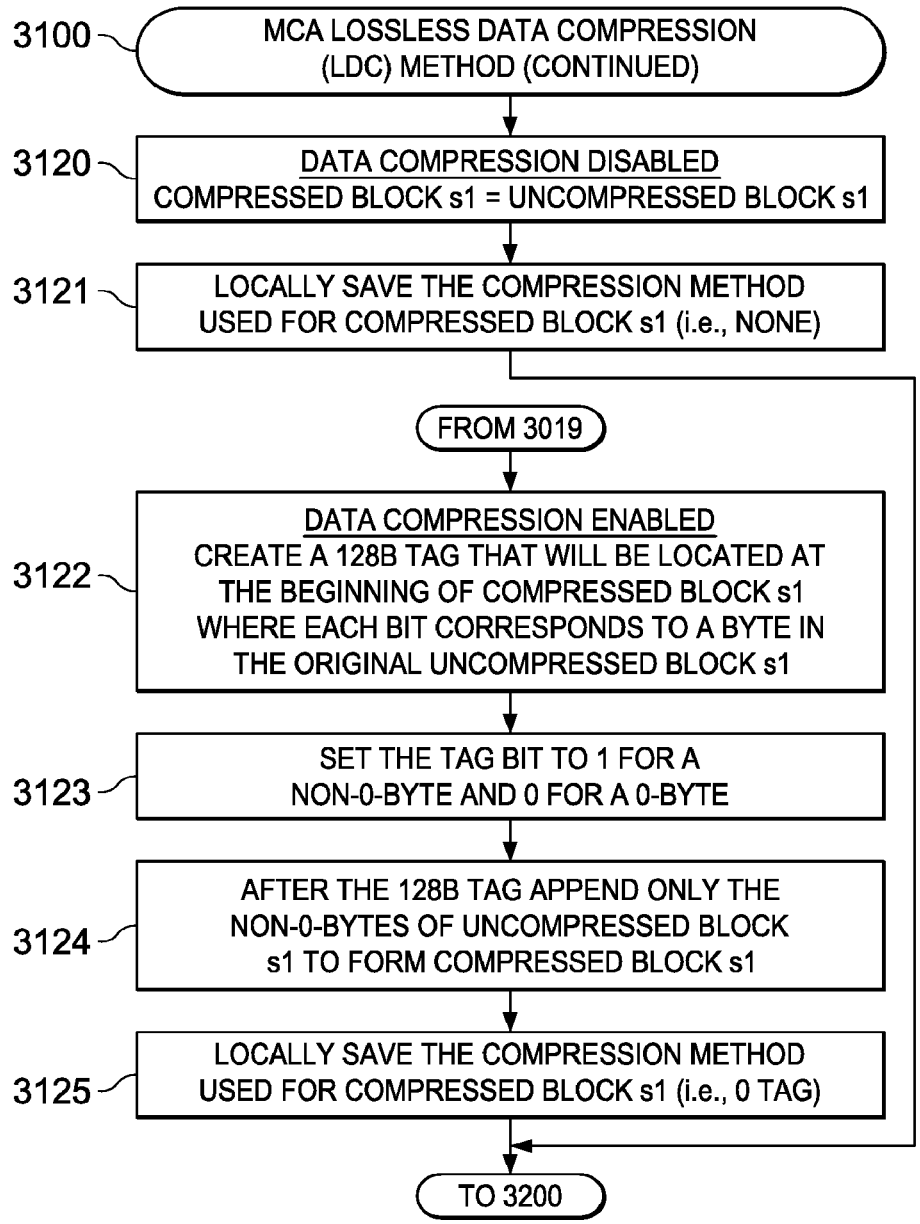
Figure 32:
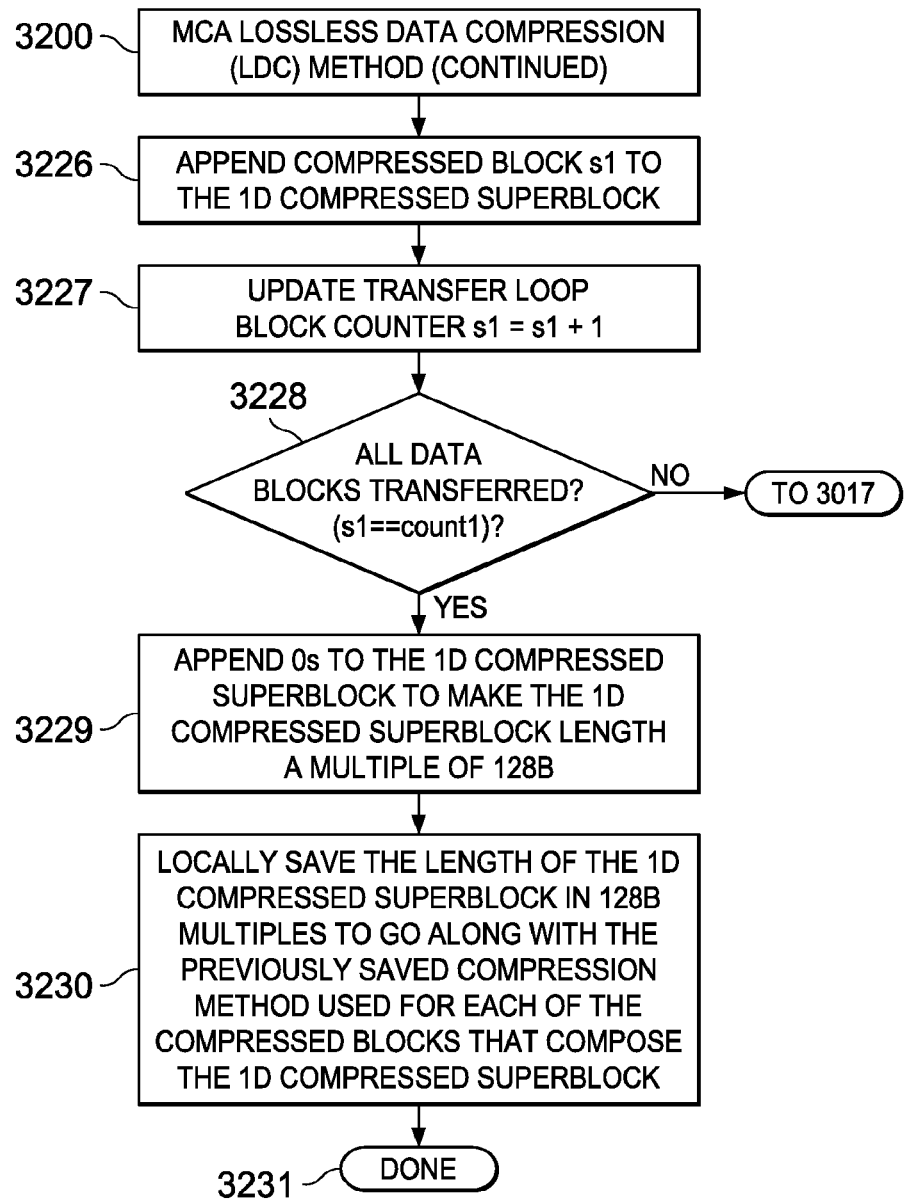
Figure 33:
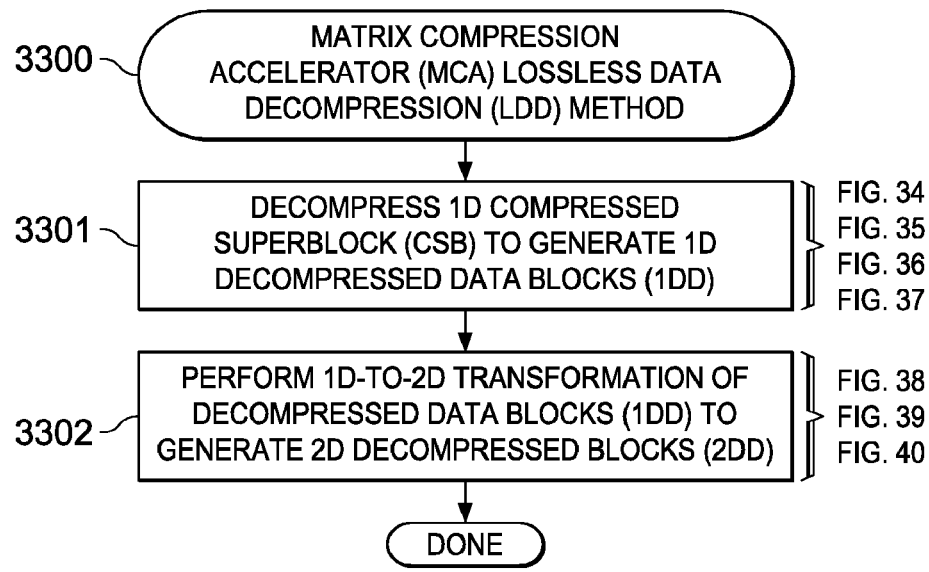
Figure 34:
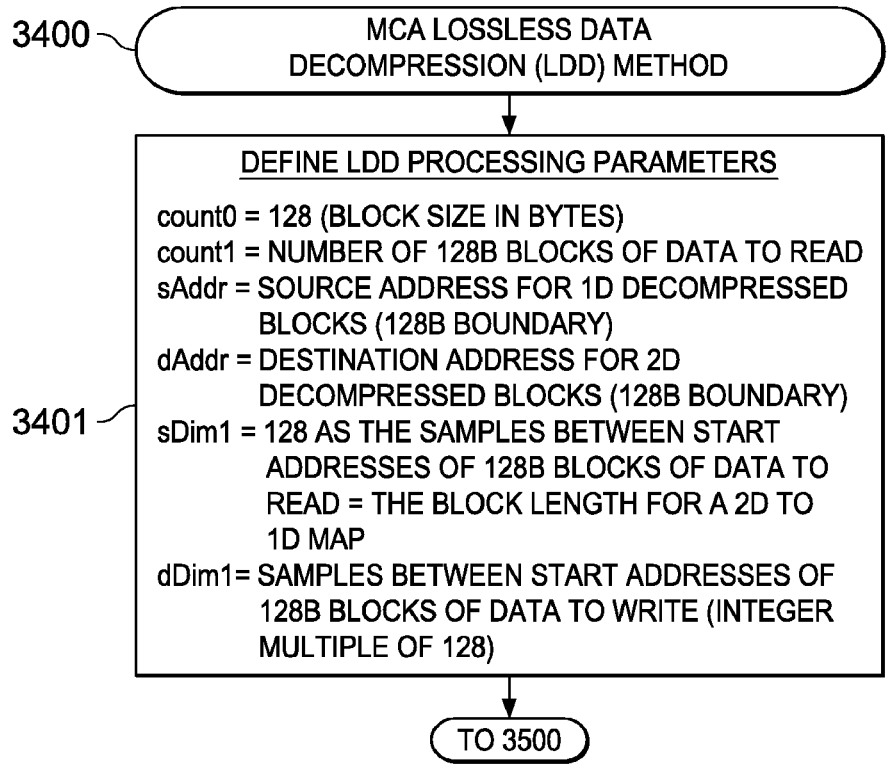
Figure 35:
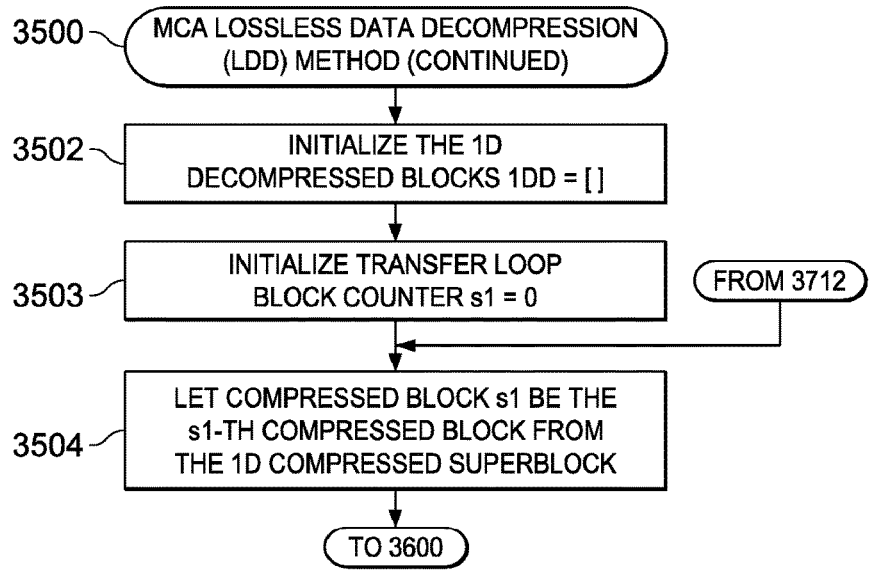
Figure 36:
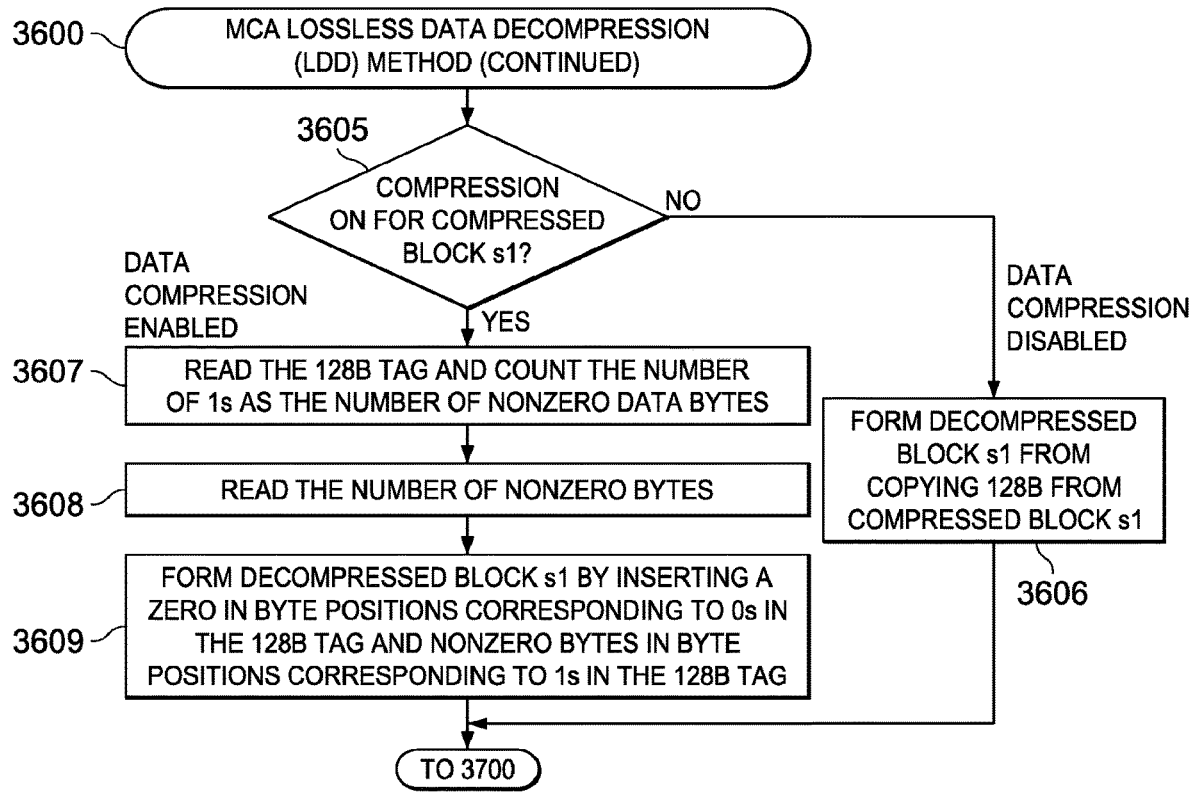
Figure 37:
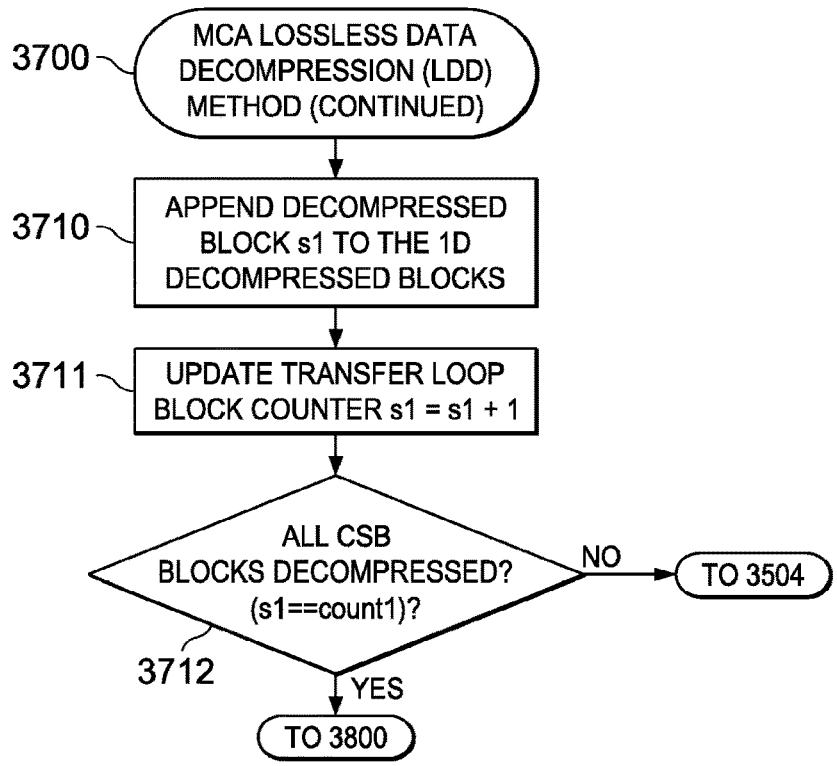
Figure 38:
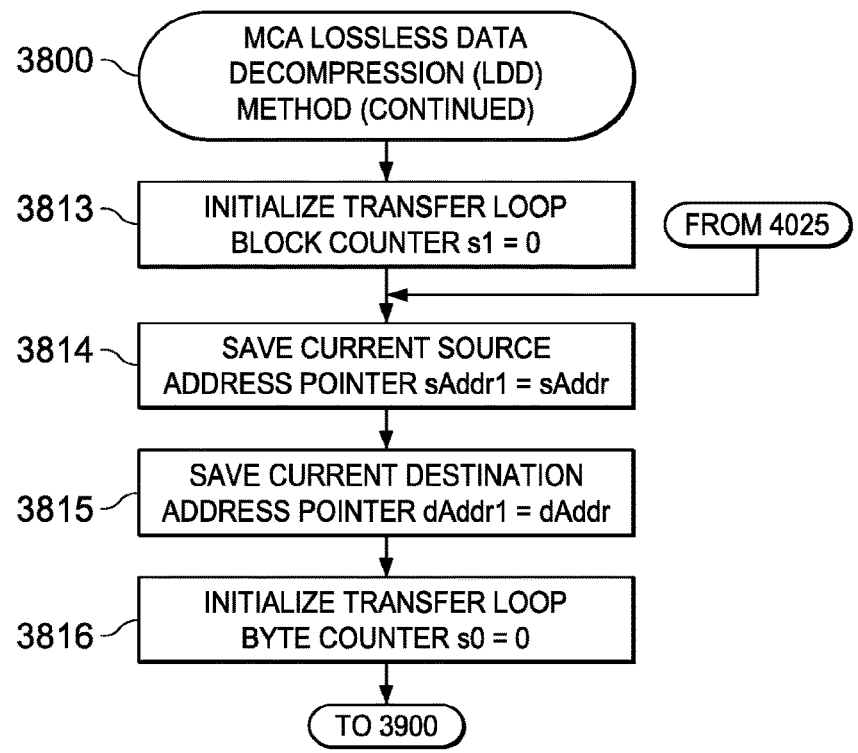
Figure 39:
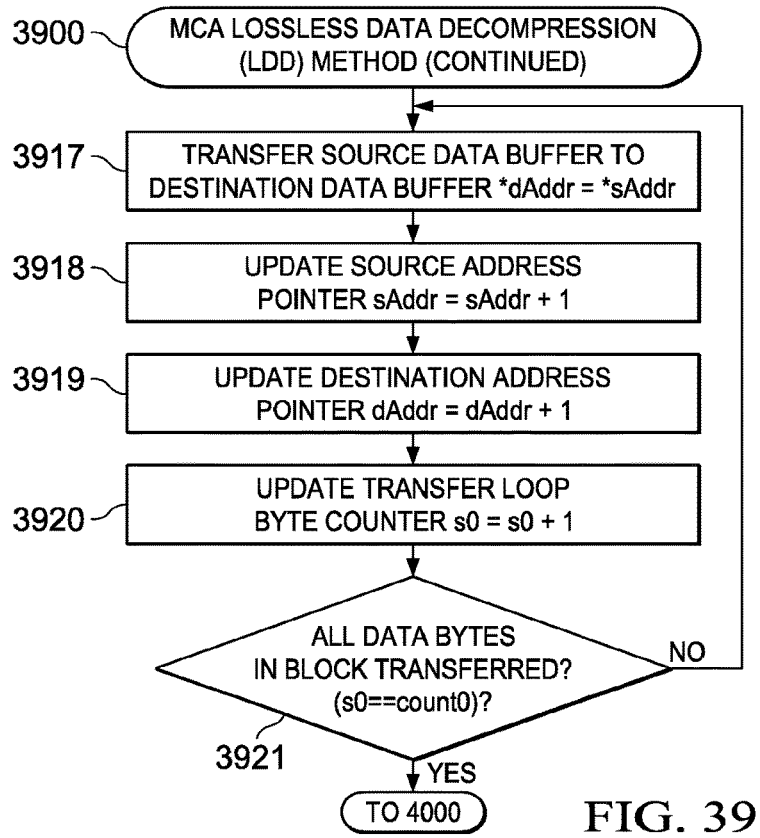
Figure 40:
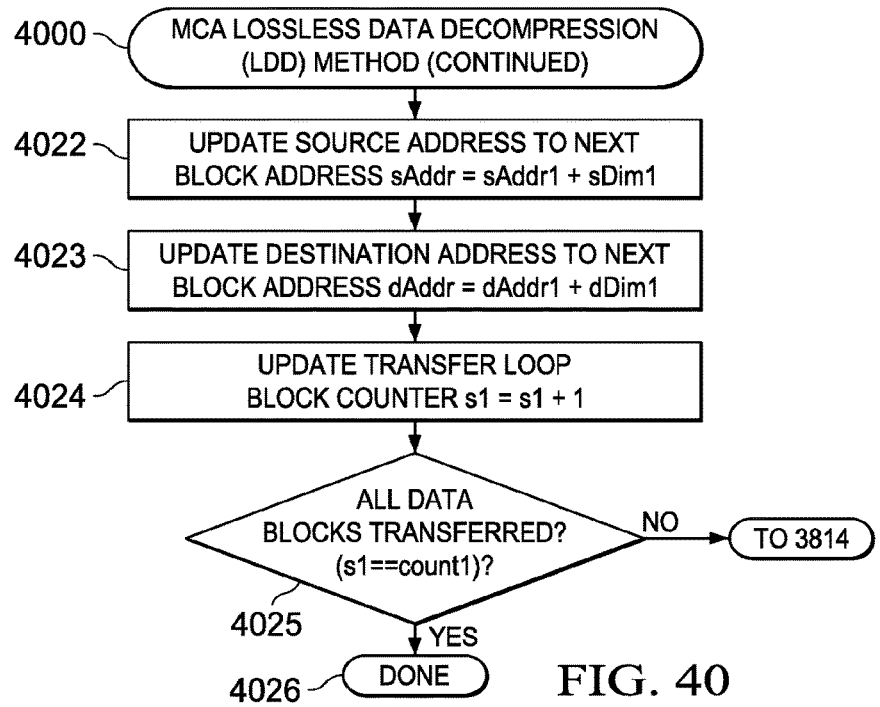
Figure 41:
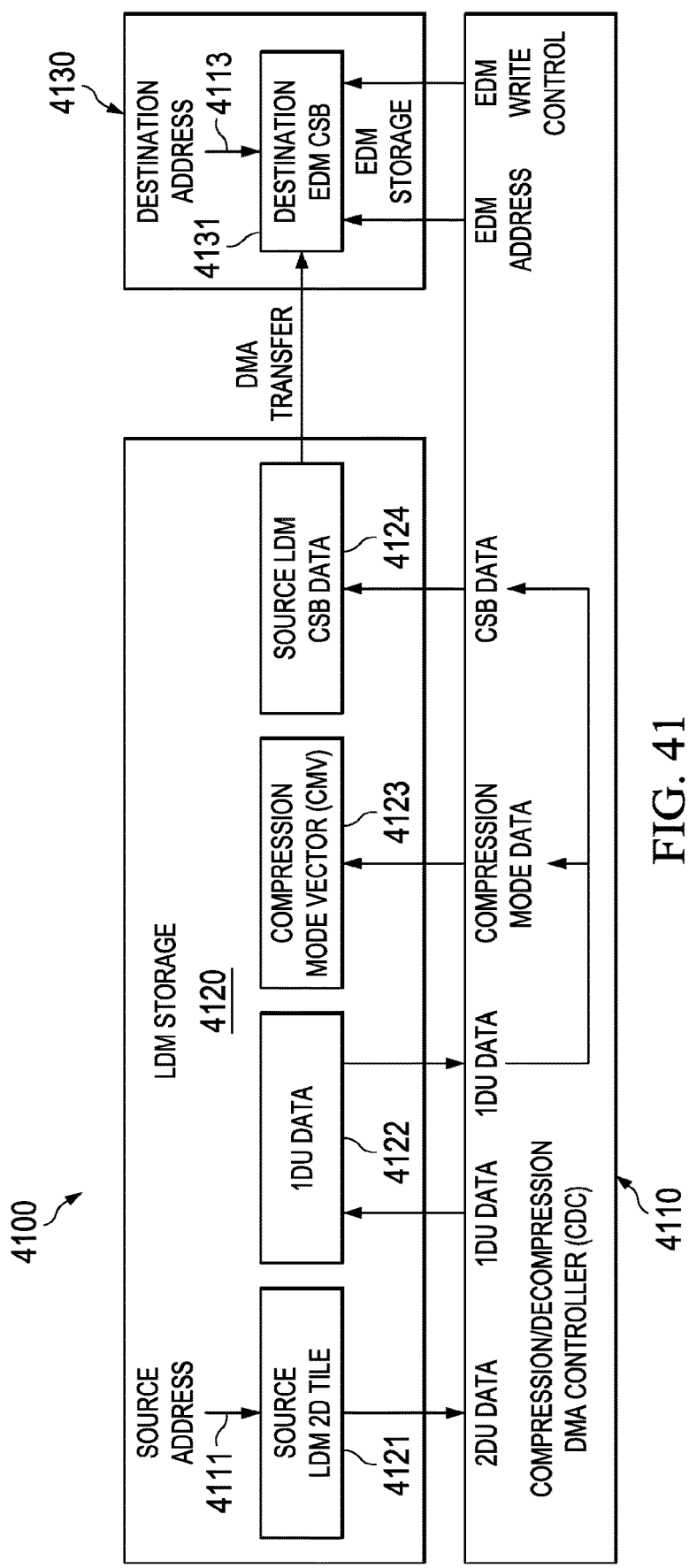
Figure 42:
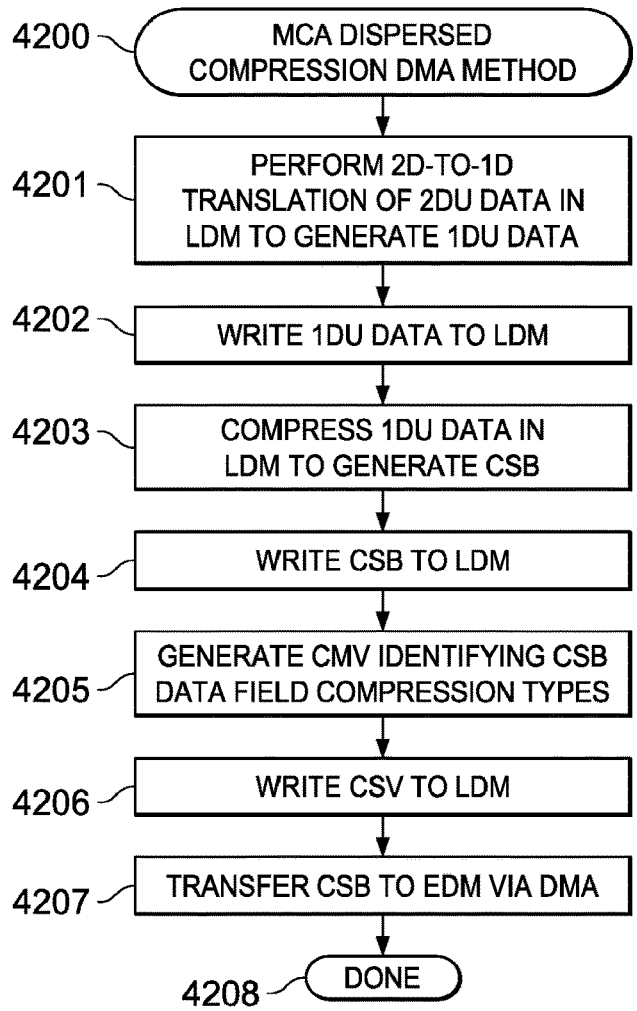
Figure 44:
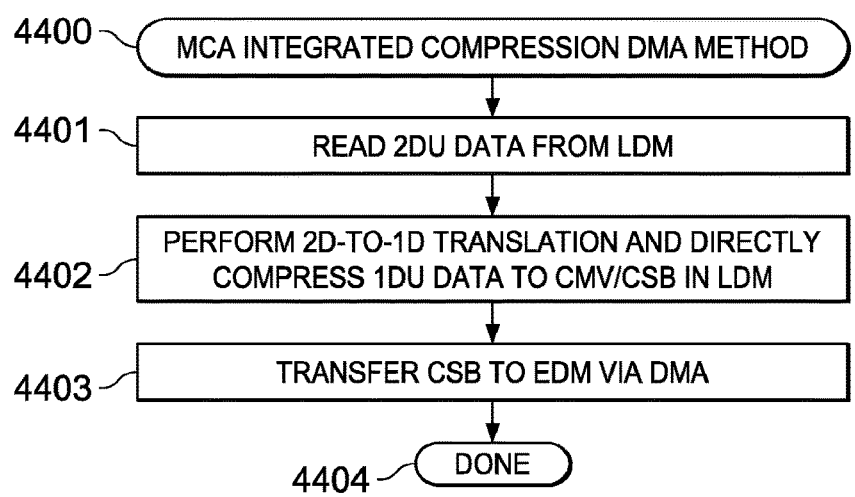
Figure 43:
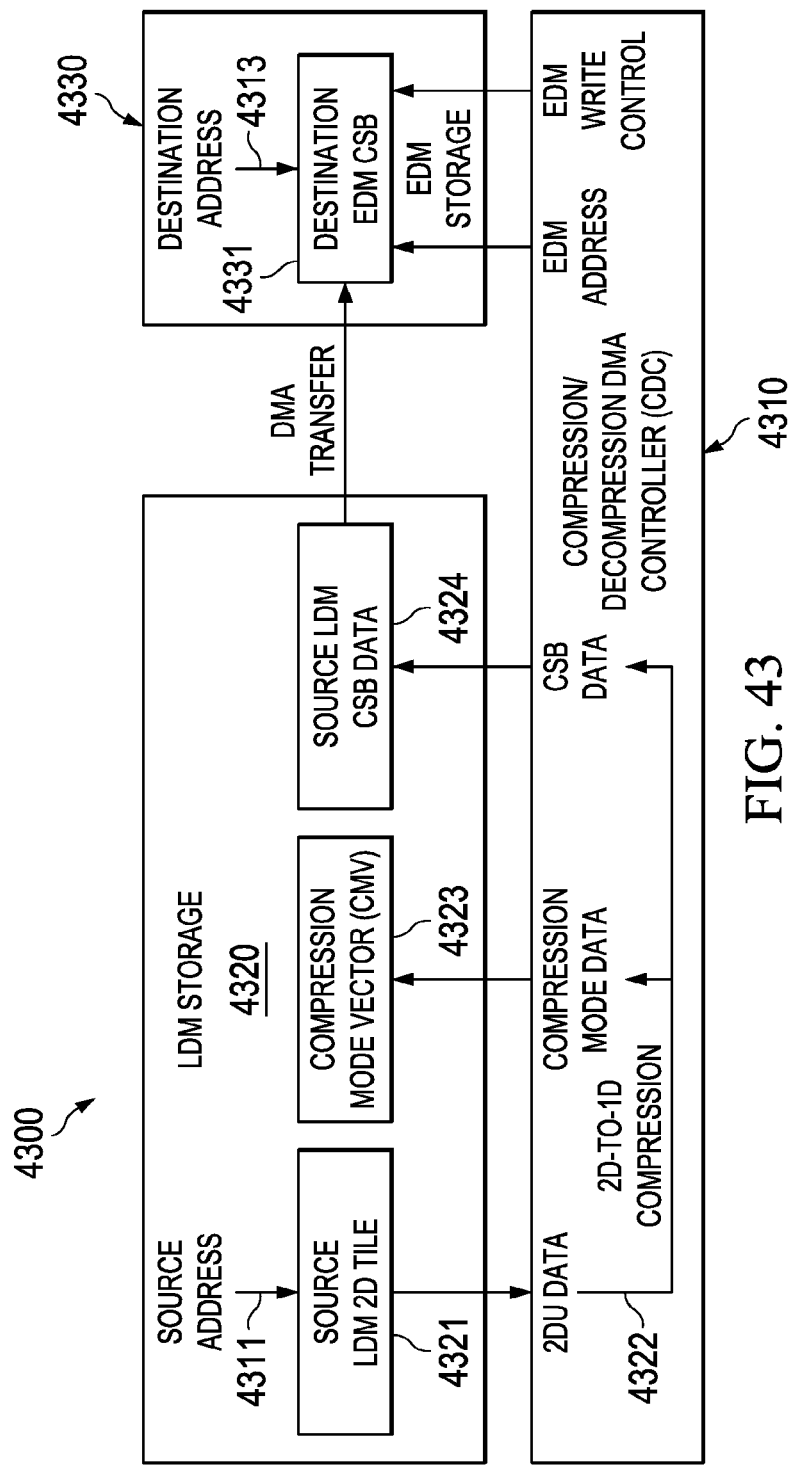
Figure 45:
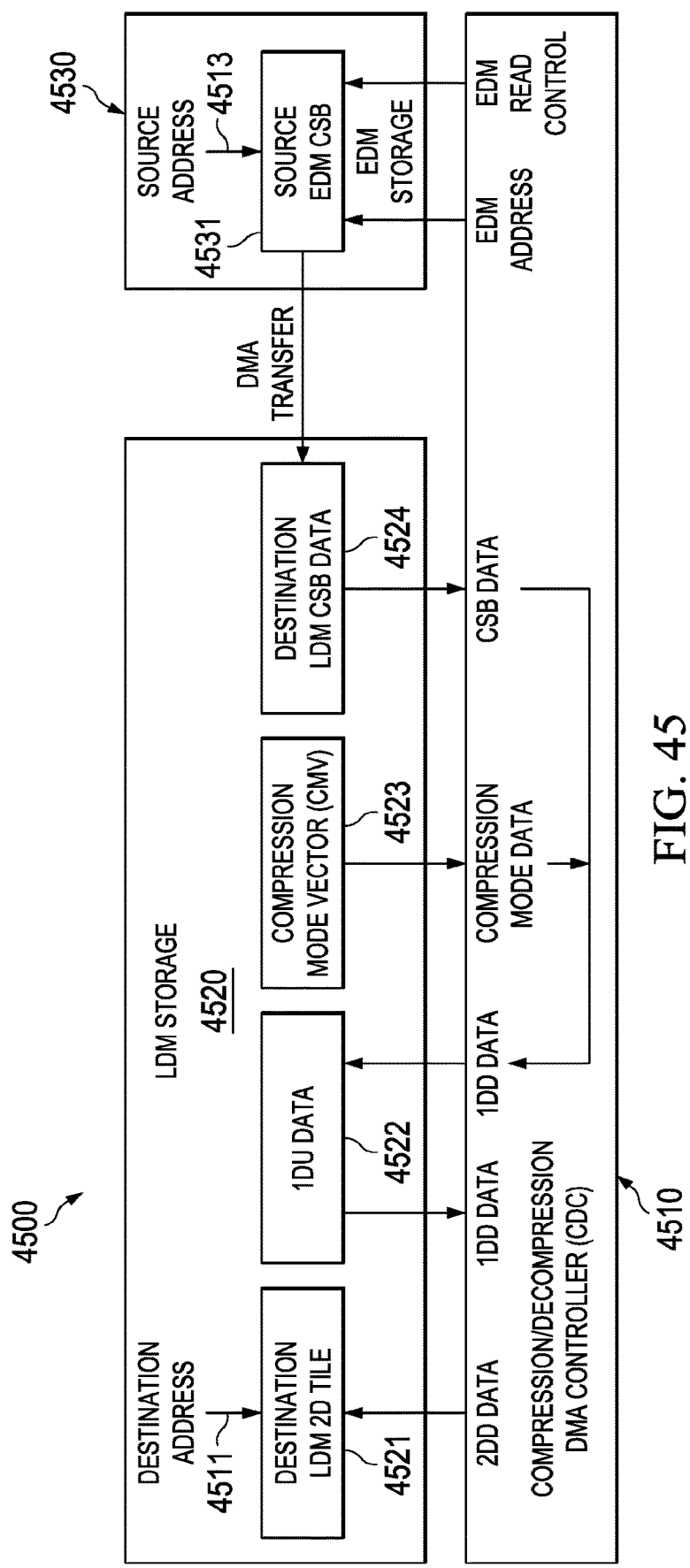
Figure 46:
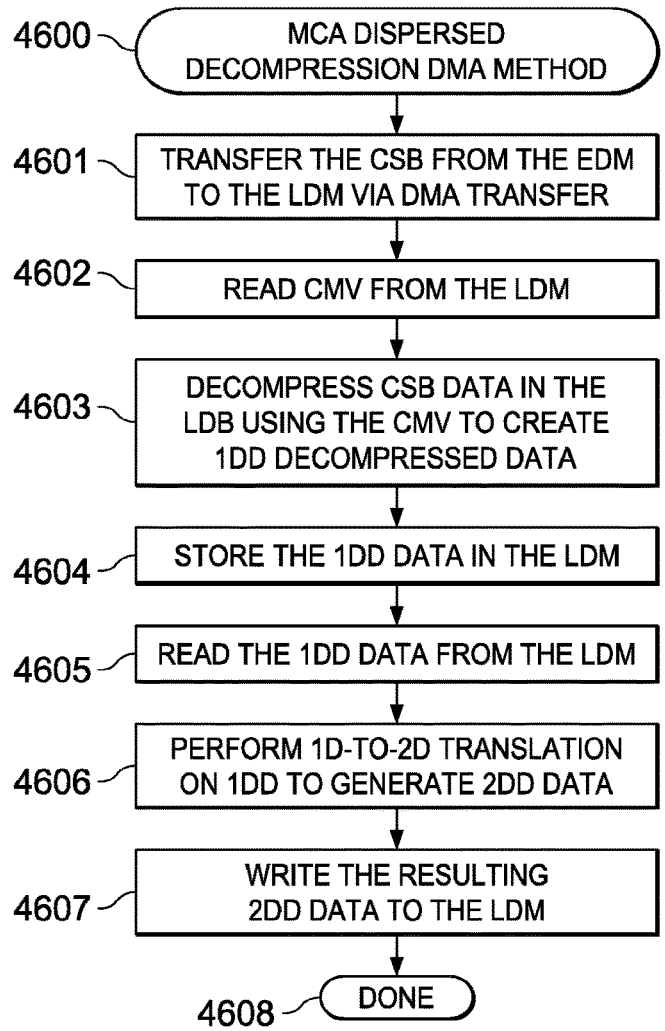
Figure 48:
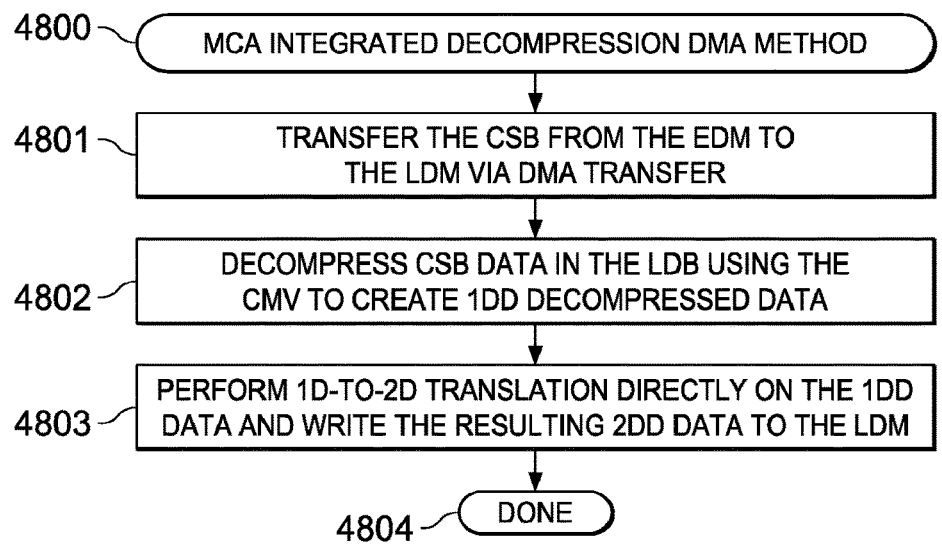
Figure 47:
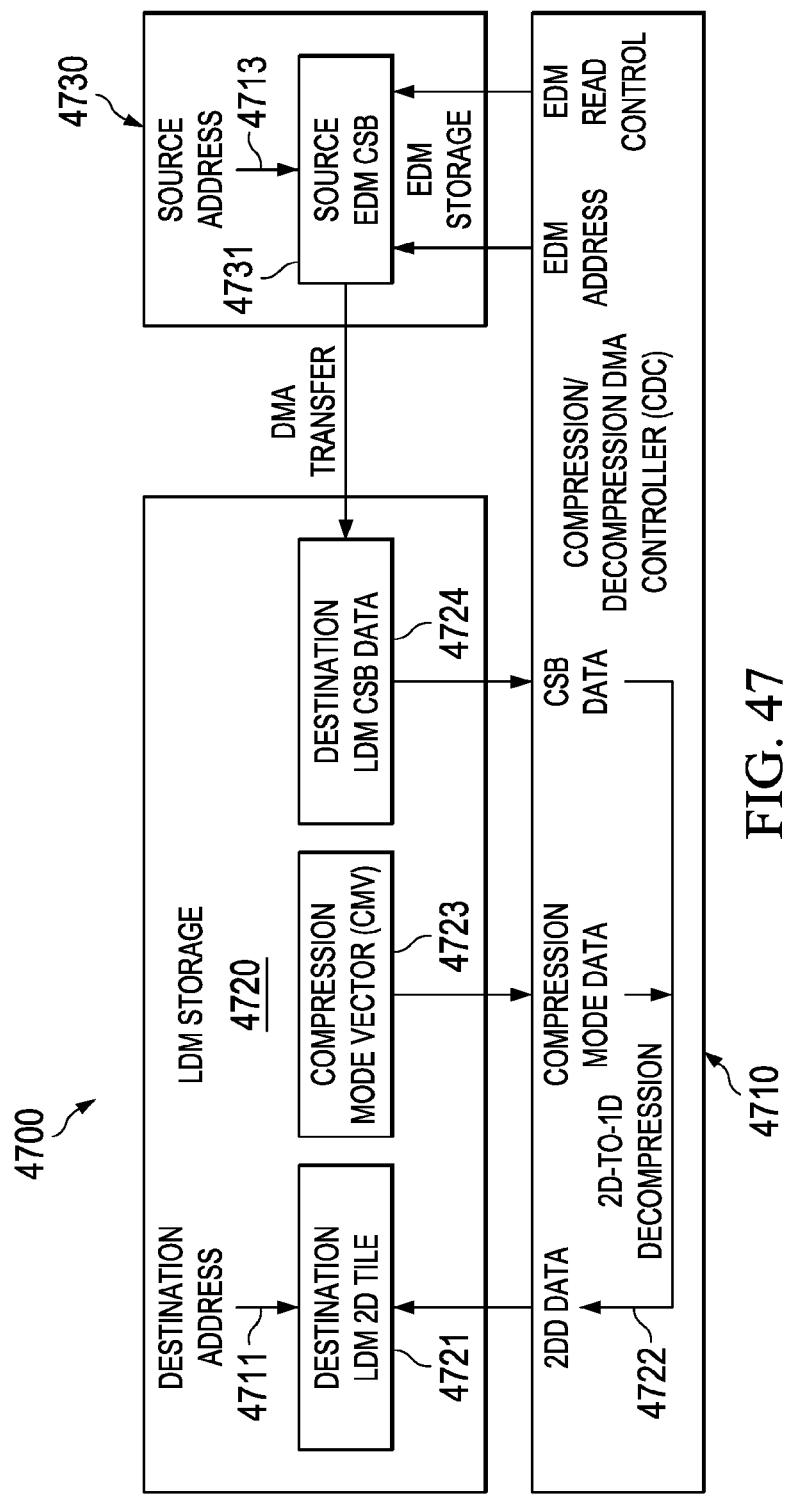

is contained in local data memory (LDM) and the X input feature map filtering multiplicand (IFM), and Y output feature map (OFM) are processed as tiles within local data memory (LDM);

FIG. 8 illustrates an embodiment of CNN matrix product calculation wherein the H filter coefficient multiplier (FCM) and Y output feature map (OFM) are processed as groups contained in local data memory (LDM) and the X input feature map filtering multiplicand (IFM) is totally contained within local data memory (LDM);

FIG. 9 illustrates a data flow diagram depicting operation of an embodiment of small feature map with no pad insertion MCA system embodiment;

FIG. 10 illustrates a flowchart depicting an embodiment of small feature map with no pad insertion MCA method embodiment;

FIG. 11 illustrates a data flow diagram depicting operation of a first embodiment of small feature map with pad insertion MCA system embodiment;

FIG. 12 illustrates a flowchart depicting a first embodiment of small feature map with pad insertion MCA method embodiment;

FIG. 13 illustrates a flowchart of an embodiment of large feature map (LFM) input feature map (IFM) with no pad insertion matrix compression accelerator (MCA) operational sequence;

FIG. 14 illustrates a flowchart of an embodiment of large feature map (LFM) input feature map (IFM) with no pad insertion matrix compression accelerator (MCA) operational sequence;

FIG. 15 illustrates a flowchart of an embodiment of large feature map (LFM) output feature map (OFM) with no pad insertion matrix compression accelerator (MCA) operational sequence;

FIG. 16 illustrates a flowchart of an embodiment of large feature map (LFM) output feature map (OFM) with no pad insertion matrix compression accelerator (MCA) operational sequence;

FIG. 17 illustrates an embodiment of matrix compression accelerator (MCA) input feature map (IFM) data movement example pattern for large feature map tiles with no pad insertion incorporating partial storage in LDM with 128B alignment for efficient EDM-to-LDM data movement that reduces local memory requirements and incorporates foreground/background data movement/compute cycles;

FIG. 18 illustrates an embodiment of matrix compression accelerator (MCA) input feature map (IFM) data movement example pattern for large feature map tiles with no pad insertion incorporating partial storage in LDM with 128B alignment for efficient EDM-to-LDM data movement that reduces local memory requirements and incorporates foreground/background data movement/compute cycles;

FIG. 19 illustrates an embodiment of matrix compression accelerator (MCA) input feature map (IFM) data movement example pattern for large feature map tiles with no pad insertion incorporating partial storage in LDM with 128B alignment for efficient EDM-to-LDM data movement that reduces local memory requirements and incorporates foreground/background data movement/compute cycles;

Figure 20:
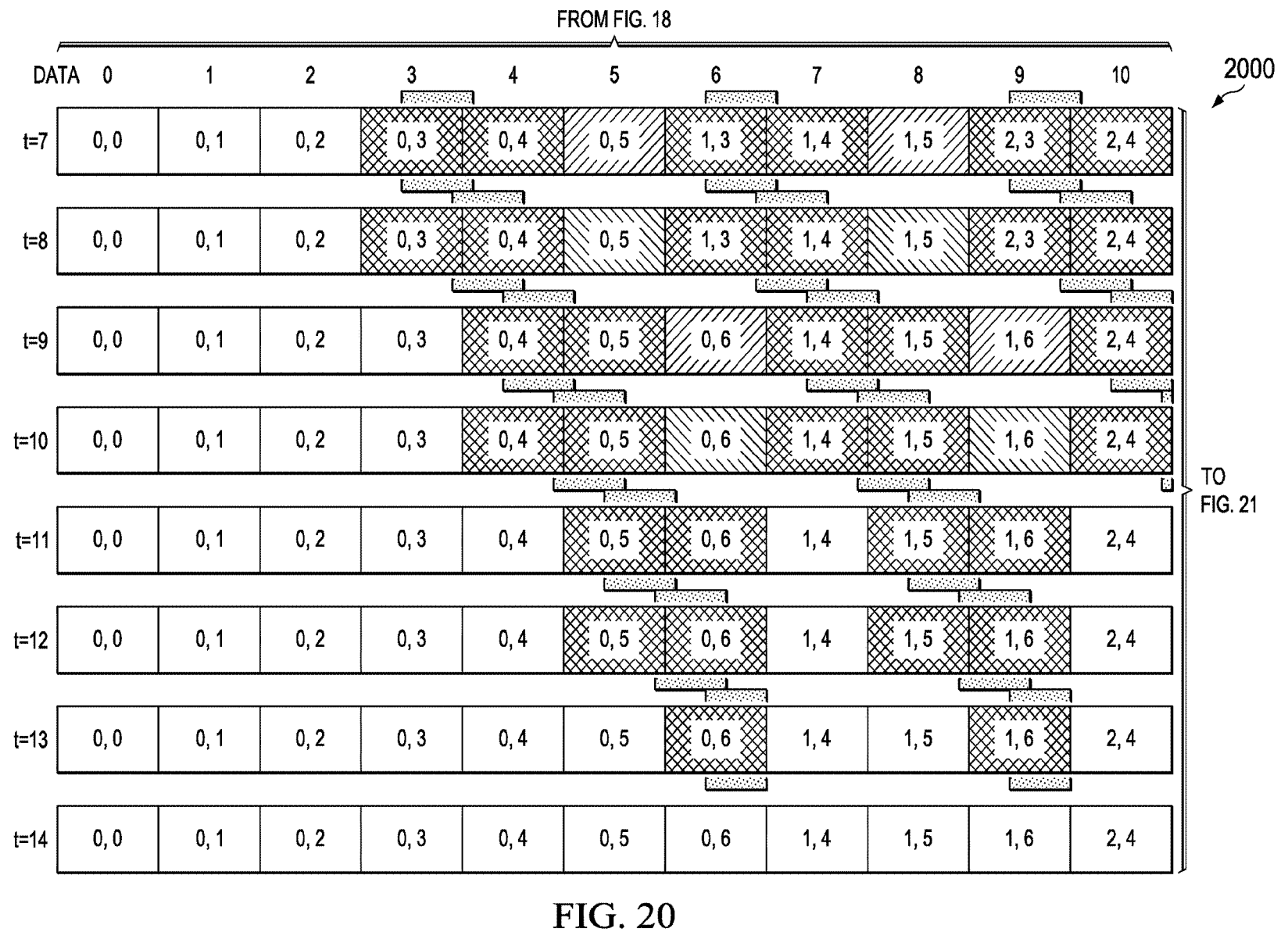

FIG. 20 illustrates an embodiment of a matrix compression accelerator (MCA) input feature map (IFM) data movement example pattern for large feature map tiles with no pad insertion incorporating partial storage in LDM with 128B alignment for efficient EDM-to-LDM data movement that reduces local memory requirements and incorporates foreground/background data movement/compute cycles;

Figure 21:
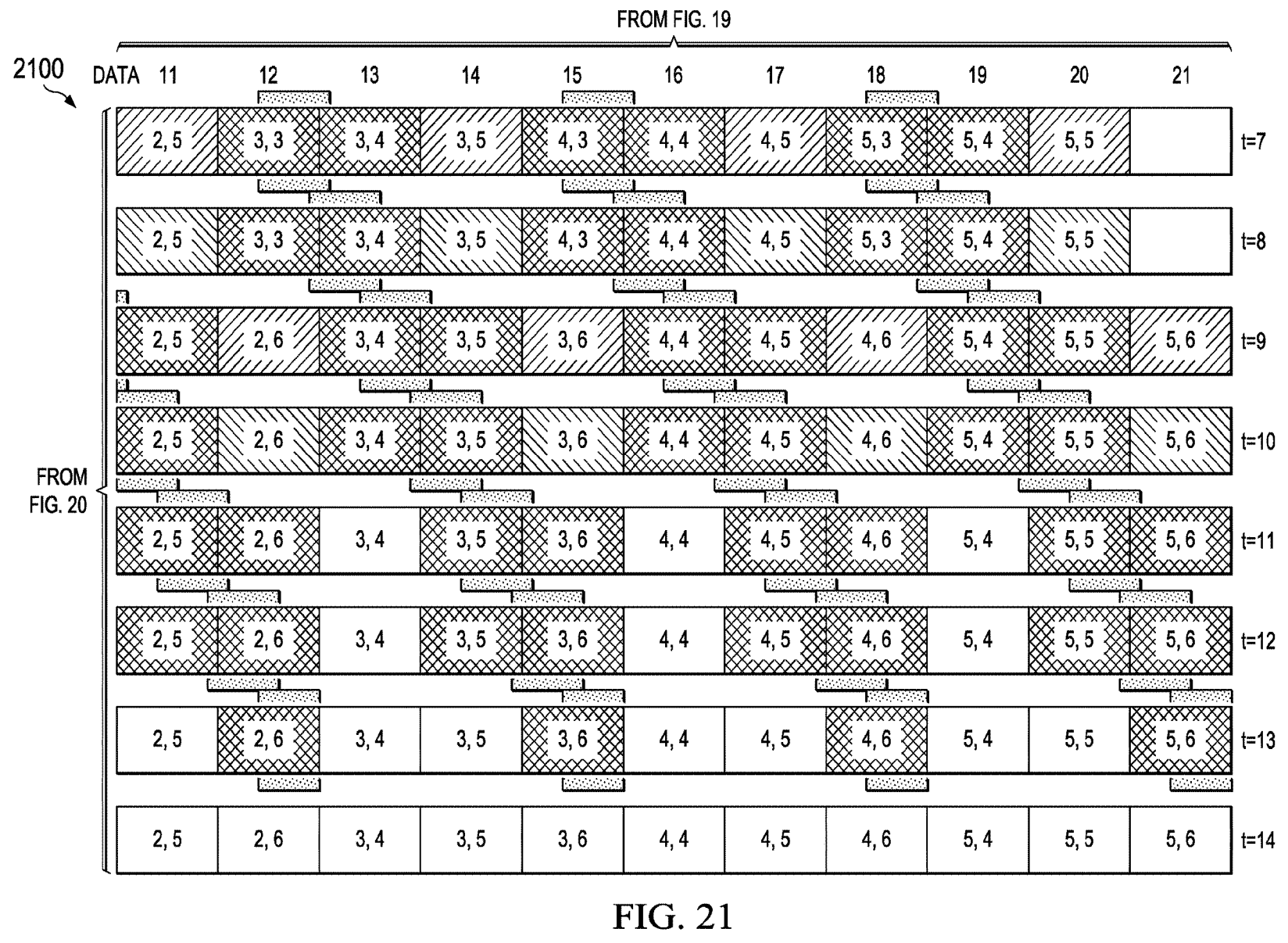

FIG. 21 illustrates an embodiment of a matrix compression accelerator (MCA) input feature map (IFM) data movement example pattern for large feature map tiles with no pad insertion incorporating partial storage in LDM with 128B alignment for efficient EDM-to-LDM data movement that reduces local memory requirements and incorporates foreground/background data movement/compute cycles;

FIG. 22 illustrates an embodiment of a matrix compression accelerator (MCA) output feature map (OFM) data movement example pattern for large feature map tiles with no pad insertion incorporating partial storage in LDM with 128B alignment for efficient EDM-to-LDM data movement that reduces local memory requirements and incorporates foreground/background data movement/compute cycles;

FIG. 23 illustrates an embodiment of a matrix compression accelerator (MCA) output feature map (OFM) data movement example pattern for large feature map tiles with no pad insertion incorporating partial storage in LDM with 128B alignment for efficient EDM-to-LDM data movement that reduces local memory requirements and incorporates foreground/background data movement/compute cycles;

Figure 24:
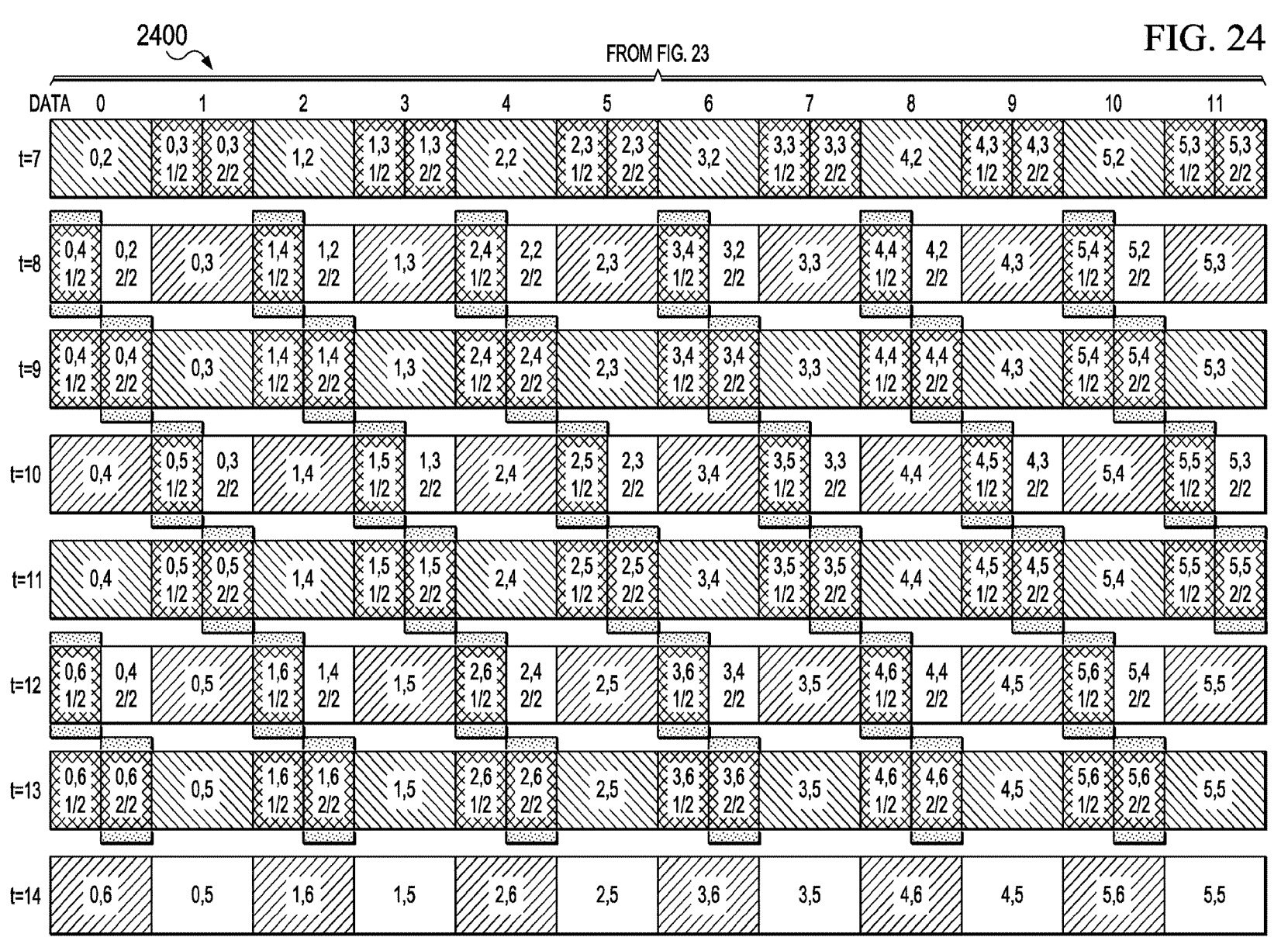

FIG. 24 illustrates an embodiment of a matrix compression accelerator (MCA) output feature map (OFM) data movement example pattern for large feature map tiles with no pad insertion incorporating partial storage in LDM with 128B alignment for efficient EDM-to-LDM data movement that reduces local memory requirements and incorporates foreground/background data movement/compute cycles;

FIG. 25 illustrates a flowchart depicting an embodiment of a MCA lossless data compression (LDC) method as applied to an block size of 128 bytes;

FIG. 26 illustrates a flowchart depicting an embodiment of a MCA lossless data compression (LDC) method as applied to an block size of 128 bytes;

FIG. 27 illustrates a flowchart depicting an embodiment of a MCA lossless data compression (LDC) method as applied to an block size of 128 bytes;

FIG. 28 illustrates a flowchart depicting an embodiment of a MCA lossless data compression (LDC) method as applied to an block size of 128 bytes;

FIG. 29 illustrates a flowchart depicting an embodiment of a MCA lossless data compression (LDC) method as applied to an block size of 128 bytes;

FIG. 30 illustrates a flowchart depicting an embodiment of a MCA lossless data compression (LDC) method as applied to an block size of 128 bytes;

FIG. 31 illustrates a flowchart depicting an embodiment of a MCA lossless data compression (LDC) method as applied to an block size of 128 bytes;

FIG. 32 illustrates a flowchart depicting an embodiment of a MCA lossless data compression (LDC) method as applied to an block size of 128 bytes;

FIG. 33 illustrates a flowchart depicting an embodiment of a MCA lossless data decompression (LDD) method as applied to an block size of 128 bytes;

FIG. 34 illustrates a flowchart depicting an embodiment of a MCA lossless data decompression (LDD) method as applied to an block size of 128 bytes;

FIG. 35 illustrates a flowchart depicting an embodiment of a MCA lossless data decompression (LDD) method as applied to an block size of 128 bytes;

FIG. 36 illustrates a flowchart depicting an embodiment of a MCA lossless data decompression (LDD) method as applied to an block size of 128 bytes;

FIG. 37 illustrates a flowchart depicting an embodiment of a MCA lossless data decompression (LDD) method as applied to an block size of 128 bytes;

FIG. 38 illustrates a flowchart depicting an embodiment of a MCA lossless data decompression (LDD) method as applied to an block size of 128 bytes;

FIG. 39 illustrates a flowchart depicting an embodiment of a MCA lossless data decompression (LDD) method as applied to an block size of 128 bytes;

FIG. 40 illustrates a flowchart depicting an embodiment of a MCA lossless data decompression (LDD) method as applied to an block size of 128 bytes;

FIG. 41 illustrates a functional block diagram detailing an embodiment of a dispersed compression DMA controller (CDC) system useful in some disclosed embodiments;

FIG. 42 illustrates a flowchart detailing an embodiment of a dispersed compression DMA controller (CDC) system useful in some disclosed embodiments;

FIG. 43 illustrates a functional block diagram detailing an embodiment of an integrated compression DMA controller (CDC) system useful in some disclosed embodiments;

FIG. 44 illustrates a flowchart detailing an embodiment of an integrated compression DMA controller (CDC) system useful in some disclosed embodiments;

FIG. 45 illustrates a functional block diagram detailing an embodiment of a dispersed decompression DMA controller (CDC) system useful in some disclosed embodiments;

FIG. 46 illustrates a flowchart detailing an embodiment of a dispersed decompression DMA controller (CDC) system useful in some disclosed embodiments;

FIG. 47 illustrates a functional block diagram detailing an embodiment of an integrated decompression DMA controller (CDC) system useful in some disclosed embodiments; and FIG. 48 illustrates a flowchart detailing an embodiment of an integrated decompression DMA controller (CDC) system useful in some disclosed embodiments.

DETAILED DESCRIPTION OF THE INVENTION

The numerous innovative teachings of the present application will be described with particular reference to the presently disclosed embodiments, wherein these innovative teachings are advantageously applied to the particular problems of a MATRIX COMPRESSION ACCELERATOR SYSTEM AND METHOD. However, it should be understood that this embodiment is only one example of the many advantageous uses of the innovative teachings herein. In general, statements made in the specification of the present application do not necessarily limit any of the various claimed disclosures. Moreover, some statements may apply to some inventive features but not to others.

Data Widths Exemplary

Within many system embodiments the data bus width utilized by the EMB will be 128 bytes (128B), but this is not a limitation on the scope of the present disclosure. Additionally, for simplicity of presentation, examples contained herein are illustrated for 128B data alignment boundaries, 128B minimum EDM to LDM transfer lengths, and 64B LDM compute lengths. Note, however, that these values are only for example and the proposed techniques apply equally well to other data bus widths.

Processing Data

The present disclosure typically operates in the context of an integrated matrix multiplication unit (MMU) in which vectors and/or matrices are multiplied together using a wide variety of dot-matrix mathematical primitive functions, some of which are detailed in references incorporated with this patent application. Thus, the phrase "processing data" and the like when used herein or within the claims scope will refer to these matrix operations that may utilize tiles or groups of data stored within local data memory (LDM) as the arguments to these varied mathematical matrix operators.

Matrix Row Notation

Matrix rows (or portions thereof) may be referenced herein using the notation MATRIX[row,*] or MATRIX(row,*) to denote all row columns or equivalently in some circumstances a portion (tile or group) of columns within a given row.

FSM Implementation

The present disclosure may in many embodiments be implemented using finite state machine (FSM) hardware logic. Within this document flowcharts are provided that detail operational steps associated with various aspects of these FSMs. One skilled in the electrical arts will no doubt be capable of translating these operational steps as provided in the flowcharts to a physical hardware logic embodiment. Since the actual implementation may vary based on a variety of application specific hardware details, specific hardware logic details have been omitted herein as they are not necessary for either understanding of the disclosures teachings nor are they needed to implement the disclosure in a variety of preferred and non-preferred embodiments.

Lossless/Lossy Data Compression/Decompression

While the examples provided herein detail system/method embodiments wherein lossless data compression (LDC) and lossless data decompression (LDD) are utilized to implement the present disclosure, the present disclosure anticipates that lossy data compression (LYC) and/or lossy data decompression (LYD) may be utilized in some disclosed embodiments.

System Overview (0100)

Figure 1:
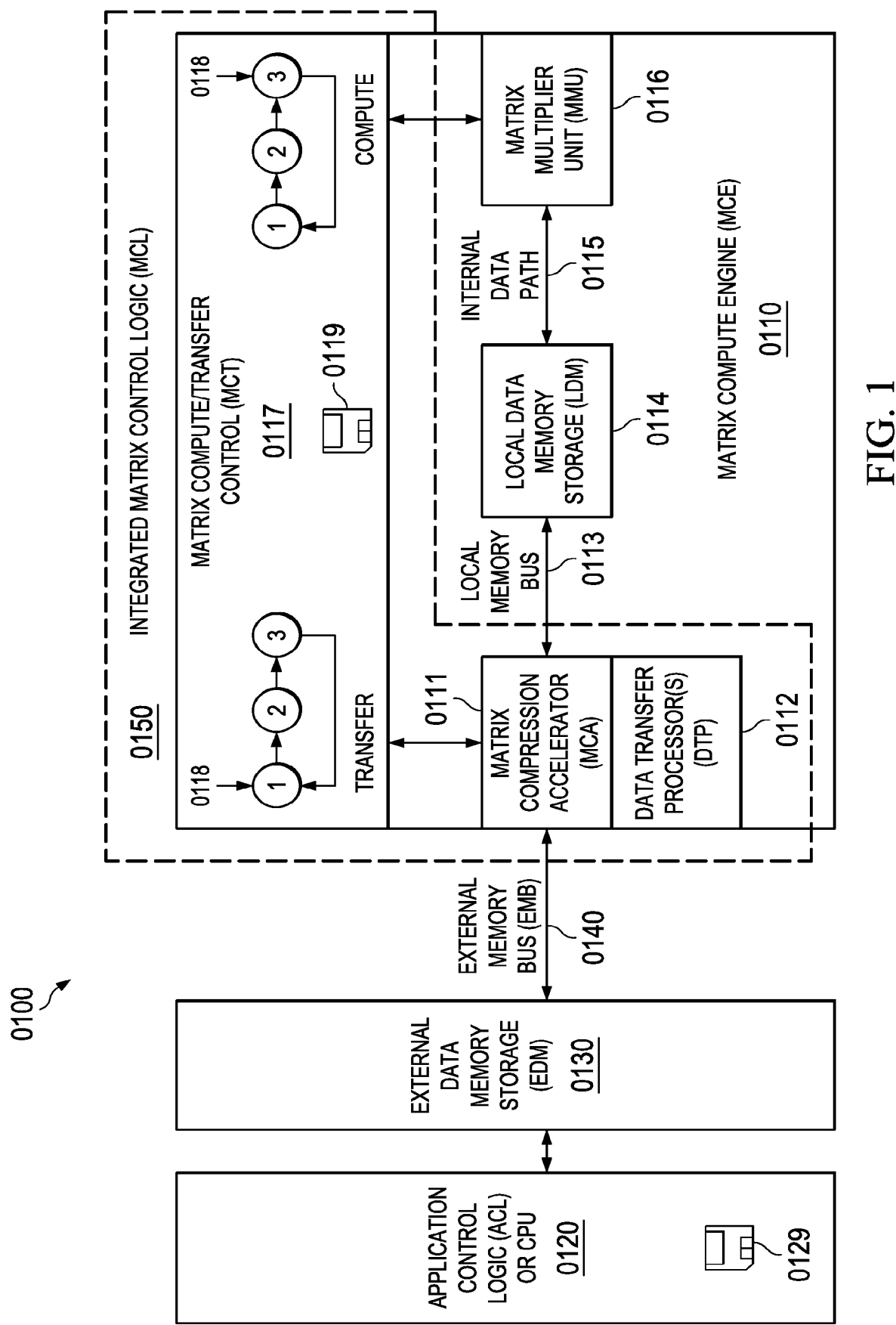
FIG. 1 illustrates a system block diagram of an embodiment of the present disclosure.

A typical application context overview of the present disclosure is generally depicted in FIG. 1 (0100) wherein a matrix compute engine (MCE) (0110) is interfaced to application control logic (ACL) or CPU (0120) via an external data memory (EDM) (0130) and external data memory bus (0140). The matrix compression accelerator (MCA) (0111) typically incorporates one or more data transfer processors (DTP) (0112) that perform data transfers between the EDM (0130) and the local data memory (LDM) (0114) via the internal local memory bus (LMB) (0113). The matrix compression accelerator (MCA) (0111) coordinates overall operation of the DTP (0112) processors and interfacing between the EMB (0130) and an internal local memory bus (LMB) (0113) that permits access to local data memory (LDM) (0114) within the MCE (0110). Within this typical application context the EDM (0130) may include a large quantity of dynamic random access memory (DRAM), whereas the LDM may include a smaller quantity of static random access memory (SRAM), which is generally faster than DRAM. In one embodiment, the SRAM may be fully registered RAM.

The MCE (0110) typically incorporates an internal data or control path (IDP) (0115) between the LDM (0114) and a matrix multiplier unit (MMU) (0116) or other hardware accelerator that is responsible for performing high speed arithmetic operations or other functions on data contained within the LDM (0114). Control of the overall MCE (0110) arithmetic accelerator is provided by matrix compute/transfer control logic (MCT) (0117) that is typically constructed using registered logic that implements one or more finite state machines (FSMs) (0118) configured to control the overall function of the system and sequentially execute operations associated with data transfers between the EDM (0130) and the LDM (0114). Note that the MCT (0117) functionality may be integrated (Integrated Matrix Control Logic MCL (0150)) within the one or more data transfer processors (DTP) (0112) that are embodied within the overall matrix compression accelerator (MCA) (0111) functionality. In this combined configuration, the one or more data transfer processors (DTP) (0112) provide overall control of data transfers between the EDM (0130) and the LDM (0114).

As indicated, the MCE (0110) and/or ACL (0120) may incorporate a tangible non-transitory computer readable medium (0119, 0129) that contains machine instructions that are executed by the internal logic of the MCE (0110) and ACL (0120) respectively.

The present disclosure may be implemented in a variety of application contexts wherein an integrated circuit (IC) system-on-a-chip (SOC) may incorporate a tightly or loosely coupled MCA that interfaces to host ACL/CPU hardware, DRAM memory storage, and a variety of peripheral interfaces.

Data Flow Overview (0200)

Figure 2:
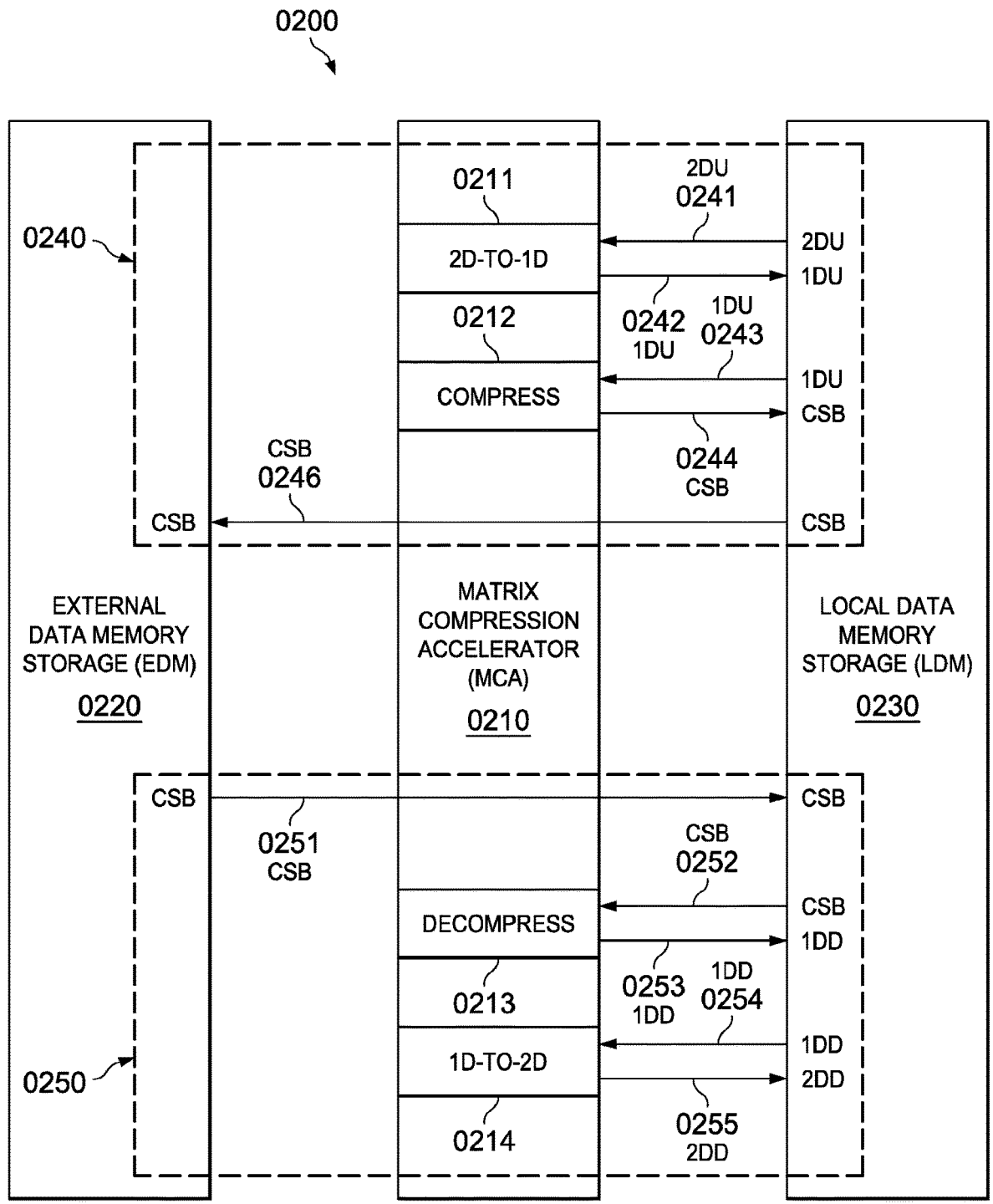
FIG. 2 illustrates a data flow diagram depicting an embodiment of compression/decompression data flow for data transferred between the LDM, the MCA, and the EDM.

A system data flow diagram is generally depicted in FIG. 2 (0200). Here it can be seen that the matrix compression accelerator (MCA) (0210) controls data transfers between the external data memory storage (EDM) (0220) and the local data memory storage (LDM) (0230) and operates to control data compression (0240) and data decompression (0250) data flows.

The MCA (0210) implements lossless data compression (LDC) transfers (0240) as follows. The MCA (0210) reads 2D uncompressed data blocks (2DU) (0241) from the LDM (0230) and performs a 2D-to-1D transformation (0211) to generate 1D uncompressed data blocks (1DU) (0242) that are written back to the LDM (0230). The 1DU data stored in the LDM (0230) is then read (0243) by the MCA (0210) from the LDM (0230) and compressed (0212) to generate a 1D compressed superblock (CSB) (0244) that is stored in the LDM (0230). This CSB (0244) stored in the LDM (0230) may then be written (0246) to the EDM (0220) with a minimal number of EDM bus write cycles.

The MCA (0210) implements lossless data decompression (LDD) transfers (0250) by reversing the lossless data compression (LDC) transfers (0240) as follows. The MCA (0210) reads 1D compressed superblock (CSB) data (0251) stored in the EDM (0220) with a minimal number of EDM bus read cycles and writes this data to the LDM (0230). The MCA (0210) then reads the CSB data (0252) from the LDM (0230) and decompresses (0213) the data to generate 1D decompressed data blocks (1DD) (0253) that are stored in the LDM (0230). The MCA (0210) then reads the 1DD (0254) data from the LDM (0230) and performs a 1D-to-2D transformation (0214) to generate 2D decompressed data blocks (2DD) (0255) that are written to the LDM (0230) as function arguments for operation by a matrix multiplier unit (MMU) or other matrix compute engine (MCE) function.

Lossless Data Compression (LDC) Overview (0300)

Figure 3:
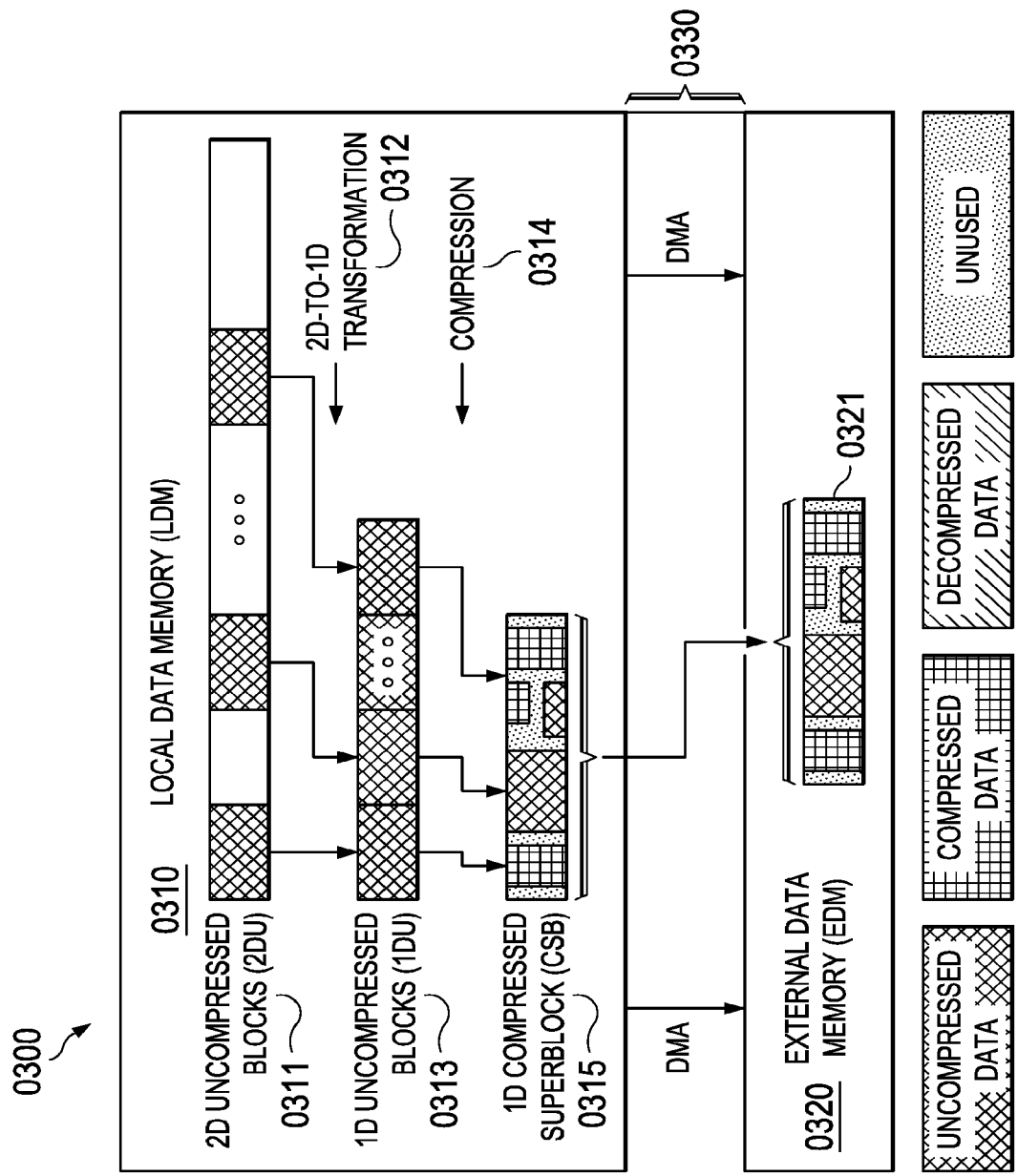
FIG. 3 illustrates a data flow diagram depicting an embodiment of compression data flow for data transferred between LDM and EDM.

An overview of a lossless data compression (LDC) technique utilized in the present disclosure is generally depicted in FIG. 3 (0300). Here it can be seen that data is transferred from local data memory (LDM) (0310) to external data memory (EDM) (0320) via a direct memory access (DMA) controller interface (0330). Within LDM (0310) blocks of 2D uncompressed data (2DU) (0311 representing feature maps of a CNN (or other portions of a matrix stored in LDM (0310)) are gathered and transformed using a 2D-to-1D transformation (0312) to form 1D uncompressed data blocks (1DU) (0313)—which can include unused OB (zero byte or 0-byte) space. This 1DU data (0313) is then compressed (0314) into fixed-size 1D compressed superblocks (CSB) (0315) that may include compressed data, uncompressed data, and/or unused space. This fixed-size CSB (0315) data is then written via the DMA interface (0330) to the EDM (0320) with a data width (0321) that minimizes the number of EDM bus cycles. The fixed-size nature of the CSB (0315) data is generally tailored to the bus width of the EDM (0320) to optimize this process.

Lossless Data Decompression (LDD) Overview (0400)

Figure 4:
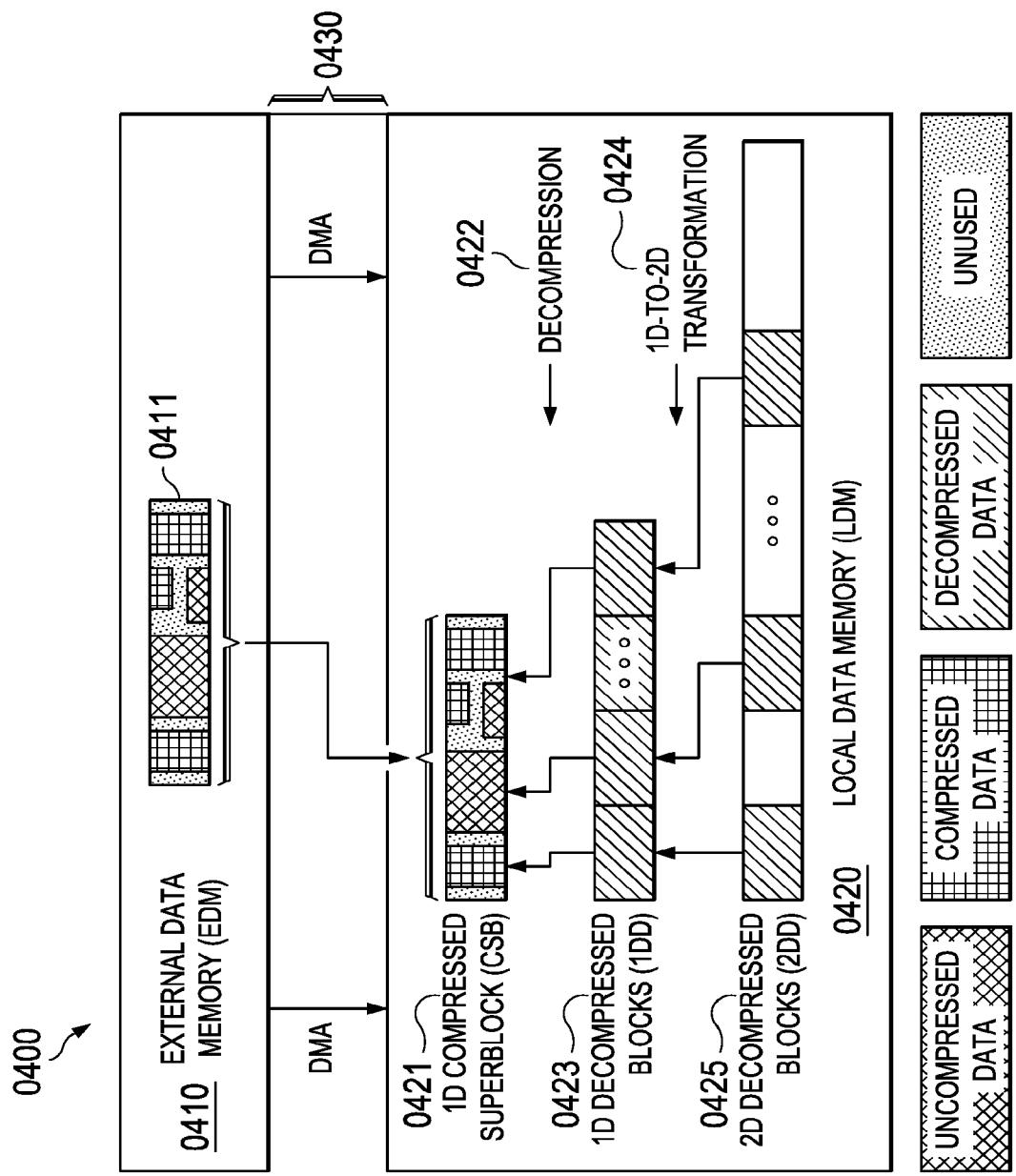
FIG. 4 illustrates a data flow diagram depicting an embodiment of decompression data flow for data transferred between EDM and LDM.

An overview of a lossless data decompression (LDD) technique utilized in the present disclosure is generally depicted in FIG. 4 (0400) and generally mimics the reversal of the LDC data flow depicted in FIG. 3 (0300).

Here it can be seen that data is transferred from external data memory (EDM) (0410) to local data memory (LDM) (0420) via a direct memory access (DMA) controller interface (0430). The process starts with identifying fixed-size 1D compressed superblocks (CSB) (0411) that are to be transferred from EDM (0410) to LDM (0420) via DMA (0430). The fixed-size CSB (0411) may include compressed data, uncompressed data, and/or unused space. The fixed-size nature of the CSB (0411) data is generally tailored to the bus width of the EDM (0410) to optimize this process.

After a CSB (0411) is transferred from EDM (0410) to LDM (0420) to create a local CSB copy (0421), the CSB (0421) is decompressed (0422) to form a 1D decompressed data block (1DD) (0423) within the LDM (0420). This 1DD (0423) is then operated on by a 1D-to-2D transformation (0424) within the LDM (0420) that generates 2D decompressed blocks (2DD) (0425) within the LDM (0420) representing feature maps of a CNN (or other portions of a matrix stored in LDM (0420)). These 2DD (0425) are properly positioned within the LDM (0420) to allow a matrix compute engine (MCE) or other matrix multiplier arithmetic unit (MMU) to operate on the data to produce the desired matrix computation product result. This matrix computation product result may then be operated on by the LDC process depicted in FIG. 3 (0300) to transfer the resulting data back to EDM (0410).

CNN Application Context—Tiling and Grouping (0500)-(0800)

Figure 5:
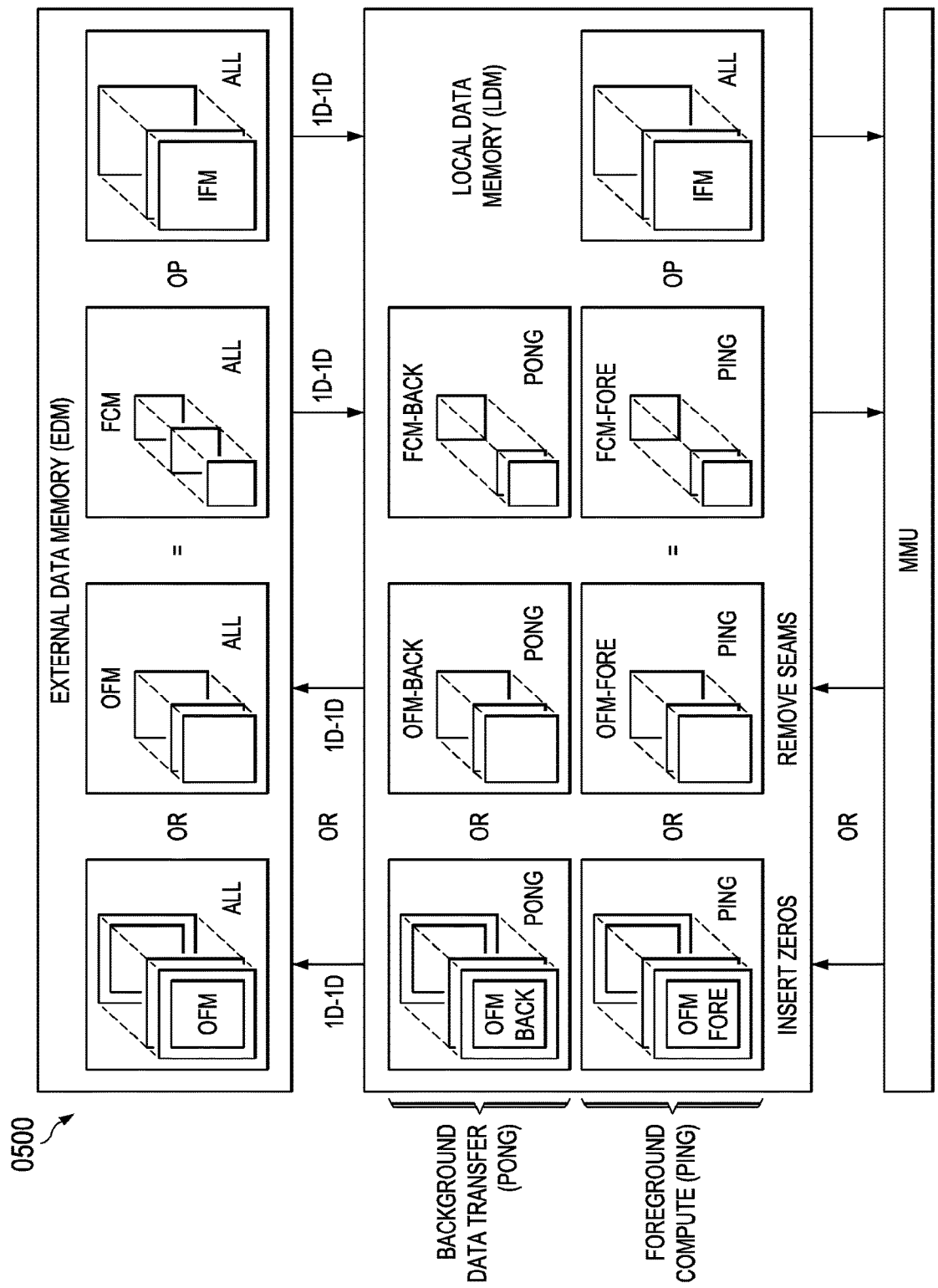
FIG. 5 illustrates a data flow diagram depicting operation of a system embodiment incorporating foreground/background computation/data movement operations.

The present disclosure will now be discussed in terms of an application context as generally depicted in FIG. 5 (0500)-FIG. 8 (0800), but is not limited to this application context. Here the application context discussed will relate to the use of a MCE to process convolutional neural networks (CNNs).

Convolutional neural networks (CNNs) are a useful technology for classification that can be used in (and are frequently the best performing method for) all sorts of applications relating to vision, speech, health/fitness, controls, and other applications. As generally depicted in FIG. 5 (0500) (and further detailed in references incorporated within this patent application), CNNs take input feature maps (IFM), apply a nonlinear transformation, and generate output feature maps (OFM). Feature maps are typically defined by rows×column×number of feature maps. The number of input and output feature maps may be different. Output feature maps for a given layer may serve as input feature maps for the next layer.

Some steps that can be taken to improve the speed of CNNs on a computing device are: (a) providing a large amount of matrix based compute capability for key layers along with (b) efficient data movement to feed data computations. Unfortunately various constraints make efficient data movement difficult because of memory alignment and transfer length restrictions for optimal efficiency as well as algorithm requirements for data availability and alignment. Furthermore, efficient data movement is difficult as feature maps are frequently very large and thus require large volumes of data transfers between slower off-chip external data memory (EDM) and faster on-chip local data memory (LDM). This inefficiency is typically associated with (a) loading of input feature maps between EDM and LDM for computation using LDM storage and (b) storing output feature maps between LDM and EDM after OFM computations are complete.

Accordingly, disclosed embodiments provide systems/methods for efficient data movement that satisfy the memory alignment, transfer length, and algorithm requirements dictated by a variety of algorithm contexts including that of processing CNN data and other algorithms that may run on the MCE. A typical example depicting the data movement concepts in a CNN context is provided in FIG. 6 (0600) wherein a Y output feature map (OFM) (0630) is computed as the product of an H filter coefficient multiplier (FCM) (0610) and an X input feature map filtering multiplicand (IFM) (0620) (an input feature map filtering matrix derived from X). In this example, if either all of the FCM (0610) or all of the IFM (0620) fit in LDM then no excess data movement is required as the FCM (0610) and IFM (0620) can be loaded and the MMU activated to produce the matrix product of FCM (0610) and IFM (0620) and store the product in the OFM (0630). As the size of the FCM (0610) or IFM (0620) exceeds the capacity of the LDM, this approach is no longer possible, as multiple data accesses to the EDM are required to process the OFM (0630) product, and this will necessarily involve non-optimal data transfers from the EMB to the LMB.

A variation of this situation is depicted in FIG. 7 (0700) wherein the IFM (0720) is larger than available LDM storage, resulting in a large OFM (0730) product that is also larger than available LDM storage. If all of the FCM (0710) fits into local memory then input feature map tiling can be used to reduce the LDM requirements of the IFM (0720). This tiling technique is useful for large input feature maps IFM (0720) datasets as this permits IFM (0720) tiles to be sequentially loaded from EDM and overlap computation cycles associated with the MMU and production of the OFM (0730) product tiles.

Another variation of this situation is depicted in FIG. 8 (0800) wherein the FCM (0810) is larger than available LDM storage, resulting in a large OFM (0830) product that is also larger than available LDM storage. If all of the IFM (0820) fits into local memory then output feature map grouping can be used to reduce the LDM requirements of the FCM (0810). This grouping technique is useful for small input feature maps IFM (0820) datasets with many channels as this permits FCM (0810) groups to be sequentially loaded from EDM and overlap computation cycles associated with the MMU and production of the OFM (0830) product groups.

References incorporated within this patent application address many of the data movement inefficiencies detailed in FIG. 6 (0600)-FIG. 8 (0800). However, a significant efficiency bottleneck still exists in that transfers between EDM and LDM are still constrained by the (typically) much slower access time associated with EDM as compared to LDM. For example, EDM may typically be slower DRAM memory and LDM may be fully registered SRAM memory. As such, any EDM access will be significantly slower than LDM accesses and dominate the overall processing speed of the MCE system. The present disclosure attempts to minimize the number of EDM data transfers by incorporating multi-stage lossless data compression/decompression between the EDM and LDM storage elements and thus improve the overall processing speed of the MCE system. This in some circumstances may be augmented using one or more DMA compression/decompression data transfer processor (DTP) hardware acceleration processors.

Application to Small Feature Maps With No Pad (0900)-(1000)

FIG. 9 (0900) details a data flow diagram depicting a disclosure of the operation implementing small feature maps with no pad insertion. In this MCA embodiment, the IFM may or may not already have a pad. In this sequence data and functions operate as follows. A 1D-to-1D decompress of all input feature maps (IFMs) from the EDM to LDM is executed so as to load all IFM data into LDM.

The output feature map (OFM) matrix product and filter coefficient matrix multiplier (FCM) are stored in foreground/background ping/pong fashion in LDM such that when OFM-fore is being filled with the computation product of FCM-fore*IFM, the prior matrix multiplication product OFM-back is being stored in EDM and the next tile of FCM data is being read from EDM and stored in FCM-back. Once the calculation OFM-fore=FCM-fore*IFM is completed, memory pointers to OFM-fore/OFM-back and FCM-fore/FCM-back are swapped in ping-pong fashion to allow the compute/data transfer operations to overlap during the next MMU machine cycle. In this manner, there is no wasted time waiting for storage or retrieval to/from the EDM memory after a MMU compute cycle is completed.

Once the MMU product is generated, the OFM product produced will have seams that need to be removed or alternatively zeros may be inserted around the boundaries of the OFM matrix data. The insertion of zeros, if necessary, eliminates any pre-processing required during the next computation cycle if the resulting data is used in a future computation. Depending on which condition occurs, the OFM data is modified/augmented as necessary before being compressed back to the EDM using a 1D-to-1D ping/pong transfer of the OFM from LDM to EDM. Note that there exists a small drawback of inserting zeros in that this increases the amount of data that needs to be moved from LDM to EDM (this layer) and EDM to LDM (next layer). However, this approach is potentially more efficient than having to do zero insertion if there is no efficient method for that within the MMU architecture or supervisory ACL/CPU.

As generally depicted in the flowchart of FIG. 10 (1000) and consistent with the above system data flow description in FIG. 9 (0900), a method, according to an embodiment, may be broadly generalized as a small feature map with no pad insertion MCA method comprising:
(1) Executing a 1D-to-1D data decompression of all input feature maps (IFM) from EDM to LDM (1001);
(2) Concurrent with steps (2)-(5), executing a 1D-to-1D data transfer of a new or next filter coefficient matrix (FCM) from EDM to LDM (1002);
(3) Concurrent with steps (2)-(5), compressing a previously calculated output feature map matrix (OFM) (OFM-back) from LDM to EDM (1003);
(4) Concurrent with steps (2)-(5), with a matrix multiplier unit (MMU), calculating the matrix product of OFM-fore=FCM-fore*IFM-fore (1004);
(5) Concurrent with steps (2)-(5), swapping foreground/background ping/pong memory pointers (1005);
(6) Determining if padding is needed on the next OFM layer, and if so, proceeding to step (8) (1006);
(7) Removing seams from the OFM and proceeding to step (9) (1007);
(8) Inserting zeros in the OFM (1008);
(9) Determining if all FCM tiles have been processed, and if not, proceeding to step (2) (1009); and
(10) Terminating the MCA method (1010).

This general method may be modified depending on a number of factors, with rearrangement and/or addition/deletion of steps being within the scope of this disclosure. Integration of this and other embodiment methods in conjunction with a variety of embodiment systems described herein is within the scope of this disclosure.

Application to Small Feature Maps With Pad (1100)-(1200)

FIG. 11 (1100) details a data flow diagram depicting an embodiment of an operation implementing small feature maps with pad insertion. In this MCA embodiment, the IFM may or may not already have a pad. In this sequence data and functions operate as follows. A 2D-to-2D decompression of all input feature maps (IFMs) from the EDM to LDM is executed so as to load all IFM data into LDM leaving space in the LDM for zero filling which is accomplished either using a direct memory access (DMA) controller and/or use of specified functions within the MMU.

The output feature map (OFM) matrix product and filter coefficient matrix multiplier (FCM) are stored in foreground/background ping/pong fashion in LDM such that when OFM-fore is being filled with the computation product of FCM-fore*IFM, the prior matrix multiplication product OFM-back is being stored in EDM and the next tile of FCM data is being read from EDM and stored in FCM-back. Once the calculation OFM-fore=FCM-fore*IFM is completed, memory pointers to OFM-fore/OFM-back and FCM-fore/FCM-back are swapped in ping-pong fashion to allow the compute/data transfer operations to overlap during the next MMU machine cycle. In this manner, there is no wasted time waiting for storage or retrieval to/from the EDM memory after a MMU compute cycle is completed.

Once the MMU product is generated, the OFM product produced will have seams that need to be removed or alternatively zeros may be inserted around the boundaries of the OFM matrix data. The insertion of zeros, if necessary, eliminates any pre-processing required during the next computation cycle if the resulting data is used in a future computation. Depending on which condition occurs, the OFM data is modified/augmented as necessary before being written back to the EDM using a 1D-to-1D ping/pong transfer of the OFM from LDM to EDM. Note that there exists a small drawback of inserting zeros in that this increases the amount of data that needs to be moved from LDM to EDM (this layer) and EDM to LDM (next layer). However, this approach is potentially more efficient than having to do zero insertion if there is no efficient method for that within the MMU architecture or supervisory ACL/CPU. Note also that in some circumstances the 2D-2D transfer of the IFM from EDM to LDM may be inefficient due to boundary crossings in the EDM during read accesses.

As generally depicted in the flowchart of FIG. 12 (1200) and consistent with the above system data flow description in FIG. 11 (1100), a method, according to an embodiment, may be broadly generalized as a second small feature map with pad insertion MCA method comprising:
(1) Executing a 2D-to-2D data decompression of all input feature maps (IFM) from EDM to LDM leaving space in the LDM for zero filling that is accomplished using a DMA controller or MMU function (1201);
(2) Execute a peripheral zero-fill operation on IFM LDM data (1202);
(3) Concurrent with steps (3)-(6), executing a 1D-to-1D data transfer of a new or next filter coefficient matrix (FCM) from EDM to LDM (1203);
(4) Concurrent with steps (3)-(6), compressing a previously calculated output feature map matrix (OFM) (OFM-back) from LDM to EDM (1204);
(5) Concurrent with steps (3)-(6), with a matrix multiplier unit (MMU), calculating the matrix product of OFM-for=FCM-fore*IFM-fore (1205);
(6) Concurrent with steps (3)-(6), swapping foreground/background ping/pong memory pointers (1206);
(7) Determining if padding is needed on the next OFM layer, and if so, proceeding to step (9) (1207);
(8) Removing seams from the OFM and proceeding to step (10) (1208);
(9) Inserting zeros in the OFM (1209);
(10) Determining if all FCM tiles have been processed, and if not, proceeding to step (3) (1210); and
(11) Terminating the MCA method (1211).

This general method may be modified depending on a number of factors, with rearrangement and/or addition/deletion of steps being within the scope of this disclosure. Integration of this and other embodiment methods in conjunction with a variety of embodiment systems described herein within the scope of this disclosure.

Application to Large Feature Maps (1300)-(1600)

FIG. 13 (1300)-FIG. 16 (1600) depict additional implementation details regarding general large feature map (LFM) data transfers with no pad insertion implemented using the MCA. These operational flowcharts may be implemented within the matrix compute/transfer control (MCT) logic (0117) as generally depicted in FIG. 1 (0100) using traditional hardware finite state machine (FSM) logic as is well known to those skilled in the electrical arts.

IFM Data Movement With No Pad Insertion (1300)-(1400)

FIG. 13 (1300)-FIG. 14 (1400) depict a typical method associated with optimized input feature map (IFM) data movement with no pad insertion corresponding to the data movement diagrams depicted in FIG. 17 (1700)-FIG. 21 (2100). This MCA method generally includes the following operations that may be implemented via hardware logic or via method steps in appropriately configured FSM logic hardware:
(1) Initializing a column tile processing counter (C=0) (1301);
(2) Decompressing a column tile of LFM[*,C] from EDM to LDM (1302);
(3) Concurrent with operation step (4), Processing data in the first column tile of LFM[*,C] stored in LDM (1303);
(4) Concurrent with operation step (3), Decompressing a column tile of LFM[*,C+1] from EDM to LDM (1304);
(5) Incrementing the column tile counter (C=C+1) (1405);
(6) Concurrent with operation step (7), processing data in adjacent column tiles of LFM stored in LDM (LDM[*,C−1] and LDM[*,C]) (1406);
(7) Concurrent with operation step (6), decompressing a column tile of LFM[*,C+1] from EDM to LDM (1407);
(8) Processing data in adjacent column tiles of LFM stored in LDM (LDM[*,C−1] and LDM[*,C]) (1408);
(9) Determining if all column tile processing is complete, and if not, proceeding to step (5) (1409); and
(10) Terminating the MCA-controlled matrix data transfer (1410).

This general method may be modified depending on a number of factors, with rearrangement and/or addition/deletion of steps being within the scope of this disclosure. Integration of this and other embodiment methods in conjunction with a variety of embodiment systems described herein within the scope of this disclosure.

OFM Data Movement With No Pad Insertion (1500)-(1600)

FIG. 15 (1500)-FIG. 16 (1600) depict a typical method associated with optimized output feature map (OFM) data movement with no pad insertion corresponding to the data movement diagrams depicted in FIG. 22 (2200)-FIG. 24 (2400). This MCA method generally includes the following operations that may be implemented via hardware logic or via method steps in appropriately configured FSM logic hardware:
(1) Initializing a column tile processing counter (C=0) (1501);
(2) Processing Lpad and partial data in the first half of the first column tile of LFM[*,C] stored in LDM (1502);
(3) Processing data in the second half of the first column tile of LFM[*,C] stored in LDM (1503);
(4) Incrementing the column tile counter (C=C+1) (1604);
(5) Concurrent with operation step (6), processing data in the first half of a column tile of LFM[*,C] stored in LDM (1605);
(6) Concurrent with operation step (5), compressing column tile of LFM[*,C] from LDM to EDM (1606);
(7) Processing data in the second half of a column tile of LFM[*,C] stored in LDM (1607);
(8) Determining if all LFM tile data in the LDM has been processed (including the partial tile data adjacent to Lpad), and if not, proceeding to step (10) (1608);
(9) Compressing the last column tile of LFM[*,C] from LDM to EDM (1609);
(10) Determining if all column tile processing is complete, and if not, proceeding to step (4) (1610); and
(11) Terminating the MCA-controlled matrix data transfer (1611).

This general method may be modified depending on a number of factors, with rearrangement and/or addition/deletion of steps being within the scope of this disclosure. Integration of this and other embodiment methods in conjunction with a variety of embodiment systems described herein within the scope of this disclosure.

Large Feature Map Data Flow (1700)-(2400)

A matrix compression accelerator (MCA) data movement pattern for large feature map tiles with no pad insertion and partial storage in local memory using 128B alignment for efficient EDM to LDM data movement is generally depicted in FIG. 17 (1700)-FIG. 24 (2400). FIG. 17 (1700)-FIG. 21 (2100) depict an input feature map data movement example utilizing decompression output data and FIG. 22 (2200)-FIG. 24 (2400) depict an output feature map data movement example utilizing compression input data. This matrix transfer architecture provides for a reduced EDM transfer count that increases the overlap of compute/data transfer functions in the MCE. Note that the depicted data transfer maps target 128-byte data transfers between EDM and LDM but may be applied to any size of data transfer or EDM/LDM data bus widths.

Lossless Data Compression (LDC) Method (2500)-(3200)

While the present disclosure may incorporate a number of lossless data compression (LDC) implementations, one embodiment of an LDC method is detailed in the flowcharts depicted in FIG. 25 (2500)-FIG. 32 (3200). An overview of this LDC method is generally depicted in FIG. 25 (2500) and incorporates the following major steps:
(1) Perform a 2D-to-1D transformation of uncompressed data blocks (2DU) to generate 1D uncompressed blocks (1DU) (2501); and
(2) Compress the 1D uncompressed data blocks (1DU) to generate 1D compressed superblocks (CSB) (2502).

This LDC method is implemented using a bifurcated compression data stream comprising compressed superblocks (CSB) and a compression mode vector (CMV). The CSB is generally configured to have a fixed width that is compatible with the EDM bus width and the CMV is configured as a bit stream that identifies the compression type/method used for various subfields of the CSB. The CMV is generally stored within LDM and not written to the EDM and thus it is possible for the CSB written to the EDM to have a guaranteed upper bound on length equal to that of the original 2D uncompressed data stream originally retrieved from LDM and written to the EDM in compressed form.

Details of this two-step LDC methodology are provided in FIG. 26 (2600)-FIG. 32 (3200) and include the following process steps that may be implemented using appropriate finite state machines (FSMs) controlling appropriately designed hardware logic:
(1) Define LDC processing parameters (count0, count1, sAddr, dAddr, sDim1, dDim1) (2601);
(2) Initialize transfer loop block counter (s1=0) (2702);
(3) Save current source address pointer (sAddr1=sAddr) (2703);
(4) Save current destination address pointer (dAddr1=dAddr) (2704);
(5) Initialize transfer loop byte counter (s0=0) (2705);
(6) Transfer source data buffer to destination data buffer (*dAddr=*sAddr) (2806);
(7) Update source address pointer (sAddr=sAddr+1) (2807);

(8) Update destination address pointer (dAddr=dAddr+1) (2808);
(9) Update transfer loop byte counter (s0=s0+1) (2809);
(10) Determining if all data bytes in block transferred (s0==count0), and if not, proceeding to step (6) (2810);
(11) Update source address to next block address (sAddr=sAddr1+sDim1) (2911);
(12) Update destination address to next block address (dAddr=dAddr1+dDim1) (2912);
(13) Update transfer loop block counter (s1=s1+1) (2913);
(14) Determine if all data blocks have been transferred (s1==count1), and if not, proceeding to step (3) (2914);
(15) Initialize 1D compressed superblock (CSB) (CSB=[ ]) (3015);
(16) Initialize transfer loop block counter (s1=0) (3016);
(17) Let uncompressed block s1 be the s1-th block of 128B from the 1D uncompressed block (3017);
(18) Count the number of OB in uncompressed block s1 (if the number of OB is >⅛th of 128B (i.e., 16) then it is OK to compress uncompressed block s1, otherwise do not compress (this guarantees that the output size is never larger than the input size and is useful for allocating memory ahead of time)) (it is also possible to generalize this step and look for the values that occur the most and use that as a tag value indicator) (3018);
(19) Determine if the number of OB is >⅛th of 128B, and if so, proceeding to step (22) (3019);
(20) Data Compression Disabled—set compressed block s1=uncompressed block s1 (3120);
(21) Locally save the compression method used for compressed block s1 (none) and proceed to step (26) (3121);
(22) Data Compression is Enabled—create a 128b tag that will be located at the beginning of compressed block s1 where each bit corresponds to a byte in the original uncompressed block s1 (3122);
(23) Set the tag bit to 1 for a non-0-byte and 0 for a 0-byte (3123);
(24) After the 128b tag append only the non-0-bytes of uncompressed block s1 to form compressed block s1 (3124);
(25) Locally save the compression method used for compressed block s1 (0-tag) (it is also possible to interleave groups of 1b indicators with the non-0-bytes in other patterns (vs. all at start)) (3125);
(26) Append compressed block s1 to the 1D compressed superblock (3226);
(27) Update transfer loop block counter (s1=s1+1) (3227);
(28) Determine if all data blocks have been transferred (s1==count1), and if not, proceeding to step (17) (3228);
(29) Append 0s to the 1D compressed superblock to make the 1D compressed superblock length a multiple of 128B (it is also possible to just leave these bytes as dummy data) (3229);
(30) Locally save the length of the 1D compressed superblock in 128B multiples to go along with the previously saved compression method used for each of the compressed blocks that compose the 1D compressed superblock (3230); and
(31) Terminating the MCA LDC method (3231).

This general method may be modified depending on a number of factors, with rearrangement and/or addition/deletion of steps being within the scope of this disclosure. Integration of this and other embodiment methods in conjunction with a variety of embodiment systems described herein within the scope of this disclosure.

Lossless Data Decompression (LDD) Method
(3300)-(4000)

While the present disclosure may incorporate a number of lossless data decompression (LDD) implementations, one embodiment of an LDD method is detailed in the flowcharts depicted in FIG. 33 (3300)-FIG. 40 (4000). An overview of this LDD method is generally depicted in FIG. 33 (3300) and incorporates the following major steps:
(1) Decompress 1D compressed superblocks (CSB) to generate 1D decompressed data blocks (1DD) (3301); and
(2) Perform a 1D-to-2D transformation of decompressed data blocks (1DD) to generate 2D decompressed blocks (2DD) (3302).

This LDD method is implemented using a bifurcated decompression data stream comprising compressed superblocks (CSB) and a compression mode vector (CMV). The CSB is generally configured to have a fixed width that is compatible with the EDM bus width and the CMV is configured as a bit stream that identifies the compression type/method used for various subfields of the CSB. The CMV is generally stored within LDM and not read from the EDM and thus it is possible for the CSB read from the EDM to have a guaranteed upper bound on length equal to that of the original 2D uncompressed data stream originally retrieved from LDM and written in compressed form to the EDM.

Details of this two-step LDD methodology are provided in FIG. 34 (3400)-FIG. 40 (4000) and include the following process steps that may be implemented using appropriate finite state machines (FSMs) controlling appropriately designed hardware logic:
(1) Define LDD processing parameters (count0, count1, sAddr, dAddr, sDim1, dDim1) (3401);
(2) Initialize the 1D decompressed blocks (1DD=[ ]) (3502);
(3) Initialize transfer loop block counter (s1=0) (3503);
(4) Let compressed block s1 be the s1-th compressed block from the 1D compressed superblock (3504);
(5) Determine if compression is enabled for compressed block s1, and if so, proceeding to step (7) (3605);
(6) Decompression is Disabled—form decompressed block s1 from copying 128B from compressed block s1 and proceed to step (10) (3606);
(7) Decompression is Enabled—read the 128b tag and count the number of is as the number of nonzero data bytes (3607);
(8) Read the number of nonzero bytes (3608);
(9) Form decompressed block s1 by inserting a zero in byte positions corresponding to 0s in the 128b tag and nonzero bytes in byte positions corresponding to 1s in the 128b tag (3609);
(10) Append decompressed block s1 to the 1D decompressed blocks (3710);
(11) Update transfer loop block counter (s1=s1+1) (3711);
(12) Determine if all CSB blocks decompressed (s1==count1), and if not, proceeding to step (4) (3712);
(13) Initialize transfer loop block counter (s1=0) (3813);
(14) Save current source address pointer (sAddr1=sAddr) (3814);
(15) Save current destination address pointer (dAddr1=dAddr) (3815);
(16) Initialize transfer loop byte counter (s0=0) (3816);
(17) Transfer source data buffer to destination data buffer (*dAddr=*sAddr) (3917);

(18) Update source address pointer (sAddr=sAddr+1) (3918);
(19) Update destination address pointer (dAddr=dAddr+1) (3919);
(20) Update transfer loop byte counter (s0=s0+1) (3920);
(21) Determine if all data bytes in block transferred (s0==count0), and if not, proceeding to step (17) (3921);
(22) Update source address to next block address (sAddr=sAddr1+sDim1) (4022);
(23) Update destination address to next block address (dAddr=dAddr1+dDim1) (4023);
(24) Update transfer loop block counter (s1=s1+1) (4024);
(25) Determine if all data blocks transferred (s1==count1), and if not, proceeding to step (14) (4025); and
(26) Terminating the MCA LDD method (4026).

This general method may be modified depending on a number of factors, with rearrangement and/or addition/deletion of steps being within the scope of this disclosure. Integration of this and other embodiment methods in conjunction with a variety of embodiment systems described herein within the scope of this disclosure.

Zero Tag Compression

In accordance with some embodiments, zero tag compression may be utilized when implementing LDC/LDD methodologies. Zero tag compression relies on the observation that CNN feature maps typically contain a significant number of zeros due to the common practice of applying ReLU nonlinearities at the end of CNN style 2D convolution. ReLU refers to one of several commonly used methods to limit the output values of a matrix computation to an acceptable limit. Typically, two range limiting methodologies are commonly used, SAT (saturation limiting) and ReLU. ReLU is generally implemented as a special case of saturation (SAT) that changes the lower limit from the smallest representable number to zero. In both ReLU and SAT modes, numbers too large to represent in the destination format are converted to the maximum representable number in the data destination format.

This non-uniform distribution of feature map data values can be exploited to compress feature maps with a simple tagging scheme. When working with fixed point data, 0s for 16b data appears as two consecutive 0s of 8b data and 0s for 32b data appears as four consecutive 0s of 8b data. As such, at a small sacrifice of optimality (specifically 1b per 16b 0 and 3b per 32b 0) it is possible to treat all data precisions as 8b data such that the compression algorithm can always work on 8b data (and does not need to switch modes).

Selection of the optimal 1D compressed superblock (CSB) size may be computed as follows. If (ceil((number of bytes in the 1D compressed superblock)/128))<(number of 1D uncompressed blocks) then compression is beneficial. The 1D compressed superblock size is never larger than the size of the 1D uncompressed blocks as the compression information (compression method per original 1D uncompressed block and final 1D compressed superblock length) is separately locally stored. This simplifies LDM allocation as an upper bound is always known. This also simplifies EDM to LDM movement of the compressed data via a DMA as the transfer length can be specified at the start.

Note that the 1D uncompressed blocks and 1D compressed superblock can use the same local memory buffer. Alternatively, a local data buffer is not needed for a complete 1D uncompressed blocks if compression can internally aggregate 128B blocks of compressed data and write those to their destination. Additionally, the 1D compressed superblock and 1D decompressed blocks can use the same local memory buffer. Alternatively, a local data buffer is not necessarily needed for a complete 1D decompressed blocks if decompression can write 128B decompressed blocks on the fly during decompression to their destination.

LDC/LDD Implementation Options

Various embodiments in accordance with this disclosure include additional compression/decompression methods that may be introduced into this framework and optimized for other data types within the CNN. Additional compression/decompression methods may also work in conjunction with 0-tag compression for this data type. Zero padding or padding with a specific fill value may be added to the 1D-to-2D transformation during decompression and may be useful for padding small feature maps during transfers between EDM and LDM. Further, LDC/LDD functionality may be integrated within hardware DMA controllers to achieve high performance operation and increased overlap of compute/data transfer operations in the context of MCE operation.

Compression Framework Summary

A compression framework and method with block alignment and lengths for efficient data movement has been disclosed. Within this compression framework 2D-to-1D transformation of uncompressed blocks before compression is performed to satisfy algorithm requirements for computation. A 0-tag method for compression with local memory storage of compression parameters and individual block compression and no compression decisions is implemented. This ensures the 1D compressed superblock size is not larger than the 1D uncompressed blocks size and allows compression to be agnostic to the fixed point precision. This also allows the subsequent DMA in the decompression direction from EDM to LDM to know the read size ahead of time. 1D uncompressed block memory can be reused for the 1D compressed superblock memory to reduce local memory requirements. The DMA can be integrated with compression to eliminate the local memory requirements. This compression framework may be extended to other data types and compression methods.

Decompression Framework Summary

A decompression framework and method with block alignment and lengths for efficient data movement has been disclosed. The DMA can be integrated with the decompression to eliminate the local memory requirements. The DMA in the compression direction from EDM to LDM conveniently knows the read size ahead of time. A 0-tag method for decompression using local memory storage of compression parameters and individual block compression with no compression decisions is implemented and ensures the 1D compressed superblock size is not larger than the size of the 1D decompressed blocks. This allows decompression to be agnostic to the fixed point precision. 1D decompressed block memory can be reused for the 1D compressed superblock memory to reduce LDM requirements. After decompression, a 1D-to-2D transformation of the decompressed blocks may be performed. This decompression framework may be extended to other data types and decompression methods.

Compression/Decompression in Conjunction with DMA

The present disclosure is anticipated in some application contexts to include an integrated compression/decompression direct memory access (DMA) controller (CDC) that transfers data between the EDM and the LDM while automatically performing the compression/decompression functions. In many embodiments, the compression/decompression method detailed herein were designed to work efficiently with DMAs using the 128B boundary constraints and block size multiples.

In one embodiment, using compression/decompression in conjunction with a DMA includes separating compression/decompression and DMA operations that include:
- 2D to 1D LDM compression;
- 1D to 1D DMA from LDM to EDM;
- 1D to 1D DMA from EDM to LDM; and
- 1D to 2D LDM decompression;

Another embodiment for using integrated compression/decompression and DMA operations include:
- 2D to 1D local memory compression and 1D DMA from LDM to EDM
- 1D to 1D DMA from EDM to LDM and 1D to 2D LDM decompression With respect to the second option of integrated compression/decompression and DMA implementation, on the compression side, the 1D uncompressed blocks and 1D compressed superblock memory is not needed if the compression and DMA operation uses a small amount of LDM to buffer before writing to EDM. On the decompression side, the 1D compressed superblock and 1D decompressed blocks memory is not needed if the DMA and decompression operation uses a small amount of LDM to buffer before writing to LDM.

Compression/Decompression DMA (CDC) (4100)-(4800)

Overview

The present disclosure anticipates that in many of the disclosed embodiments an automated compression/decompression direct memory access (DMA) controller (CDC) may be implemented to allow rapid compression/decompression of data between the LDM to the EDM. The CDC operates such that data may be transferred from a source LDM address to a target EDM address such that the data is compressed during the transfer operation and conversely allows data to be transferred from a source EDM address to a target LDM address such that the data is decompressed during the transfer operation. Within each of these operations, a compression mode vector (CMV) stored in LDM determines the type (if any) of compression assigned to individual data blocks within compressed superblocks (CSB) which constitute the compressed LDM data stored in the EDM.

The CDC is typically implemented using a finite state machine (FSM) controlling hardware logic suitably configured to perform data transfers from LDM-to-LDM, from LDM-to-EDM, and from EDM-to-LDM. One skilled in the art will recognize that the function parameters depicted in FIG. 26 (2600) and FIG. 34 (3400) can serve as the a first embodiment for hardware registers used by the FSM to implement the data compression/decompression functions of the CDC when used in conjunction with the operations described in FIG. 25 (2500)-FIG. 40 (4000).

Dispersed Compression DMA System (4100)

A dispersed compression DMA system block diagram of such a CDC is generally depicted in FIG. 41 (4100) in accordance with one embodiment, wherein the compression/decompression DMA controller (CDC) (4110) interfaces LDM storage (4120) to EDM storage (4130) via data transfer interface logic under control of the CDC (4110). Here it can be seen that a source LDM tile (4121) is transferred from the LDM storage (4120) source address (4111) and placed in the EDM storage (4130) destination address (4113) as a compressed superblock (CSB) (4131). Information defining the modes of compression within the CSB (4131) is stored in the LDM (4120) as the compression mode vector (CMV) (4123).

The source LDM tile (4121) is described in terms of source/destination transfer parameters generally depicted in FIG. 26 (2600). Source LDM (4120) 2DU data (4121) is read by the CDC (4110) and converted to 1DU data (4122) stored in the LDM (4120). This 1DU data (4122) is then read from the LDM (4120) by the CDC (4110) and compressed to produce a compression mode vector (CMV) (4123) and compressed superblock (CSB) (4124) both stored in the LDM (4120). The CSB (4124) is then transferred to EDM (4130) using automated DMA transfers. Finite state machine (FSM) hardware control logic within the CDC (4110) controls the operation of the data transfers and operations described above.

Dispersed Compression DMA Method (4200)

A corresponding dispersed compression DMA method associated with the system description provided in FIG. 41 (4100) is generally depicted in the flowchart of FIG. 42 (4200) and includes the following steps:
(1) Perform 2D-to-1D translation of 2D uncompressed data (2DU) contained in LDM to generate 1D uncompressed data (1DU) (4201);
(2) Writing the 1DU data to LDM (4202);
(3) Compress 1DU data contained in the LDM to generate a compressed superblock (CSB) (4203);
(4) Writing the CSB to the LDM (4204);
(5) Generate a compression mode vector (CMV) identifying CSB data field compression types (4205);
(6) Write the CSV to the LDM (4206);
(7) Transferring the CSB to EDM (4207); and
(8) Terminating the DMA transfer (4208).

This general method may be modified depending on a number of factors, with rearrangement and/or addition/deletion of steps being within the scope of this disclosure. Integration of this and other embodiment methods in conjunction with a variety of embodiment systems described herein within the scope of this disclosure.

Integrated Compression DMA System (4300)

An integrated compression DMA system block diagram of such a CDC is generally depicted in FIG. 43 (4300) in accordance with one embodiment, wherein the compression/decompression DMA controller (CDC) (4310) interfaces LDM storage (4320) to EDM storage (4330) via data transfer interface logic under control of the CDC (4310). Here it can be seen that a source LDM tile (4321) is transferred from the LDM storage (4320) source address (4311) and placed in the EDM storage (4330) destination address (4313) as a compressed superblock (CSB) (4331). Information defining the modes of compression within the CSB (4331) is stored in the LDM (4320) as the compression mode vector (CMV) (4323).

The source LDM tile (4321) is described in terms of source/destination transfer parameters generally depicted in FIG. 26 (2600). Source LDM (4320) 2DU data (4321) is read by the CDC (4310) and directly converted to 1DU compressed data (4322) as a compression mode vector (CMV) (4323) and compressed superblock (CSB) (4324) both stored in the LDM (4320). The CSB (4324) is then transferred to EDM (4330) using automated DMA transfers. Finite state machine (FSM) hardware control logic within the CDC (4310) controls the operation of the data transfers and operations described above.

Integrated Compression DMA Method (4400)

A corresponding integrated compression DMA method associated with the system description provided in FIG. 43 (4300) is generally depicted in the flowchart of FIG. 44 (4400) and includes the following steps:
 (1) Reading 2DU data from the LDM (4401);
 (2) Performing 2D-to-1D translation and directly compress 1DU data to CMV/CSB in LDM (4402);
 (3) Transferring the CSB to EDM via DMA transfer (4403); and
 (4) Terminating the DMA transfer (4404).

This general method may be modified depending on a number of factors, with rearrangement and/or addition/deletion of steps being within the scope of this disclosure. Integration of this and other embodiment methods in conjunction with a variety of embodiment systems described herein within the scope of this disclosure.

Dispersed Decompression DMA System (4500)

A dispersed decompression DMA system block diagram of such a CDC is generally depicted in FIG. 45 (4500) in accordance with one embodiment, wherein the compression/decompression DMA controller (CDC) (4510) interfaces LDM storage (4520) to EDM storage (4530) via data transfer interface logic under control of the CDC (4510). Here it can be seen that a source EDM CSB (4531) is transferred from the EDM storage (4530) source address (4513) and placed in the LDM storage (4520) as a compressed superblock (CSB) (4524) for decompression to a destination address (4511). Information defining the modes of compression within the EDM (4530) CSB (4531) is previously stored in the LDM (4520) as the compression mode vector (CMV) (4523).

The source EDM CSB (4531) is described in terms of source/destination transfer parameters generally depicted in FIG. 34 (3400). The CSB (4531) is first transferred from EDM (4530) to the LDM (4520) using automated DMA transfers. CSB data (4524) is read from the LDM (4520) and interpreted for decompression by the content of the CMV (4523) read from the LDM (4520) by the CDC (4510). This decompression operation results in 1DD decompressed data (4522) that is written to the LDM (4520). The 1DD (4522) is then read by the LDM (4520) and translated using a 1D-to-2D translation to form 2DD data that is written back to the LDM (4520) for later processing by the MCE. Finite state machine (FSM) hardware control logic within the CDC (4510) controls the operation of the data transfers and operations described above.

Dispersed Decompression DMA Method (4600)

A corresponding dispersed decompression DMA method associated with the system description provided in FIG. 45 (4500) is generally depicted in the flowchart of FIG. 46 (4600) and includes the following steps:
 (1) Transferring the compressed superblock (CSB) from the EDM to the LDM via DMA transfer (4601);
 (2) Reading the compression mode vector (CMV) from the LDM (4602);
 (3) Decompressing CSB data in the LDB using the CMV to create 1D decompressed data (1DD) (4603);
 (4) Storing the 1DD data in the LDM (4604);
 (5) Reading the 1DD data from the LDM (4605);
 (6) Performing a 1D-to-2D translation on the 1DD data to generate 2D decompressed data (2DD) (4606);
 (7) Write the resulting 2DD data to the LDM (4607); and
 (8) Terminating the DMA transfer (4606).

This general method may be modified depending on a number of factors, with rearrangement and/or addition/deletion of steps being within the scope of this disclosure. Integration of this and other embodiment methods in conjunction with a variety of embodiment systems described herein within the scope of this disclosure.

Integrated Decompression DMA System (4700)

An integrated decompression DMA system block diagram of such a CDC is generally depicted in FIG. 47 (4700) in accordance with one embodiment, wherein the compression/decompression DMA controller (CDC) (4710) interfaces LDM storage (4720) to EDM storage (4730) via data transfer interface logic under control of the CDC (4710). Here it can be seen that a source EDM CSB (4731) is transferred from the EDM storage (4730) source address (4713) and placed in the LDM storage (4720) as a compressed superblock (CSB) (4724) for decompression to a destination address (4711). Information defining the modes of compression within the EDM (4730) CSB (4731) is previously stored in the LDM (4720) as the compression mode vector (CMV) (4723).

The source EDM CSB (4731) is described in terms of source/destination transfer parameters generally depicted in FIG. 34 (3400). The CSB (4731) is first transferred from EDM (4730) to the LDM (4720) using automated DMA transfers. CSB data (4724) is read from the LDM (4720) and interpreted for decompression by the content of the CMV (4723) read from the LDM (4720) by the CDC (4710). This decompression operation results in 1DD decompressed data (4722) that is directly translated using a 1D-to-2D translation to form 2DD data that is written back to the LDM (4720) for later processing by the MCE. Finite state machine (FSM) hardware control logic within the CDC (4710) controls the operation of the data transfers and operations described above.

Integrated Compression DMA Method (4800)

A corresponding integrated decompression DMA method associated with the system description provided in FIG. 47 (4700) is generally depicted in the flowchart of FIG. 48 (4800) and includes the following steps:
 (1) Transferring the CSB from the EDM to the LDM via DMA transfer (4801);
 (2) Decompressing CSB data in the LDB to create 1DD decompressed data by interpreting the contents of the CSB using the previously stored CMV data stored in the LDM (4802);
 (3) Performing 1D-to-2D translation directly on the 1DD data and writing the resulting 2DD data to the LDM (4803); and
 (4) Terminating the DMA transfer (4804).

This general method may be modified depending on a number of factors, with rearrangement and/or addition/deletion of steps being within the scope of this disclosure. Integration of this and other embodiment methods in conjunction with a variety of embodiment systems described herein within the scope of this disclosure.

Compression System Summary

Certain disclosed embodiments may be broadly generalized as a matrix compression accelerator system including:
- (a) external data memory (EDM);
- (b) local data memory (LDM); and
- (c) data transfer processor (DTP);

wherein:
the DTP is configured to transfer data between the LDM and the EDM by sequentially executing the following operations:
- (1) executing a 2D-to-1D transformation on 2D uncompressed data (2DU) contained in the LDM to generate 1D uncompressed data blocks (1DU) (4201);
- (2) storing the 1DU in the LDM (4202);
- (3) compressing the 1DU to generate a compressed superblock (CSB) comprising one or more compressed and uncompressed data fields (CUF) that is derived from the 1DU (4203);
- (4) storing the CSB in the LDM (4204);
- (5) generating a compression mode vector (CMV) containing information on the type of compression used for each of the CUF (4205);
- (6) storing the CMV in the LDM (4206); and
- (7) transferring the CSB to the EDM (4207).

This general system summary may be augmented by the various elements described herein to produce a wide variety of embodiments consistent with this overall disclosure.

Compression Method Summary

Certain disclosed embodiments may be broadly generalized as a matrix compression accelerator method operating on a matrix compression accelerator system that includes:
- (a) external data memory (EDM);
- (b) local data memory (LDM); and
- (c) data transfer processor (DTP);

wherein:
the method is executed on the DTP and includes the steps of:
- (1) executing a 2D-to-1D transformation on 2D uncompressed data (2DU) contained in the LDM to generate 1D uncompressed data blocks (1DU) (4201);
- (2) storing the 1DU in the LDM (4202);
- (3) compressing the 1DU to generate a compressed superblock (CSB) comprising one or more compressed and uncompressed data fields (CUF) that is derived from the 1DU (4203);
- (4) storing the CSB in the LDM (4204);
- (5) generating a compression mode vector (CMV) containing information on the type of compression used for each of the CUF (4205);
- (6) storing the CMV in the LDM (4206); and
- (7) transferring the CSB to the EDM (4207).

This general system summary may be augmented by the various elements described herein to produce a wide variety of embodiments consistent with this overall disclosure.

Decompression System Summary

Certain disclosed embodiments may be broadly generalized as a matrix decompression accelerator system that includes:
- (a) external data memory (EDM);
- (b) local data memory (LDM); and
- (c) data transfer processor (DTP);

wherein:
the DTP is configured to transfer data between the EDM and the LDM by sequentially executing the following operations:
- (1) transferring a compressed superblock (CSB) comprising one or more compressed and uncompressed data fields (CUF) from the EDM to the LDM (4601);
- (2) reading the contents of a compression mode vector (CMV) stored in the LDM that contains information on the type of compression used for each of the CUF within the CSB (4602);
- (3) decompressing the CSB stored in the LDM to generate 1D decompressed data blocks (1DD) based on the contents of the CMV (4603);
- (4) storing the 1DD in the LDM (4604);
- (5) reading the 1DD from the LDM (4605);
- (6) executing a 1D-to-2D transformation on the 1DD contained in the LDM to generate 2D decompressed data blocks (2DD) (4606); and
- (7) storing the 2DD in the LDM (4607).

This general system summary may be augmented by the various elements described herein to produce a wide variety of embodiments consistent with this overall disclosure.

Decompression Method Summary

Certain disclosed embodiments may be broadly generalized as a matrix decompression accelerator method operating on a matrix decompression accelerator system that includes:
- (a) external data memory (EDM);
- (b) local data memory (LDM); and
- (c) data transfer processor (DTP);

wherein:
the method is executed on the DTP and includes the steps of:
- (1) transferring a compressed superblock (CSB) comprising one or more compressed and uncompressed data fields (CUF) from the EDM to the LDM (4601);
- (2) reading the contents of a compression mode vector (CMV) stored in the LDM that contains information on the type of compression used for each of the CUF within the CSB (4602);
- (3) decompressing the CSB stored in the LDM to generate 1D decompressed data blocks (1DD) based on the contents of the CMV (4603);
- (4) storing the 1DD in the LDM (4604);
- (5) reading the 1DD from the LDM (4605);
- (6) executing a 1D-to-2D transformation on the 1DD contained in the LDM to generate 2D decompressed data blocks (2DD) (4606); and
- (7) storing the 2DD in the LDM (4607).

This general system summary may be augmented by the various elements described herein to produce a wide variety of embodiments consistent with this overall disclosure.

System/Method Variations

The various embodiments described herein do not represent the entire scope of possible usages, but are provided merely by way of example.

System and method embodiments may include but are not limited to:
- An embodiment wherein the CSB has a fixed bit width equivalent to an integer multiple of a data bus width of the EDM.
- An embodiment wherein the EDM has a data bus width of 128 bytes.

An embodiment wherein the CSB is transferred between the LDM and the EDM via a dispersed direct memory access (DMA) data transfer.

An embodiment wherein the CSB is transferred between the LDM and the EDM via an integrated direct memory access (DMA) data transfer.

An embodiment wherein the CSB includes data fields incorporating 0-tag compression.

An embodiment wherein the each of the CUF is individually compressed in the CSB if data contained in each of the CUF is individually determined to be a predetermined value.

An embodiment wherein the CMV includes one data bit for a fixed bit field width of each of the CUF, the one data bit for a fixed bit field width of each of the CUF each indicating whether data compression is individually enabled for each of the CUF.

An embodiment wherein the CMV includes one data bit for each byte of the CUF, the one data bit for each byte of the CUF each indicating whether data compression is individually enabled for the each byte of the CUF.

An embodiment wherein the CSB includes data fields incorporating lossless data compression (LDC).

One skilled in the art will recognize that other embodiments are possible based on combinations of elements taught within this disclosure.

Generalized Computer Usable Medium

In various alternate embodiments, the present disclosure may be implemented as a computer program product for use with a computerized computing system. Those skilled in the art will readily appreciate that programs defining the functions defined by the present disclosure can be written in any appropriate programming language and delivered to a computer in many forms, including but not limited to: (a) information permanently stored on non-writeable storage media (e.g., read-only memory devices such as ROMs or CD-ROM disks); (b) information alterably stored on writeable storage media (e.g., floppy disks and hard drives); and/or (c) information conveyed to a computer through communication media, such as a local area network, a telephone network, or a public network such as the Internet. When carrying computer readable instructions that implement the present disclosure methods, such computer readable media represent alternate embodiments of the present disclosure.

As generally illustrated herein, embodiments can incorporate a variety of computer readable media that include computer usable medium having computer readable code means embodied therein. One skilled in the art will recognize that the software associated with the various processes described herein can be embodied in a wide variety of computer accessible media from which the software is loaded and activated. The computer usable medium encompasses media that is transitory or non-transitory.

CONCLUSION

A matrix compression/decompression accelerator (MCA) system/method that coordinates lossless data compression (LDC) and lossless data decompression (LDD) transfers between an external data memory (EDM) and a local data memory (LDM) using matrix tiling and/or grouping has been disclosed. The system implements LDC using a 2D-to-1D transformation of 2D uncompressed data blocks (2DU) within LDM to generate 1D uncompressed data blocks (1DU). This transformation is followed by compression of the 1DU to generate a 1D compressed superblock (CSB) in LDM. This LDM CSB may then be written to EDM with a reduced number of EDM bus cycles. The system implements LDD using a decompression of CSB data retrieved from EDM to generate a 1D decompressed data block (1DD) in LDM. A 1D-to-2D transformation is then applied to the LDM 1DD to generate a 2D decompressed data block (2DD) in LDM. This 2DD may then be operated on by a matrix compute engine (MCE) using a variety of function operators. The system may incorporate a compression/decompression direct memory access (DMA) controller (CDC) that transfers data between the EDM and the LDM while automatically performing the compression/decompression functions.

Although certain embodiments of the present disclosure has been illustrated in the accompanying drawings and described in the foregoing Detailed Description, it will be understood that the disclosure is not limited to the embodiments disclosed, but is capable of numerous rearrangements, modifications, and substitutions without departing from the spirit of the disclosure as set forth and defined by the following claims.

We claim:

1. A system comprising:
   a first memory;
   a second memory; and
   a matrix compression accelerator coupled to the first and second memories, wherein the matrix compression accelerator is configured to:
   receive 2D uncompressed data from the first memory, wherein the 2D uncompressed data includes a first set of data blocks;
   transform the 2D uncompressed data to 1D uncompressed data that includes a second set of data blocks that is a subset of the first set of data blocks of the 2D uncompressed data, wherein the second set of data blocks is not contiguous in the 2D uncompressed data and is contiguous in the 1D uncompressed data;
   compressing at least a subset of the 1D uncompressed data to generate a compressed superblock; and
   storing the compressed superblock in the second memory.

2. The system of claim 1, wherein the compressed superblock is stored in the second memory using a dispersed direct memory access data transfer.

3. The system of claim 1, wherein the compressed superblock is stored in the second memory using an integrated direct memory access data transfer.

4. The system of claim 1, wherein the matrix compression accelerator is configured to store a compression mode vector in the second memory, the compression mode vector comprises one data bit for each data block of the second set of data blocks in the 1D uncompressed data that indicates whether the respective data block is compressed in the compressed superblock.

5. The system of claim 1, wherein the matrix compression accelerator is configured to store a compression mode vector in the second memory, the compression mode vector comprises one data bit for each byte of the 1D uncompressed data that indicates whether a respective portion of the compressed superblock is compressed.

6. The system of claim 1, wherein the compressed superblock has a fixed bit width equivalent to an integer multiple of a data bus width of the first memory.

7. The system of claim 1, wherein the first memory has a data bus width of 128 bytes.

8. The system of claim 1, wherein the compressed superblock comprises data fields incorporating lossless data compression.

9. A method comprising:
receiving, from a first memory, a set of 2D uncompressed data that includes a first set of data blocks;
transforming, by a matrix compression accelerator, the 2D uncompressed data to 1D uncompressed data that includes a second set of data blocks that is a subset of the first set of data blocks, wherein the second set of data blocks is not contiguous in the 2D uncompressed data and is contiguous in the 1D uncompressed data;
compressing, by the matrix compression accelerator, a subset of the 1D uncompressed data to produce a compressed superblock comprising compressed data and uncompressed data; and
storing, by the matrix compression accelerator, the compressed superblock in a second memory.

10. The method of claim 9, wherein the compressed superblock is stored in the second memory using a dispersed direct memory access data transfer.

11. The method of claim 9, wherein the compressed superblock is stored in the second memory using an integrated direct memory access data transfer.

12. The method of claim 9, further comprising storing a compression mode vector in the second memory, the compression mode vector comprises one data bit for each data block of the second set of data blocks in the 1D uncompressed data that indicates whether the respective data block is compressed in the compressed superblock.

13. The method of claim 9, further comprising storing a compression mode vector in the second memory, the compression mode vector comprises one data bit for each byte of the 1D uncompressed data that indicates whether a respective portion of the compressed superblock is compressed.

14. The method of claim 9, wherein the compressed superblock has a fixed bit width equivalent to an integer multiple of a data bus width of the first memory.

15. The method of claim 9, wherein the first memory has a data bus width of 128 bytes.

16. The method of claim 9, wherein the compressed superblock comprises data fields incorporating lossless data compression.

* * * * *